United States Patent
Hutchings et al.

(10) Patent No.: US 7,652,498 B2
(45) Date of Patent: Jan. 26, 2010

(54) INTEGRATED CIRCUIT WITH DELAY SELECTING INPUT SELECTION CIRCUITRY

(75) Inventors: Brad Hutchings, Provo, UT (US); Jason Redgrave, Mountain View, CA (US)

(73) Assignee: Tabula, Inc., Santa Clara, CA (US)

( * ) Notice: Subject to any disclaimer, the term of this patent is extended or adjusted under 35 U.S.C. 154(b) by 179 days.

(21) Appl. No.: 11/769,701

(22) Filed: Jun. 27, 2007

(65) Prior Publication Data

US 2009/0002045 A1    Jan. 1, 2009

(51) Int. Cl.
    *H03K 19/173*    (2006.01)
(52) U.S. Cl. .......................................... 326/38; 326/41
(58) Field of Classification Search .............. 326/37–41
    See application file for complete search history.

(56) References Cited

U.S. PATENT DOCUMENTS

| | | | |
|---|---|---|---|
| 5,425,036 A | 6/1995 | Liu et al. | |
| 5,426,378 A | 6/1995 | Ong | |
| 5,452,239 A | 9/1995 | Dai et al. | |
| 5,521,835 A | 5/1996 | Trimberger | |
| 5,578,946 A * | 11/1996 | Carberry et al. | ................ 326/93 |
| 5,600,263 A | 2/1997 | Trimberger et al. | |
| 5,610,829 A | 3/1997 | Trimberger | |
| 5,629,637 A | 5/1997 | Trimberger et al. | |
| 5,640,106 A | 6/1997 | Erickson et al. | |
| 5,640,107 A | 6/1997 | Kruse | |
| 5,646,545 A | 7/1997 | Trimberger et al. | |
| 5,654,650 A | 8/1997 | Gissel | |
| 5,701,441 A | 12/1997 | Trimberger | |
| 5,751,735 A | 5/1998 | Tobin et al. | |
| 5,761,483 A | 6/1998 | Trimberger | |
| 5,796,268 A | 8/1998 | Kaplinsky | |
| 5,811,985 A * | 9/1998 | Trimberger et al. | ........... 326/38 |
| 5,825,662 A | 10/1998 | Trimberger | |

(Continued)

FOREIGN PATENT DOCUMENTS

WO   PCT/US2008/061072    4/2008

(Continued)

OTHER PUBLICATIONS

U.S. Appl. No. 11/769,680, filed Jun. 27, 2007, Hutchings, et al.

(Continued)

*Primary Examiner*—Don P Le
(74) *Attorney, Agent, or Firm*—Adeli & Tollen LLP

(57) ABSTRACT

Some embodiments provide an integrated circuit (IC) with a delay select input selection circuit. The delay select input selection circuit comprises a first input selection circuit, a first storage element, a second storage element, and a first input line branching into multiple input lines. The multiple input lines include at least a second, third, and fourth input line. The second input line is communicably connected to a first input of the first input selection circuit. The third input line enters the first storage element. The fourth input line enters the second storage element. An output from the first storage element is communicably connected to a second input of the first input selection circuit. An output from the second storage element is communicably connected to a third input of the first input selection circuit.

18 Claims, 39 Drawing Sheets

U.S. PATENT DOCUMENTS

| | | | |
|---|---|---|---|
| 5,920,712 | A | 7/1999 | Kuijsten |
| 5,944,813 | A | 8/1999 | Trimberger |
| 6,084,429 | A | 7/2000 | Trimberger |
| 6,182,247 | B1 | 1/2001 | Herrmann et al. |
| 6,204,687 | B1 | 3/2001 | Schultz et al. |
| 6,255,849 | B1 | 7/2001 | Mohan |
| 6,389,558 | B1 | 5/2002 | Herrmann et al. |
| 6,404,224 | B1 | 6/2002 | Azegami et al. |
| 6,430,736 | B1 | 8/2002 | Levi et al. |
| 6,446,249 | B1 | 9/2002 | Wang et al. |
| 6,459,646 | B1 | 10/2002 | Yee et al. |
| 6,460,148 | B2 | 10/2002 | Veenstra et al. |
| 6,480,954 | B2 | 11/2002 | Trimberger et al. |
| 6,601,227 | B1 | 7/2003 | Trimberger |
| 6,614,703 | B2 | 9/2003 | Pitts et al. |
| 6,668,237 | B1 | 12/2003 | Guccione et al. |
| 6,681,353 | B1 | 1/2004 | Barrow |
| 6,704,889 | B2 | 3/2004 | Veenstra et al. |
| 6,725,442 | B1 | 4/2004 | Cote et al. |
| 6,750,675 | B2 | 6/2004 | Venkata et al. |
| 6,802,026 | B1 | 10/2004 | Patterson et al. |
| 6,810,442 | B1 | 10/2004 | Lin et al. |
| 6,810,513 | B1 | 10/2004 | Vest |
| 6,823,224 | B2 | 11/2004 | Wood et al. |
| 6,829,756 | B1 | 12/2004 | Trimberger |
| 6,889,368 | B1 | 5/2005 | Mark et al. |
| 6,894,527 | B1 | 5/2005 | Donlin et al. |
| 6,937,681 | B2 | 8/2005 | Watanabe |
| 6,959,397 | B2 | 10/2005 | Cafaro et al. |
| 6,996,738 | B2 | 2/2006 | Chiang |
| 7,010,667 | B2 | 3/2006 | Vorbach et al. |
| 7,064,577 | B1 | 6/2006 | Lee |
| 7,085,858 | B1 | 8/2006 | Fox et al. |
| 7,088,132 | B1 | 8/2006 | Tang et al. |
| 7,095,247 | B1 | 8/2006 | Tang et al. |
| 7,112,992 | B1 | 9/2006 | Guzman et al. |
| 7,112,993 | B2 | 9/2006 | Speers |
| 7,138,827 | B1 | 11/2006 | Trimberger |
| 7,212,448 | B1 | 5/2007 | Trimberger |
| 7,218,137 | B2 | 5/2007 | Vadi et al. |
| 7,219,265 | B2 | 5/2007 | Yee |
| 7,231,339 | B1 | 6/2007 | Nemecek et al. |
| 7,233,169 | B1 | 6/2007 | Vadi |
| 7,298,169 | B2 * | 11/2007 | Hutchings et al. ............ 326/38 |
| 7,375,550 | B1 | 5/2008 | Redgrave et al. |
| 7,443,196 | B2 | 10/2008 | Redgrave et al. |
| 7,467,335 | B2 | 12/2008 | Otto |
| 7,492,186 | B2 | 2/2009 | Hutchings et al. |
| 7,501,855 | B2 | 3/2009 | Hutchings et al. |
| 7,512,850 | B2 | 3/2009 | Redgrave et al. |
| 7,548,085 | B2 | 6/2009 | Hutchings et al. |
| 7,548,090 | B2 | 6/2009 | Redgrave et al. |
| 7,550,991 | B2 | 6/2009 | Redgrave et al. |
| 7,579,867 | B2 | 8/2009 | Hutchings et al. |
| 2001/0033188 | A1 | 10/2001 | Aung et al. |
| 2002/0010853 | A1 | 1/2002 | Trimberger et al. |
| 2002/0089349 | A1 | 7/2002 | Barbier et al. |
| 2003/0100133 | A1 | 5/2003 | Eidson et al. |
| 2005/0046458 | A1 * | 3/2005 | Schroeder et al. ........... 327/276 |
| 2006/0176075 | A1 | 8/2006 | Or-Bach |
| 2006/0251416 | A1 | 11/2006 | Letner et al. |
| 2007/0006053 | A1 | 1/2007 | Otto et al. |
| 2007/0007999 | A1 | 1/2007 | Graham et al. |
| 2007/0143577 | A1 | 6/2007 | Smith |
| 2008/0191733 | A1 | 8/2008 | Redgrave et al. |
| 2008/0191735 | A1 | 8/2008 | Redgrave et al. |
| 2008/0191736 | A1 | 8/2008 | Redgrave et al. |
| 2008/0222465 | A1 | 9/2008 | Redgrave et al. |
| 2008/0258761 | A1 | 10/2008 | Hutchings et al. |
| 2009/0002016 | A1 | 1/2009 | Hutchings et al. |
| 2009/0002020 | A1 | 1/2009 | Hutchings et al. |
| 2009/0002022 | A1 | 1/2009 | Hutchings |
| 2009/0007027 | A1 | 1/2009 | Hutchings et al. |
| 2009/0079468 | A1 | 3/2009 | Redgrave et al. |

FOREIGN PATENT DOCUMENTS

| | | |
|---|---|---|
| WO | PCT/US2008/061074 | 4/2008 |

OTHER PUBLICATIONS

U.S. Appl. No. 11/769,683, filed Jun. 27, 2007, Hutchings, et al.
U.S. Appl. No. 11/769,686, filed Jun. 27, 2007, Hutchings, et al.
U.S. Appl. No. 11/769,706, filed Jun. 27, 2007, Hutchings, et al.
U.S. Appl. No. 11/769,703, filed Jun. 27, 2007, Hutchings, et al.
U.S. Appl. No. 11/769,702, filed Jun. 27, 2007, Hutchings.
Non-Final Office Action for U.S. Appl. No. 11/769,703, mailing date Apr. 21, 2008, Hutchings, et al.
Altera Corp., "Section V. In-System Design Debugging," *Quartus II Handbook*, May 2007, pp. 1-150.
Amerson, R., et al., "Teramac—Configurable Custom Computing," *Proceedings of the IEEE Symposium on FPGA's for Custom Computing Machines*, Apr. 19-21, 1995, pp. 32-38.
Arnold, J., "The Splash 2 Software Environment," *IDA Supercomputing Research Center*, 1993 Month N/A, pp. 88-93, Bowie, MD, USA.
Arnold, J., et al, "Splash 2," *Supercomputing Research Center*, 1992 Month N/A, pp. 316-322, Bowie, MD, USA.
Butts, M., "Future Directions of Dynamically Reprogrammable Systems," *IEEE 1995 Custom Integrated Circuits Conference*, May 1995, pp. 487-494.
Compton, K., et al., "Reconfigurable Computing: A Survey of Systems and Software," *ACM Computing Surveys*, Jun. 2002, pp. 171-210, vol. 34., No. 2.
Graham, P., "Logical Hardware Debuggers For FPGA-Based Systems," *A Dissertation Submitted to the Faculty of Brigham Young University in Partial Fulfillment of the Requirements for the Degree of Doctor of Philosophy in Brigham Young University*, Dec. 2001, pp. i-246.
Hanono, S., "InnerView Hardware Debugger: A Logic Analysis Tool for the Virtual Wires Emulation System", Submitted to the Department of Electrical Engineering and Computer science in Partial Fulfillment of the Requirements for the Degree of Master of Science at the Massachusetts Institute of Technology, Feb. 1995, pp. 1-59.
Hutchings, B., et al., "A CAD Suite for High-Performance FPGA Design," Proceedings of the Seventh Annual IEEE Symposium on Field-Programmable Custom Computing Machines Defense Advanced Research Projects Agency, 1999 Month N/A, pp. 1-16.
Hutchings, B., et al., "Designing and Debugging Custom Computing Applications," IEEE Design & Test of Computers, Jan. 2000, pp. 20-28.
Hutchings, B., et al., "Unifying Simulation and Execution in a Design Environment for FPGA Systems," IEEE Transactions on Very Large Scale Integration (VLSI) Systems, Feb. 2001, pp. 201-205, vol. 9, No. 1.
Trimberger, S., "Effects of FPGA Architecture on FPGA Routing," 32nd ACM/IEEE Design Automation Conference, Jun. 1995, ACM.
Vuillemin, J., et al., "Programmable Active Memories: Reconfigurable Systems Come of Age," Very Large Scale Integration (VLSI) Systems, IEEE Transactions on vol. 4, Issue 1, Mar. 1996, pp. 56- 69.
Xilinx, Inc., "ChipScope ProSoftware and Cores User Guide," Jan. 10, 2007, pp. 1-206, Xilinx Inc.
Xilinx, Inc., "Virtex-5 FPGA," Configuration User Guide, Feb. 2007, pp. 1-154, Xilinx, Inc.
Hauser, J., et al., "Garp: A MIPS Processor with a Reconfigurable Coprocessor", *FPGAs for Custom Computing Machines, 1997. Proceedings., The 5th Annual IEEE Symposium on FPGA-Based Custom Computing Machines*, Apr. 16-18, 1997, pp. 12-21.
Luk, W., et al., "Compilation Tools for Run-Time Reconfigurable Designs", *FPGAs for Custom Computing Machines, 1997. Proceedings., The 5th Annual IEEE Symposium on FPGA-Based Custom Computing Machines*, Apr. 16-18, 1997, pp. 56-65.
Scalera, S., et al., "The Design and Implementation of a Context Switching FPGA", *FPGAs for Custom Computing Machines, 1998.*

*Proceedings. IEEE Symposium on FPGAs for Custom Computing Machines*, Apr 15-17, 1998, pp. 78-85.

International Search Report and Written Opinion of PCT/US2008/061072, mailing date Sep. 15, 2008, Tabula, Inc.

Notice of Allowance of U.S. Appl. No. 11/375,363, mailing date Jun. 5, 2008, Redgrave, Jason, et al.

Restriction Requirement of U.S. Appl. No. 11/375,363, mailing date Feb. 25, 2008, Redgrave, Jason, et al.

Non-Final Office Action of U.S. Appl. No. 11/375,363, mailing date Jul. 26, 2007, Redgrave, Jason, et al.

U.S. Appl. No. 12/235,581, filed Sep. 22, 2008, Redgrave, Jason, et al.

Non-Final Office Action of U.S. Appl. No. 11/375,369, mailing date Aug. 20, 2009, Redgrave, Jason, et al.

Notice of Allowance of U.S. Appl. No. 11/375,369, mailing date Apr. 9, 2008, Redgrave, Jason, et al.

Non-Final Office Action of U.S. Appl. No. 11/375,369, mailing date Aug. 21, 2007, Redgrave, Jason, et al.

U.S. Appl. No. 11/375,364, filed Mar. 13, 2006, Hutchings, Brad, et al.

Notice of Allowance of U.S. Appl. No. 11/375,364, mailing date Aug. 27, 2008, Hutchings, Brad, et al.

Notice of Allowance of U.S. Appl. No. 11/375,364, mailing date Mar. 12, 2008, Hutchings, Brad, et al.

Non-Final Office Action of U.S. Appl. No. 11/375,364, mailing date Jul. 6, 2007, Hutchings, Brad, et al.

U.S. Appl. No. 12/106,257, filed Apr. 18, 2008, Hutchings, Brad, et al.

U.S. Appl. No. 11/375,561, filed Mar. 13, 2006, Hutchings, Brad, et al.

Graham, P., "Instrumenting Bitstreams for Debugging FPGA Circuits", *Proceedings of the 9th Annual IEEE Symposium on Field-Programmable Custom Computing Machines*, Apr. 29-May 2, 2001, pp. 41-50, Washington, DC.

Restriction Requirement of U.S. Appl. No. 11/769,686, mailing date Sep. 23, 2008, Hutchings, Brad, et al.

Restriction Requirement of U.S. Appl. No. 11/769,706, mailing date Oct. 6, 2008, Hutchings, Brad, et al.

Notice of Allowance of U.S. Appl. No. 11/769,703, mailing date Oct. 24, 2008, Hutchings, Brad, et al.

International Search Report and Written Opinion of PCT/US2008/061074, mailing date Oct. 23, 2008, Tabula, Inc.

Notice of Allowance of U.S. Appl. No. 11/375,369, mailing date Jan. 27, 2009, Redgrave, Jason, et al.

Non-Final Office Action of U.S. Appl. No. 12/106,257, mailing date Apr. 24, 2009, Hutchings, Brad, et al.

Non-Final Office Action of U.S. Appl. No. 11/769,686, mailing date Nov. 28, 2008, Hutchings, Brad, et al.

Notice of Allowance of U.S. Appl. No.11/769,686, mailing date May 15, 2009, Hutchings, Brad, et al.

Non-Final Office Action of U.S. Appl. No. 11/769,706, mailing date Dec. 9, 2008, Hutchings, Brad, et al.

Supplemental Notice of Allowability of U.S. Appl. No. 11/769,706, mailing date May 21, 2009, Hutchings, Brad, et al.

Notice of Allowance of U.S. Appl. No. 11/769,706, mailing date Apr. 10, 2009, Hutchings, Brad, et al.

Restriction Requirement of U.S. Appl. No. 11/769,702, mailing date Apr. 2, 2009, Hutchings, Brad.

Non-Final Office Action of U.S. Appl. No. 11/769,702, mailing date Jul. 16, 2009, Hutchings, Brad.

* cited by examiner

| UC 0 | UC 1 | UC 2 | UC 3 | UC 4 | UC 5 | UC 6 | UC 7 | UC 8 | UC 9 | UC 10 |
|------|------|------|------|------|------|------|------|------|------|-------|
| -    | -    | -    | $A_0$ | $A_1$ | $A_2$ | $A_3$ | $A_4$ | $A_5$ | $A_6$ | $A_7$ |
| -    | -    | -    | $B_0$ | $B_1$ | $B_2$ | $B_3$ | $B_4$ | $B_5$ | $B_6$ | $B_7$ |

1420 Data

| Latency in subcycles | subcycle | Wire 0, bit 0 of variable A | Wire 1, bit 1 of variable A | Wire 2, bit 2 of variable A | Wire 3, bit 3 of variable A | Wire 4, bit 4 of variable A | Wire 5, bit 5 of variable A | Wire 6, bit 0 of variable B | Wire 7, bit 1 of variable B | Wire 8, bit 2 of variable B | Wire 9, bit 3 of variable B | Wire 10, bit 4 of variable B | Wire 11, bit 5 of variable B |
|---|---|---|---|---|---|---|---|---|---|---|---|---|---|
| 0 | 0 | | | | | | | | | | | | |
| | 1 | | | | | | | | | | | | |
| | 2 | | | | | | | | | | | | |
| | 3 | | | | a3-0 | | | | | | | | |
| 1 | 0 | | | | | | | | | | | | |
| | 1 | | | | a3-1 | | a5-0 | b0-0 | b1-0 | | | | |
| | 2 | | | | | | | | | | | | |
| | 3 | | | | | | | | | | | | |
| 2 | 0 | a0-0 | a1-0 | | a3-2 | | a5-1 | b0-1 | b1-1 | | | | |
| | 1 | | | | | | | | | | | | |
| | 2 | | | | | | | | | | | | |
| | 3 | | | | | | | | | | | | |
| 3 | 0 | a0-1 | a1-1 | | a3-3 | | a5-2 | b0-2 | b1-2 | | | b4-0 | |
| | 1 | | | | | | | | | | | | |
| | 2 | | | | | | | | | | | | |
| | 3 | | | | | | | | | | | | |
| 4 | 0 | a0-2 | a1-2 | | a3-4 | | a5-3 | b0-3 | b1-3 | | b3-0 | | |
| | 1 | | | | | | | | | | | | |
| | 2 | | | | | | | | | | | | |
| | 3 | | | | | | | | | | | | |
| 5 | 0 | a0-3 | a1-3 | | a3-5 | | a5-4 | b0-4 | b1-4 | | b3-1 | b4-1 | |
| | 1 | | | | | | | | | | | | |
| | 2 | | | | | | | | | | | | |
| | 3 | | | a2-0 | | a4-0 | | | | | | | |
| 6 | 0 | a0-4 | a1-4 | | a3-6 | | a5-5 | b0-5 | b1-5 | | b3-2 | b4-2 | b5-0 |
| | 1 | | | | | | | | | | | | |
| | 2 | | | a2-1 | | a4-1 | | | | b2-0 | | | |
| | 3 | | | | | | | | | | | | |
| 7 | 0 | a0-5 | a1-5 | | a3-7 | | a5-6 | b0-6 | b1-6 | b2-1 | b3-3 | b4-3 | b5-1 |
| | 1 | | | | | | | | | | | | |
| | 2 | | | | | | | | | | | | b5-2 |
| | 3 | | | | | | | | | | b3-4 | | |

2410 DATA AS IT REACHES DESKEW NETWORK

| | Originally at tiles | | | | | | | | | | | |
|---|---|---|---|---|---|---|---|---|---|---|---|---|
| UC0 | a0-0 | a1-0 | a2-0 | a3-0 | a4-0 | a5-0 | b0-0 | b1-0 | b2-0 | b3-0 | b4-0 | b5-0 |
| UC1 | a0-1 | a1-1 | a2-1 | a3-1 | a4-1 | a5-1 | b0-1 | b1-1 | b2-1 | b3-1 | b4-1 | b5-1 |
| UC2 | a0-2 | a1-2 | a2-2 | a3-2 | a4-2 | a5-2 | b0-2 | b1-2 | b2-2 | b3-2 | b4-2 | b5-2 |
| UC3 | a0-3 | a1-3 | a2-3 | a3-3 | a4-3 | a5-3 | b0-3 | b1-3 | b2-3 | b3-3 | b4-3 | b5-3 |
| UC4 | a0-4 | a1-4 | a2-4 | a3-4 | a4-4 | a5-4 | b0-4 | b1-4 | b2-4 | b3-4 | b4-4 | b5-4 |
| UC5 | a0-5 | a1-5 | a2-5 | a3-5 | a4-5 | a5-5 | b0-5 | b1-5 | b2-5 | b3-5 | b4-5 | b5-5 |
| UC6 | a0-6 | a1-6 | a2-6 | a3-6 | a4-6 | a5-6 | b0-6 | b1-6 | b2-6 | b3-6 | b4-6 | b5-6 |
| UC7 | a0-7 | a1-7 | a2-7 | a3-7 | a4-7 | a5-7 | b0-7 | b1-7 | b2-7 | b3-7 | b4-7 | b5-7 |

INTEGRATED CIRCUIT WITH DELAY SELECTING INPUT SELECTION CIRCUITRY

CROSS REFERENCE TO RELATED APPLICATIONS

This Application is related to the following applications with the same filing date: U.S. patent application Ser. No. 11/769,680, filed Jun. 27, 2007; U.S. patent application Ser. No. 11/769,683, filed Jun. 27, 2007; U.S. patent application Ser. No. 11/769,686, filed Jun. 27, 2007; U.S. patent application Ser. No. 11/769,706, filed Jun. 27, 2007; U.S. patent application Ser. No. 11/769,703, filed Jun. 27, 2007; and U.S. patent application Ser. No. 11/769,702, filed Jun. 27, 2007.

FIELD OF THE INVENTION

The present invention is directed towards accessing multiple user states concurrently in a configurable IC.

BACKGROUND OF THE INVENTION

The use of configurable integrated circuits ("ICs") has dramatically increased in recent years. Configurable ICs can be used to implement circuits designed by a user ("user design") on an IC without having to fabricate a new IC for each design. One example of a configurable IC is a field programmable gate array ("FPGA"). An FPGA is a field programmable IC that usually has configurable logic and interconnect circuits that are surrounded by input/output ("I/O") circuits.

The configurable logic circuits (also called logic blocks) are typically arranged as an internal array of circuits. A configurable logic circuit can be configured to perform a number of different functions. A configurable logic circuit typically receives a set of input data and a set of configuration data that is often stored close to the logic circuit. From the set of functions that the logic circuit can perform, the configuration data set specifies a particular function that this circuit is to perform on the input data set. Such a logic circuit is said to be configurable, as the configuration data set "configures" the logic circuit to perform a particular function.

These logic circuits are connected together through numerous configurable interconnect circuits (also called interconnects). A configurable interconnect circuit connects one or more of a set of circuit elements to another set of circuit elements based on a set of configuration data that it receives. The configuration bits specify how the interconnect circuit should connect the input data set to the output data set. The interconnect circuit is said to be configurable, as the configuration data set "configures" the interconnect circuit to use a particular connection scheme that connects the input data set to the output data set in a desired manner. In some FPGAs, the configuration data set of a configurable logic or interconnect set can be modified by writing new data in SRAM cells that store the configuration data set.

Designing a configuration for a configurable IC requires debugging tools to help track errors in the design. Such debugging tools generally have software components and circuitry components. In some earlier configurable ICs, the debugging circuitry was integrated into the main body of the integrated circuit. In some cases, the debugging circuitry was implemented using the basic configurable circuits. In other cases, the debugging circuitry was fixed function circuitry that was to be used for debugging purposes only, but which was physically located among the configurable circuits. However, those implementations both had drawbacks. Implementing the debugging circuitry using the basic configurable circuits meant that the debugging circuitry occupied configurable circuits that could otherwise be used for implementing the user design on the IC. Implementing the debugging circuitry primarily as fixed function circuitry located among the configurable circuits meant that the debugging circuitry could not be readily redesigned. For instance, making the debugging circuitry larger would require redesigning the main configurable IC to move the configurable circuits out of the way of the larger debugging circuitry.

Therefore, there is a need in the art for debugging circuits positioned outside of the ordinary configurable circuits of configurable ICs. Ideally, the mechanism for loading configuration data could also be used to carry data to circuits used to monitor and debug the configurable IC, with some support within individual logic blocks for routing signals onto and off of the configuration/debug network.

SUMMARY OF THE INVENTION

Some embodiments provide an integrated circuit (IC) with a delay select input selection circuit. The delay select input selection circuit comprises a first input selection circuit, a first storage element, a second storage element, and a first input line branching into multiple input lines. The multiple input lines include at least a second, third, and fourth input line. The second input line is communicably connected to a first input of the first input selection circuit. The third input line enters the first storage element. The fourth input line enters the second storage element. An output from the first storage element is communicably connected to a second input of the first input selection circuit. An output from the second storage element is communicably connected to a third input of the first input selection circuit.

In some embodiments the first input selection circuit further comprises a third input communicably connected to a second input selection circuit of a second delay select input selection circuit. In some such embodiments an output of the first input selection circuit is communicably connected to an input of a third input selection circuit of a third delay select input selection circuit. In some embodiments the IC is a configurable IC. In some embodiments the IC is a reconfigurable IC. In some embodiments the IC is a subcycle reconfigurable IC. In some embodiments the first storage element comprises a latch.

Some embodiments provide an IC comprising a chain of delay select input selection circuits. Each delay select input selection circuit comprises a first input selection circuit, a first storage element, and a first input line. The first input line branches into multiple input lines comprising at least a second input line and a third input line. The second input line is communicably connected to a first input selection circuit input of the first input selection circuit. The third input line enters the first storage element. An output from the first storage element is communicably connected to a second input selection circuit input of the first input selection circuit.

In some embodiments an output from each of a plurality of first input selection circuits of multiple delay select input selection circuits communicably connects to a third input line of a next input selection circuit in a next delay select input selection circuit in the chain of delay select input selection circuits. In some such embodiments each of a plurality of the delay select input selection circuits comprises a second storage element. A fifth input line enters the second storage element and an output from the second storage element is communicably connected to a fourth input of the input selection circuit. In some embodiments the IC further comprises multiple chains of delay select input selection circuits. In some embodiments the IC further comprises multiple additional data lines branching from the outputs. In some such embodiments, subsets of the multiple additional data lines connect to input selection circuits.

Some embodiments provide an IC with a transport network comprising multiple delay select input selection circuits. Some embodiments provide a delay select input selection circuit comprising an input selection circuit and a first input line wherein the first input line branches into multiple input lines comprising at least a second input line and a third input line. The second input line is communicably connected to a first input of the input selection circuit. The third input line enters a delaying circuit. An output from the delaying circuit is communicably connected to a second input of the input selection circuit wherein the input selection circuit comprises at least one input not communicatively connected to a branch of the first input line. In some embodiments the delaying circuit is a latch.

Some embodiments provide a configurable IC with a debug network. The debug network includes an output network with a fixed capacity and a storage element for storing at least one of a first bit and a second bit. The first and second bits are read concurrently, but cannot be outputted concurrently along the output network.

In some embodiments the first and second bits cannot be outputted concurrently along the output network because of output congestion at certain locations of the output network. In some such embodiments the congestion is because at least one of the certain locations is in the output path of at least one of the first bit and the second bit. In some embodiments the congestion is because at least one of the certain locations is in the output path of bits other than the first bit and the second bit. In some embodiments the first bit is outputted later than the second bit.

Some embodiments provide a configurable IC comprising a debug network with a fixed output capacity and a storage element for storing one of a first bit and a second bit. The first and second bits are received concurrently by the debug network but cannot be output concurrently because of the fixed output capacity. In some embodiments the second bit is outputted by the debug network after the first bit. In some such embodiments the debug network comprises a transport network and the storage element is part of the transport network.

BRIEF DESCRIPTION OF THE DRAWINGS

The novel features of the invention are set forth in the appended claims. However, for purpose of explanation, several embodiments of the invention are set forth in the following figures.

FIG. 20 illustrates deskewed data.

FIG. 23 illustrates two multi-bit variables to be deskewed.

FIG. 24 illustrates multiple instances of two multi-bit variables to be deskewed.

DETAILED DESCRIPTION

Figure 1:
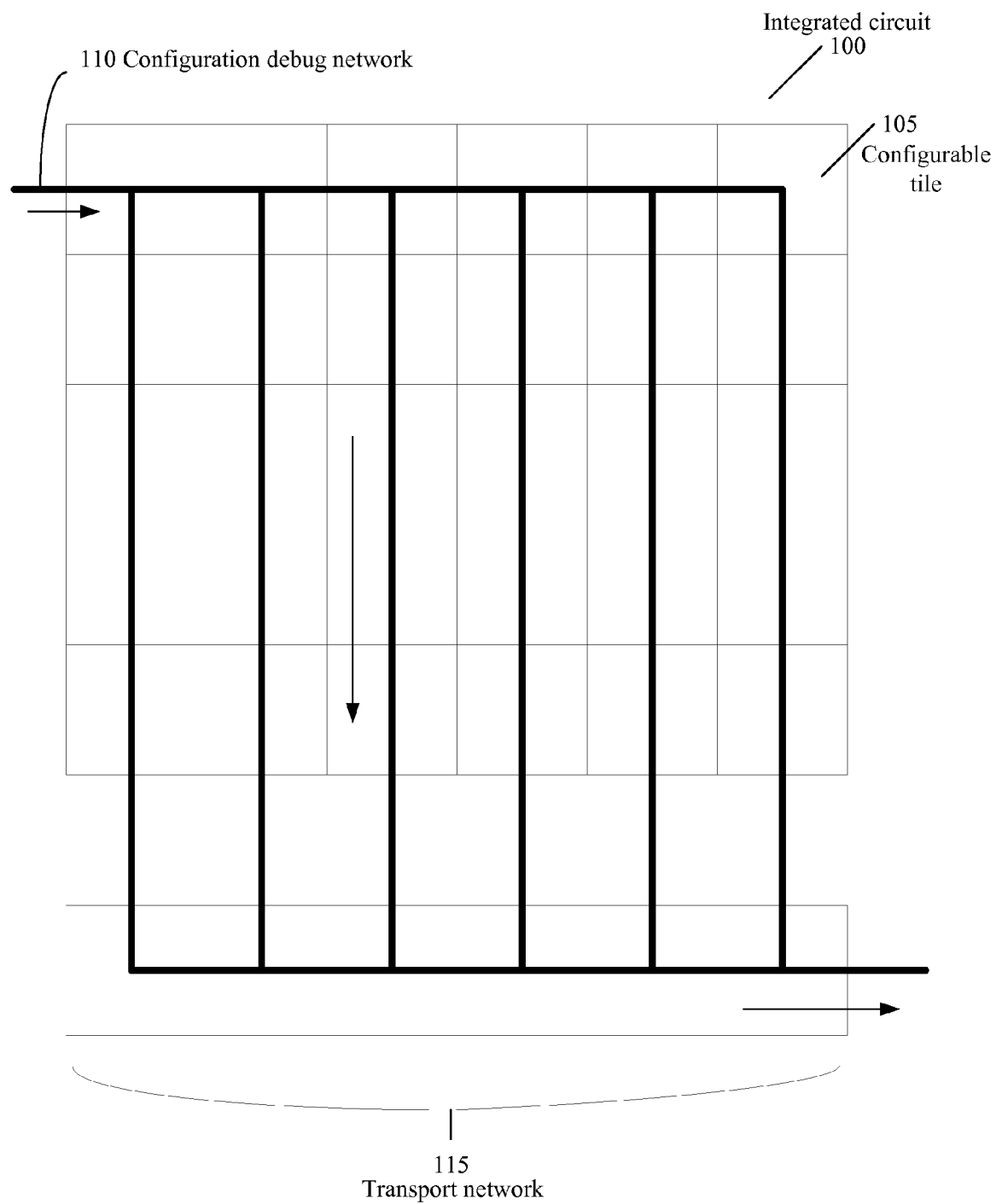
FIG. 1 illustrates an example of a configurable IC that includes numerous configurable tiles and a transport network.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Overview

A. Brief Overview

The following is a very brief description of some embodiments of the present inventions. The description is intended as a framework for understanding the more detailed descriptions below. The more detailed descriptions below may describe embodiments different from those indicated by the very brief description.

Some embodiments include configurable ICs with an array of conceptual tiles; other embodiments have configurable circuits arranged in other manners or arrangements. The configurable ICs also include a network of connections used to send configuration information to tiles and receive debug data from tiles. Some embodiments have debug networks that are part of the configuration networks; other embodiments have separate debug networks.

The configuration/debug network takes debug data from the array, and sends it out of the array to a transport network (sometimes called an "output network"). The transport networks of some embodiments have configurable circuits that determine which debug data coming from the array will be passed on to other parts of the debug system. In some embodiments, the transport network can be considered part of the debug network.

The transport network sends data to a trace buffer that stores the data, and to a trigger block that tells the trace buffer when to stop accepting incoming data and start sending the stored data off the IC to be analyzed. The data from the user circuit on the configurable IC activates the trigger.

Data bits generated at the same time do not generally arrive at the transport network at the same time. Data bits from different circuit elements of the configurable tiles may arrive at the transport network out of order (skewed) because the time for a data bit to reach the transport network depends on various factors that are not the same for every element.

The trigger needs this data to be in order (i.e. the simultaneously generated bits need to reach the trigger at the same time). To put the data in order (deskew the data), the data is passed through configurable deskew circuits that are configured to delay each bit just the right amount so that those user signals generated simultaneously reach the trigger block simultaneously.

Various methods are used to control and configure the configurable IC. The method of some embodiments takes a design of a circuit provided by a user and translates the design into a configuration usable by the configurable IC. While translating, the method prepares an "equivalence map" that will make it easier to translate raw debug data into more usable forms. In some embodiments, the translation of the design changes the circuit in a way that eliminates some outputs of the original design. In some of such embodiments, the equivalence maps can be used for (among other things) regenerating those outputs from data values that are readable in the configuration used by the configurable IC.

In some embodiments, the methods use the maps to determine which elements of the configurable IC should be observed in order to regenerate the values of the outputs of the user circuit. The configurable circuits, transport network, deskew circuits, and trigger are configured, to implement the user's design, collect raw debug data, and determine the circumstances under which the trigger should fire. When the trigger fires, the method receives the raw data and uses the "maps" to translate the raw debug data into data of interest to the user. In some embodiments, the method can update maps during run time to keep track of different elements of the user's design.

B. Exemplary Architecture of Some Embodiments

Some embodiments of the invention provide a configuration/debug network for configuring and debugging a configurable integrated circuit ("IC"). An integrated circuit ("IC") is a device that includes numerous electronic components (e.g., transistors, resistors, diodes, etc.) that are embedded typically on the same substrate, such as a single piece of semiconductor wafer (e.g., a single chip). These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

The configurable IC in some embodiments includes configurable resources (e.g., configurable logic resources, routing resources, memory resources, etc.) that can be grouped in conceptual configurable tiles that are arranged in several rows and columns. FIG. 1 illustrates an example of a configurable IC 100 that includes numerous configurable tiles 105. As shown in this figure, each configurable tile 105 receives a set of lines 110 that are part of a configuration/debug network. The lines 110 pass debug data on to transport network 115, which in turn passes the debug data on to other components (not shown). In some embodiments, as shown in this figure, the transport network is separated by some distance from the configurable tiles 105, outside the tile array, but still on the same IC. In some embodiments, there is an unused area of the IC between the configurable tiles 105 and the transport network 115. Having such a separation solves some of the problems described in the Background section. For example, having the transport network be separate from the main set of configurable circuits allows multiple generations of the configurable IC to use different designs for the transport network without disrupting the design of the fabric of the main configurable circuits. Some embodiments use a packet switching technology to route data to and from the resources in the configurable tiles. Hence, over the lines 110, these embodiments can route variable length data packets to each configurable tile in a sequential or random access manner.

Figure 2:
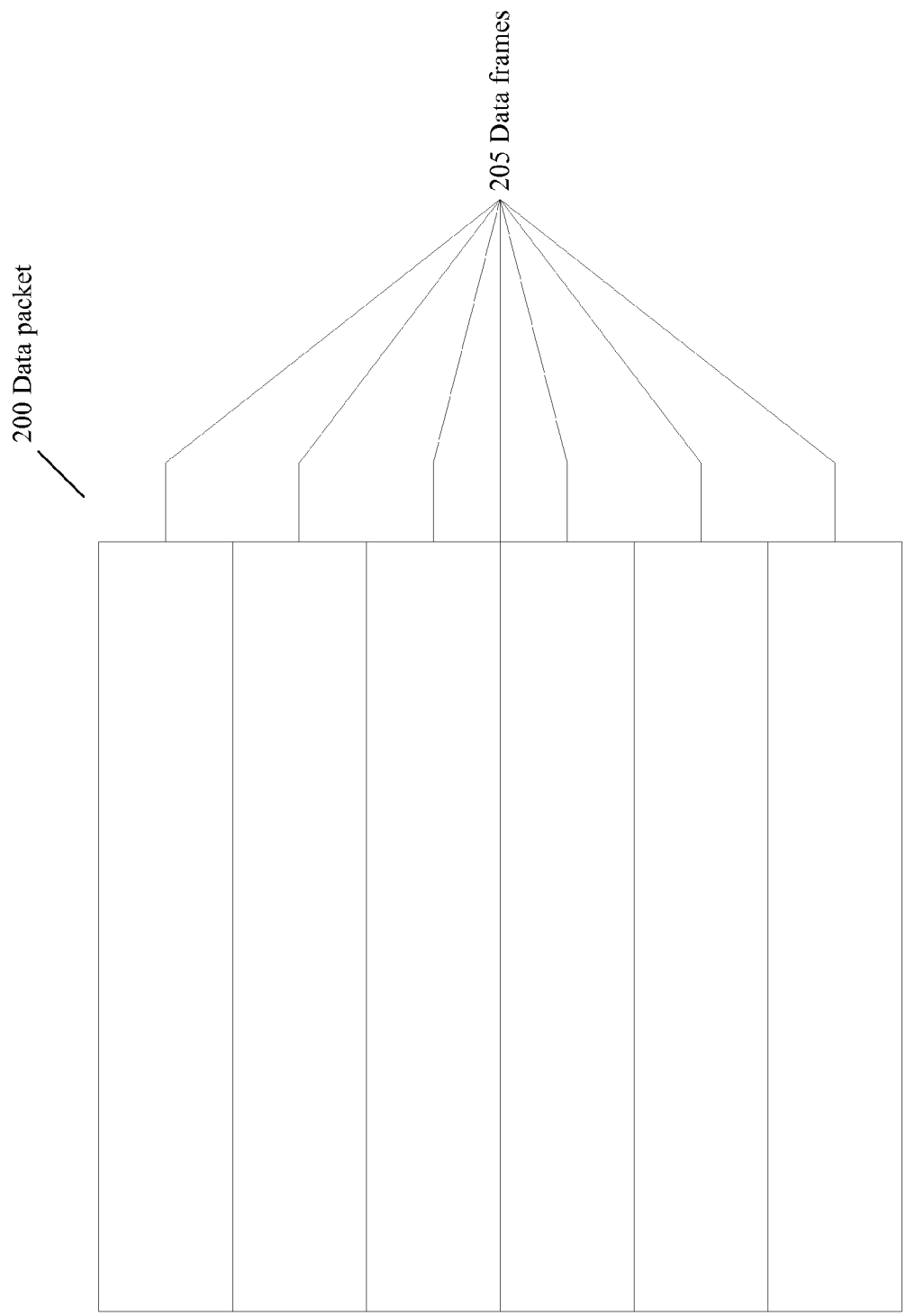
FIG. 2 illustrates an example of a data packet.

FIG. 2 illustrates an example of a data packet 200. As shown in this figure, the data packet 200 includes several data frames 205. In some embodiments, an initial set of frames (e.g., first one or two frames) of the packet identifies configurable tiles for routing the remaining frames of the data packet. These remaining frames can then contain configuration and/or debug data for configuring the tile or performing debug operations on the tile.

Figure 3:
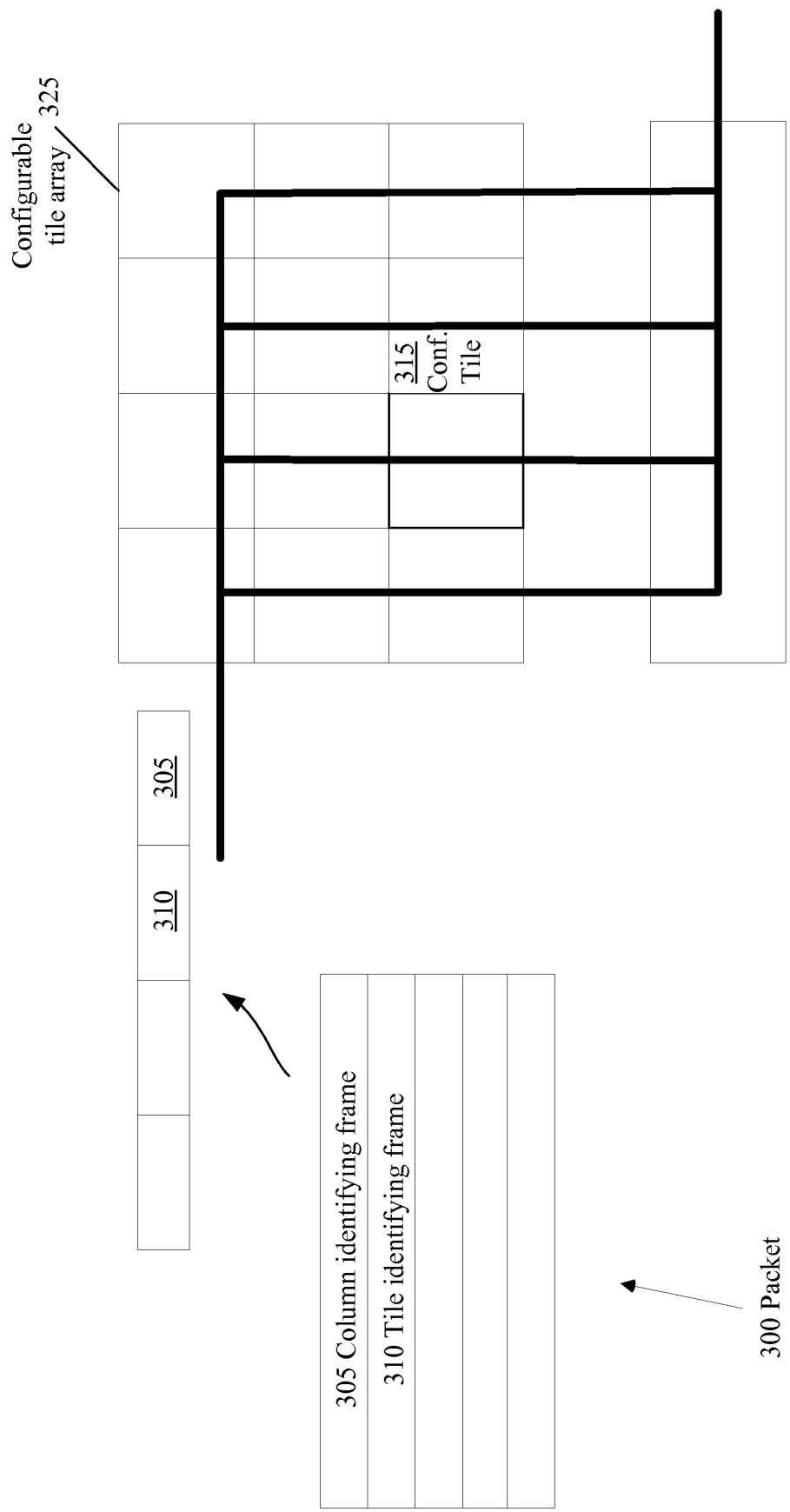
FIGS. 3, 4, and 5 illustrate an example of how an initial set of frames in a packet might specify the routing of a packet to a configurable tile.
Figure 4:
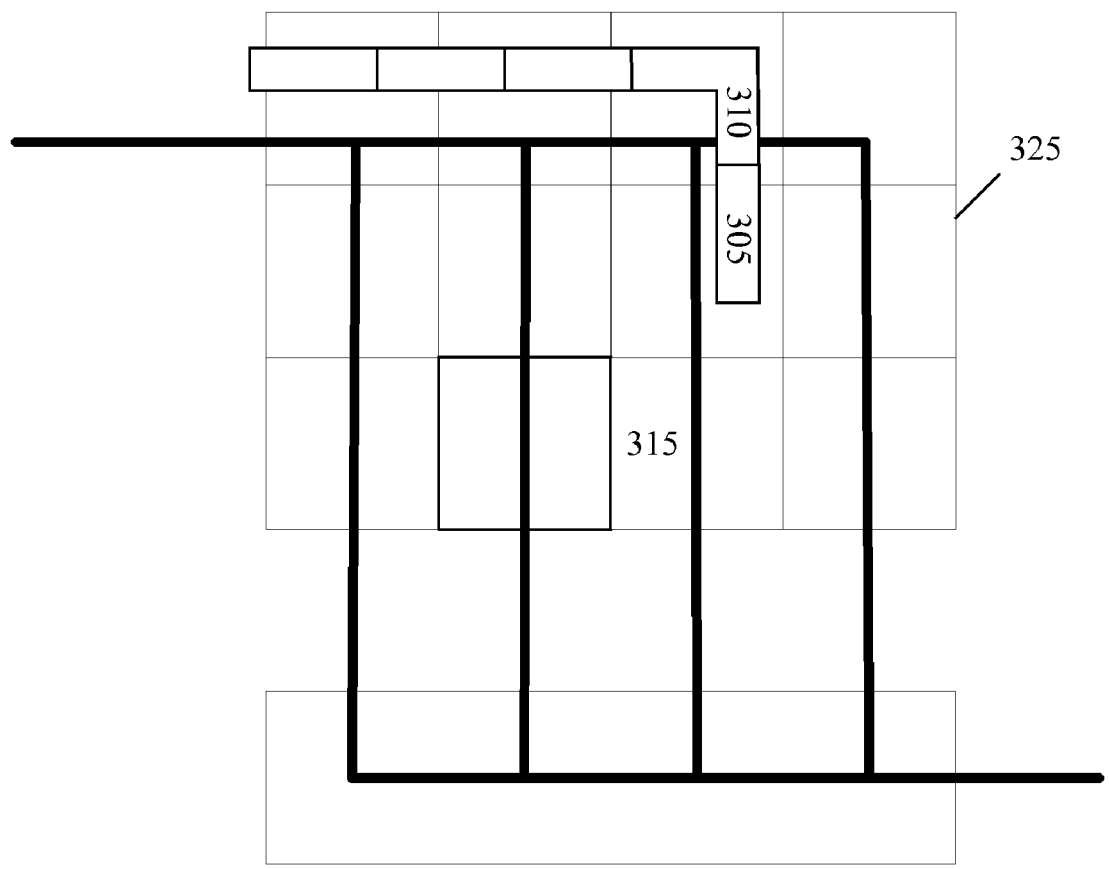
Figure 5:
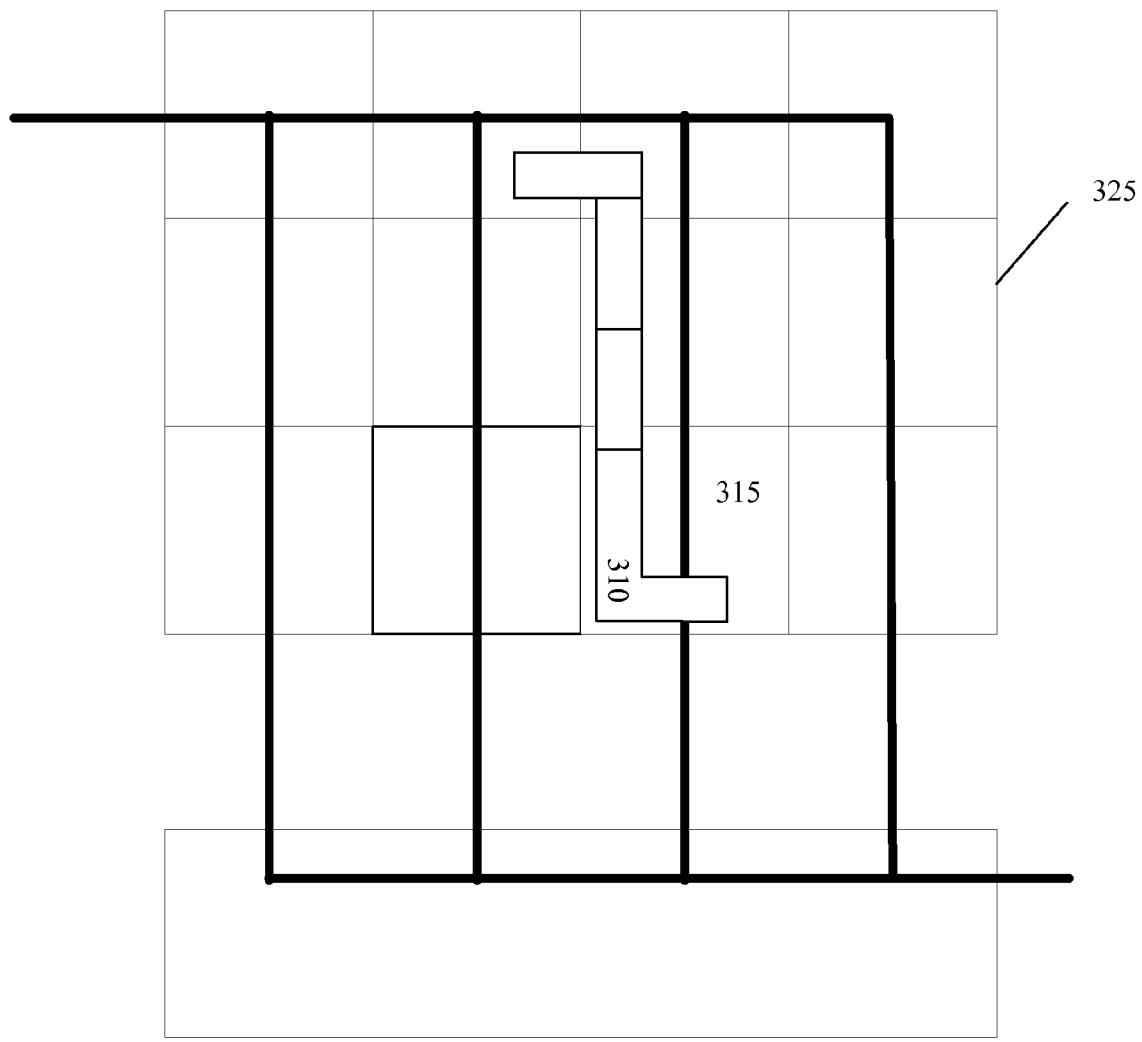

FIGS. 3, 4, and 5 illustrate an example of how an initial set of frames in a packet might specify the routing of a packet to a configurable tile 315. In this example, the first two frames 305 and 310 of the packet 300 respectively identify the column and then the row of the configurable tile 315 to be configured. As shown in FIG. 4, the column-identifying frame 305 is used by a column selector at the top of the configurable tile array 325 to route a packet down the column of the addressed configurable tile 315. The tile-identifying frame 310 then allows a tile selector in the configurable tile 315 to realize that the packet of data being routed down its column is addressed to its tile 315, as shown in FIG. 5. Hence, as shown in this figure, the tile selector of tile 315 extracts the remaining data frames in the packet 300.

The configurable IC includes numerous user-design state elements ("UDS elements") in some embodiments. UDS elements are elements that store values that at any particular time define the overall user-design state of the configurable IC at that particular time. Examples of such elements include storage elements (e.g., latches, registers, memories, etc). The configurable IC of some embodiments might not include all such forms of UDS elements, or might include other types of UDS elements.

In addition to traditional latches, registers, and memory structures, some embodiments use novel UDS storage elements that are described in U.S. Pat. No. 7,224,181 and U.S. patent application Ser. No. 11/754,300. Examples of such UDS storage elements include RMUXs that can serve as storage elements, RMUXs that have storage elements in feedback paths between their outputs and inputs, and storage elements at other locations in the routing fabric (e.g., between RMUXs).

More specifically, some embodiments have routing multiplexers ("RMUXs") where at least some of the RMUXs have state elements integrated at the output stage of the RMUX itself. As further described below in Section II, such RMUXs are referred to as routing circuit latches or RCLs. In conjunction or instead of such RCLs, other embodiments utilize other storage elements for storing UDS data at other locations in the configurable routing fabric of a configurable IC. For instance, in addition to having a storage element in the output stage of an RMUX, some embodiments place a storage element (e.g., latch or register) in a feedback path between the output and input of the RMUX.

In some embodiments, some or all of the latches or registers are separate from the RMUXs of the routing fabric and are instead at other locations in the routing fabric (e.g., between the wire segments connecting to the outputs and/or inputs of the RMUXs). For instance, in some embodiments, the routing fabric includes a parallel distributed path for an output of a source routing circuit to a destination circuit. A first path of the parallel distributed path, directly routes the output of the source routing circuit to a first input of the destination circuit. A second path running in parallel with the first path passes the output of the source routing circuit through a storage element before reaching a second input of the destination circuit. The storage element stores the output value of the routing circuit when enabled. In some embodiments, the second path connects to a different destination component than the first path. When the routing fabric includes buffers, some of these embodiments utilize these buffers as well to build such latches and registers. Several more detailed examples of RCLs and other types of storage elements are described in U.S. patent application Ser. No. 11/754,300, filed May 27, 2007.

In some embodiments, the configuration/debug network connects to some or all of the UDS elements (e.g., latches, registers, memories, etc.) of the configurable IC. In some embodiments, the configuration/debug network has a streaming mode that can direct various circuits in one or more configurable tiles to stream out their data during the operation of the configurable IC. Accordingly, in some embodiments where the configuration/debug network connects to some or all of the UDS elements, the configurable/debug network can be used in a streaming mode to stream out data from the UDS elements of the tiles, in order to identify any errors in the operation of the IC. In other words, the streaming of the data from the UDS elements can be used to debug the operation of the configurable IC.

In various places in this specification, signals or data are described as going to the debug network from logic circuits, RMUXs, and/or IMUXs. In some embodiments, such data goes directly from the indicated circuits to the debug network without any further intervening circuits. In other embodiments, data can be sent from logic circuits, RMUXs or IMUXs through some type of intervening circuit (e.g., a state element). It will be clear to one of ordinary skill in the art that references to data going to the debug network from a circuit encompass both data going directly to a debug network, and data going to a debug network through intervening circuits. For example, where the specification describes data as going from a logic element to the debug network, in some embodiments data could go from a logic circuit to a state element on the IC, and then from the state element to the debug network.

In other embodiments, the data may go directly from the logic circuit to the debug network without passing through a state element.

The streaming mode is used in some embodiments to form a logic analyzer, which may be on or off the same IC die that includes the configurable tiles. For instance, some embodiments include a trace buffer on the same IC die as the configurable tiles. This trace buffer can then be used to record the data that is output from one or more tiles during the streaming mode operation of the configurable IC. In other words, the trace buffer can be used to implement an "on-chip" logic analyzer in conjunction with the streaming mode operation of the IC. An "off-chip" logic analyzer can also be formed by using an off-chip trace buffer (i.e., a buffer that is not on the same die as the configurable IC) while using the streaming mode operation of the IC's configuration/debug network.

Section II provides an overview of the configurable tiles of some embodiments of the invention. Section III provides an overview of user-cycles and subcycles. Section IV describes packet data structure. Section V describes IC network structure. Section VI describes some embodiments of a transport network. Section VII describes data streaming. Section VIII describes debug circuitry. Section IX describes software reconstruction of signals in a trace buffer. Section X describes software generation of physical IC configuration. Section XI describes tracking data dynamically.

In the discussion above and below, many of the features of some embodiments are described by reference to a network that is used for both configuration operations and debug operations. One of ordinary skill in the art will realize that some embodiments might use this network only for debug operations or only for configuration operations.

II. Overview of Configurable Tiles

Figure 6:
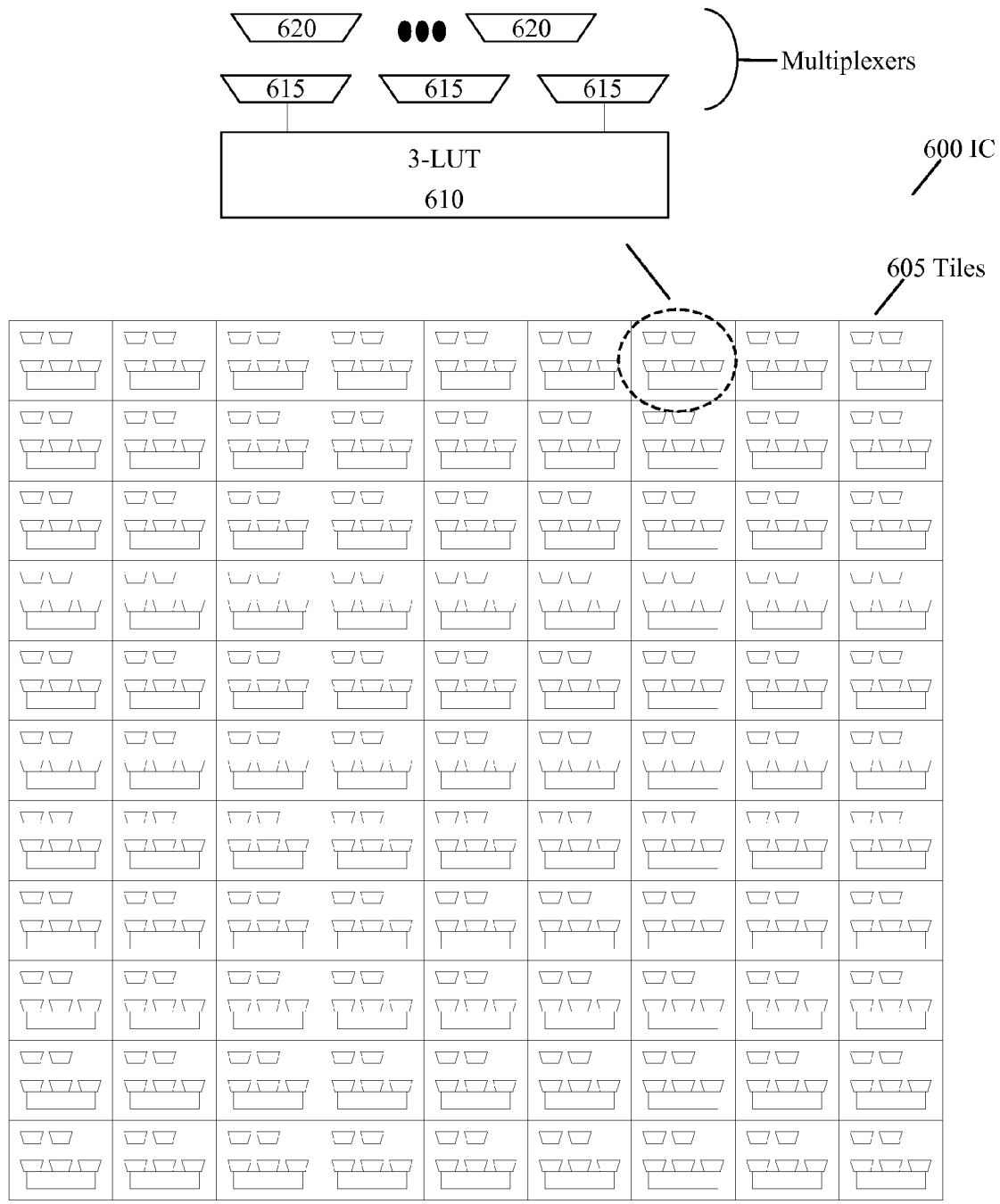
FIG. 6 illustrates the configurable circuit architecture of some embodiments of the invention.

FIG. 6 illustrates the configurable circuit architecture of some embodiments of the invention. As shown in FIG. 6, this architecture is formed by numerous configurable conceptual tiles 605 that are arranged in an array with multiple rows and columns. It should be noted that in some embodiments a "conceptual tile" (or "tile" for short) does not denote any physically distinct object, but is rather a way of referring to groups of circuitry in a repeated or nearly repeated pattern. In such embodiments, the lines around individual tiles represent conceptual boundaries, not physical ones.

In FIG. 6, each configurable tile is a configurable logic tile, which, in this example, includes one configurable three-input logic circuit 610, three configurable input-select interconnect circuits 615, and eight configurable routing interconnect circuits 620. For each configurable circuit, the configurable IC 600 includes a set of storage elements for storing a set of configuration data. In some embodiments, the logic circuits are look-up tables (LUTs) while the interconnect circuits are multiplexers. In this specification, many embodiments are described as using multiplexers. It will be clear to one of ordinary skill in the art that other embodiments can be implemented with input selection circuits other than multiplexers. Therefore, any use of "multiplexer" in this specification should be taken to also disclose the use of any other type of input selection circuits.

In FIG. 6, an input-select multiplexer ("IMUX") is an interconnect circuit associated with the LUT 610 that is in the same tile as the input select multiplexer. One such input select multiplexer (1) receives several input signals for its associated LUT, and (2) based on its configuration, passes one of these input signals to its associated LUT.

In FIG. 6, a routing multiplexer ("RMUX") is an interconnect circuit that connects other logic and/or interconnect circuits. The interconnect circuits of some embodiments route signals between logic circuits, to and from I/O circuits, and between other interconnect circuits. Unlike an input select multiplexer of some embodiments (which provides its output to only a single logic circuit, i.e., which has a fan-out of only 1), a routing multiplexer of some embodiments is a multiplexer that (1) can provide its output to several logic and/or interconnect circuits (i.e., has a fan-out greater than 1), or (2) can provide its output to other interconnect circuits.

In some embodiments, some or all routing multiplexers can also serve as latches. For instance, some embodiments use complementary passgate logic ("CPL") to implement a routing multiplexer. Some of these embodiments then implement a routing multiplexer that can act as a latch by placing cross-coupled transistors at the output stage of the routing multiplexer. Such an approach is further described in U.S. patent application Ser. No. 11/081,859, filed Mar. 15, 2005. In the discussion below, routing multiplexers that can serve as latches are referred to as routing-circuit latches ("RCLs").

In the architecture illustrated in FIG. 6, each configurable logic tile includes one three-input LUT, three input-select multiplexers, and eight routing multiplexers. Other embodiments, however, might have a different number of LUTs in each tile, different number of inputs for each LUT, different number of input-select multiplexers, and/or different number of routing multiplexers. Other embodiments might also use different types of logic circuits and/or interconnect circuits. Several such architectures are further described in the U.S. application Ser. No. 11/082,193, filed on Mar. 15, 2005.

Figure 7A:
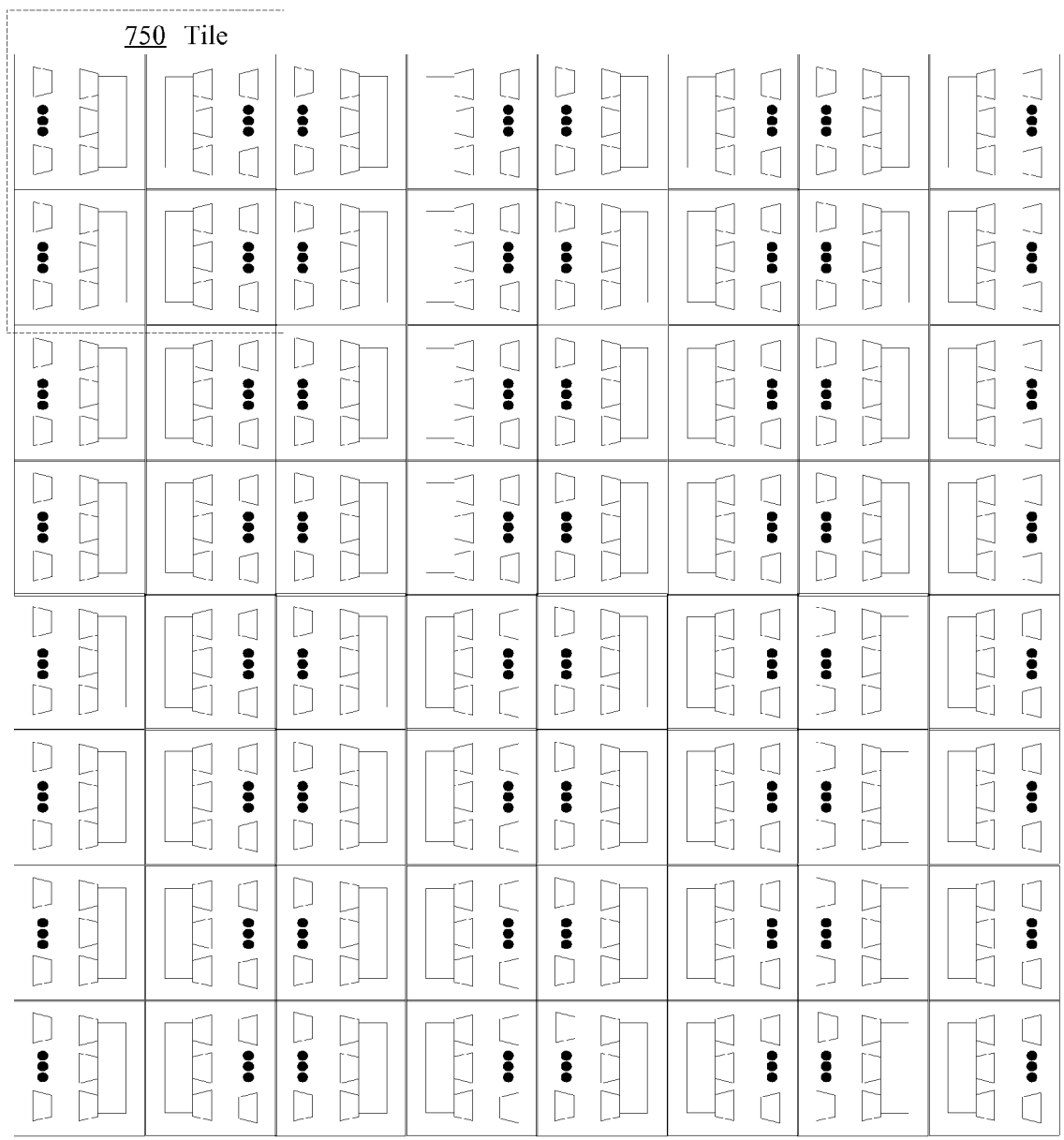
FIGS. 7a-7b provide two possible physical architectures of the configurable IC illustrated in FIG. 6.

In some embodiments, the examples illustrated in FIG. 6 represent the actual physical architecture of a configurable IC. However, in other embodiments, the examples presented in FIG. 6 topologically illustrate the architecture of a configurable IC (i.e., they show arrangement of tiles, without specifying a particular position of the circuits). In some embodiments, the position and orientation of the circuits in the actual physical architecture of a configurable IC is different from the position and orientation of the circuits in the topological architecture of the configurable IC. Accordingly, in these embodiments, the IC's physical architecture appears quite different from its topological architecture. For example, FIG. 7a provides one possible physical architecture of the configurable IC 600 illustrated in FIG. 6. In FIG. 7a, sets of four tiles are aligned so that their LUTs are placed closer to each other. The aligned set of four tiles can be conceptually viewed as simply another, though larger, tile 750 itself. In other embodiments, larger numbers of aligned tiles may be conceptually viewed as another, larger tile (e.g., eight aligned tile).

Figure 7B:
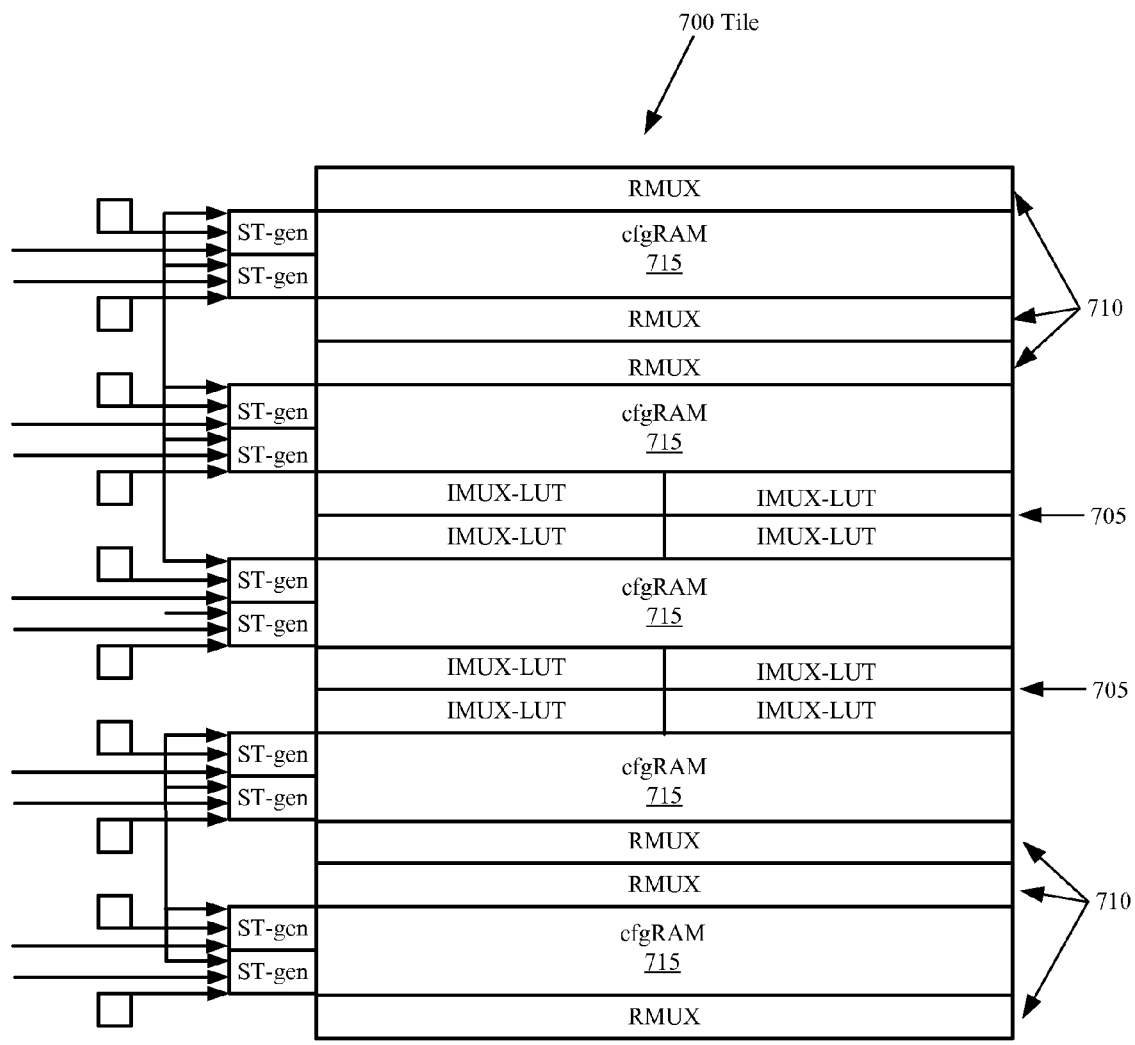

In some embodiments, the tiles may contain multiple aligned logic circuits per tile, such as two sets of four-aligned LUTs. FIG. 7b illustrates one such alternative tile structure that is used in some embodiments. This tile 700 has two sets 705 of 4-aligned LUTs along with their associated IMUXs. It also includes six sets 710 of RMUXs and five banks 715 of configuration RAM storage. Each 4-aligned LUT tile shares one carry chain, one example of which is described in U.S. application Ser. No. 11/082,193 entitled "Configurable IC with Routing Circuits with Offset Connections", filed on Mar. 15, 2005. The tile structure of the tile 700 of FIG. 7b for some embodiments is further described in U.S. application Ser. No. 11/754,263, filed May 25, 2007. One of ordinary skill in the art would appreciate that other organizations for tiles may also be used in conjunction with the invention and that these organizations might have fewer or additional logic circuits.

FIGS. 6, 7a and 7b illustrate only configurable non-edge logic tiles. The configurable IC of some embodiments includes other types of configurable tiles, such as configurable edge logic tiles ("edge tiles") and configurable memory tiles. In some of these embodiments, configurable edge tiles are similar to the configurable non-edge logic tiles of FIG. 6, except that configurable edge tiles have additional configurable routing circuits for routing input and output data to and from the circuits in the configurable tile arrangement illustrated in FIGS. 6, 7a and 7b. In some embodiments, a configurable memory tile is similar to a configurable logic tile except that instead of logic circuits and associated circuitry (e.g., carry chain circuitry), the memory tile includes memory blocks (e.g., contiguous block of storage elements and associated circuitry). U.S. patent application Ser. No. 11/082,193 discloses an example of such a memory tile. This application also described examples of embedding memory blocks between tiles. Such memory blocks and neighboring tiles can also be conceptually viewed as a configurable tile or tiles. FIG. 6 also omits the circuitry outside of the configurable tiles. Omitted circuitry may include transport network layers, deskew circuitry, trigger circuitry and trace buffer circuitry.

Many of the figures below represent circuits, components of circuits, and/or connections between circuits and components of circuits. Though these connections are represented in the figures as a single line per connection, it will be obvious to those of ordinary skill in the art that any of the connections shown could represent single wires, pairs of wires, optical connections in an optical logic circuit, or any other connection that connects two parts of a logic circuit. For example, a single connection line could represent a pair of wires used to implement differential signaling, with one wire carrying the signal and the other carrying the inverse of the signal.

III. Overview of User-Cycles and Subcycles

In some embodiments, the LUTs and the multiplexers are subcycle reconfigurable circuit elements, as described in U.S. patent application Ser. No. 11/082,193. In some of these embodiments, the configurable IC is a reconfigurable IC that stores multiple sets of configuration data for its subcycle reconfigurable circuit elements, so that the reconfigurable circuit elements can use a different set of configuration data in each different subcycle. In other words, a subcycle reconfigurable IC has configuration data that tells it how to reconfigure in every subcycle.

In some embodiments, a configurable IC may operate on a user-cycle basis with a particular number of subcycles per user cycle. At one level of abstraction, the configurable IC has a user-design calling for a particular number of operations to be performed in a particular number of user-cycles. This user design is translated into a physical configuration with circuit elements that can each perform one operation per subcycle, thus allowing multiple operations per element per user cycle. One advantage of this is that it allows user designs with a greater number of operations per user cycle than the number of physical elements in the configurable IC.

For example, a user-design may call for four separate logic gate functions to be performed by four separate logic gates (in different locations on the user-design IC) during a particular user cycle. The physical configuration may implement such a user-design by having all four logic gate functions performed by a single LUT that reconfigures itself according to stored configuration data in successive user cycles.

In summary, ICs that reconfigure during run time may be referred to as "reconfigurable ICs". Some reconfigurable ICs are capable of reconfiguring in each subcycle. These may be called "subcycle reconfigurable ICs", though they may still be referred to as "reconfigurable ICs" for short.

IV. Packet Data Structure

Figure 8:
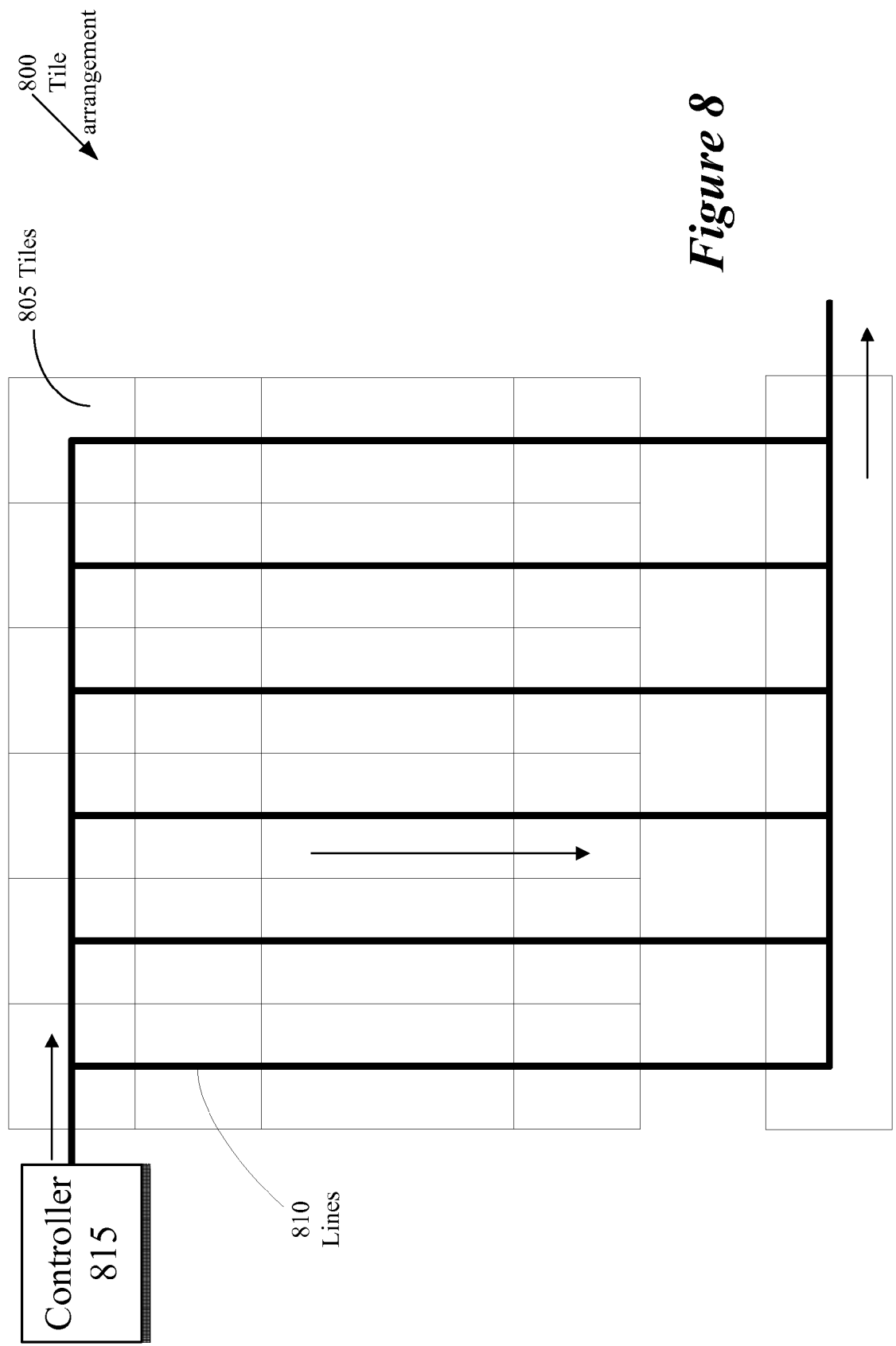
FIG. 8 illustrates a configurable IC with a configuration/debug controller.

Some embodiments use a configuration/debug controller to formulate configuration/debug packets, which are then routed to the configurable tiles of a configurable IC during configuration/debug operations. FIG. 8 illustrates one such controller 815. This controller 815 formulates configuration/debug packets and routes such packets to the configurable tiles 805 over a set of lines 810 that traverse each configurable tile in a tile arrangement 800. The controller formulates configuration/debug packets at a fast rate in some embodiments. In some embodiments, each tile 805 in FIG. 8 corresponds to a logic tile (1) with one logic circuit (such as tile 605 of FIG. 6), (2) with a set of four aligned LUTs (such as tile 750 of FIG. 7a), (3) with two sets of four aligned LUTs (such as tile 700 of FIG. 7b). In some embodiments, some or all tiles 805 are some other type of tile (e.g., edge tiles, memory tiles, etc.).

In some embodiments, the set of lines 810 includes eighteen lines, six of which are used to provide control signals, and twelve are used to provide data signals. The six control signals serve as an opcode (operation code), while the twelve signals serve as the operand (i.e., data argument) associated with the opcode. Accordingly, the six lines are referred to below as the opcode lines while the twelve lines are referred to as the operand lines.

As mentioned above, some embodiments use a packet switching technology to route data to and from the resources in the configurable tiles. Hence, over the eighteen lines that traverse through each set of tiles, these embodiments can route variable length data packets to configurable tiles sequentially, randomly, or based on tile types (including a global tile type).

V. IC Network Structure

Some prior art integrated circuits implemented debugging operations using invasive debug designs. An invasive debug design is one which requires that the user design be changed in order to take the debugging operations into account. For example, configurable circuits that would otherwise be used for implementing functions of the user design would instead be used for debugging operations. Using an invasive debug design can lead to the physical implementation being spread out over a larger area on the chip. Such a spread out design can cause the physical implementation to be sub-optimal. An invasive design can also require that the physical implementation of the user design be restructured in order to receive data from various different parts of the physical circuit, thus costing time and effort to place and route the elements of the circuit multiple times.

In some embodiments or the present invention, the debug network is non-invasive. A non-invasive debug network is one which does not need to use circuits that would otherwise be used to implement the user's design. Some advantages of a non-invasive debug network of some embodiments are that the non-invasive debug network; 1) has the advantage of not requiring a spread out implementation of the user design, 2) doesn't require restructuring the physical implementation of the user design in order to retrieve data from different parts of the circuit.

Non-invasive debug networks aren't allowed to use circuits that are assigned to implementing the user design, but the non-invasive debug networks of some embodiments are allowed to use "leftover" circuits, for example, configurable interconnect circuits. Therefore, once a user design circuit has been implemented on the configurable IC, such configurable circuit elements of the configurable IC that are not used to implement the user design circuit may be put to use to support the debug network and transport network.

Figure 9:
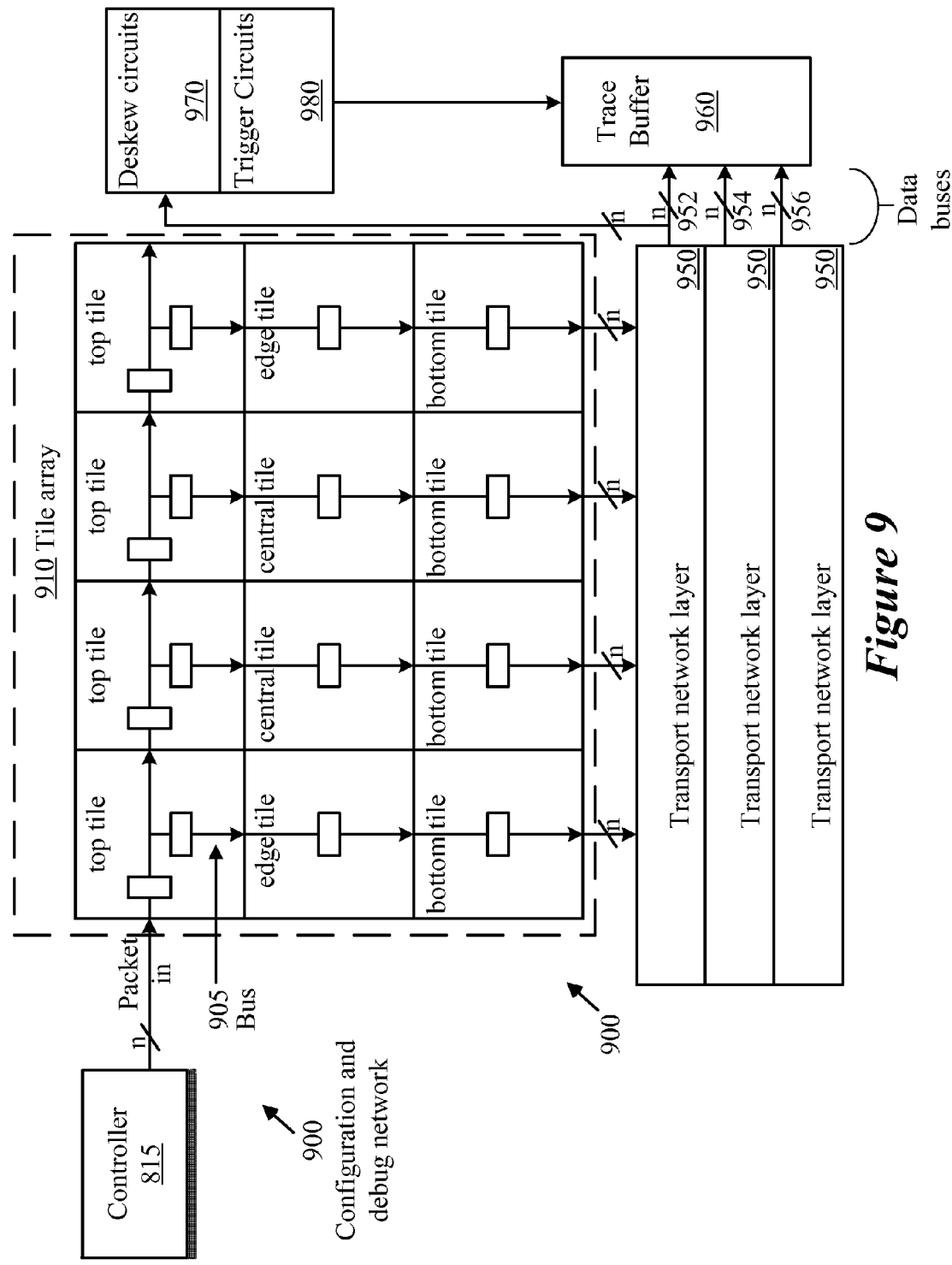
FIG. 9 illustrates a configurable IC with transport network and debugging circuits.

FIG. 9 provides an overview of the configuration and debug network 900 of some embodiments. As shown in this figure, this network includes a configuration/debug bus 905 and a configuration/debug controller 815. The configuration/debug bus 905 passes through each tile of a tile array 910, so that the configuration/debug controller 815 can route configuration/debug packets to the tiles of the tile array 910. Debug data passes out of the bottom tiles and into the transport network. In some embodiments, the transport network layers 950 are implemented as partial crossbars, in other embodiments, other types of circuits may be used for routing data. Instances where both partial crossbars and transport network layers are mentioned do not indicate that instances where one or the other are mentioned are limited to the one mentioned. The debugging circuitry of the configurable IC includes trace buffer 960, deskew circuitry 970, and trigger circuitry 980.

As shown in FIG. 9, the tile array includes four types of tiles, which are: top, edge, central, and bottom. Central and edge tiles have a similar circuit structure in the configuration/debug network 900, except that edge tiles store more configuration bits as they control the configurable I/Os of the configurable IC and may contain different programmable resources (e.g., the east/west tiles might contain LUTs, while the north/south tiles might not).

The top tiles have a network circuit structure that allows packets to pass along the top tile row. The top tiles also include the column selection functionality that can route a particular packet down a particular column that is addressed. This column selection functionality routes tile X and tile Y frames down each column as well. The tile X frame is routed down each column as it serves as (1) a column enable signal for each column that contains an addressed tile, and (2) a column disable signal for each column that contained a previously addressed tile. In the configuration/debug network 900, the tile Y frame also gets routed down each column before the column select circuitry of the particular column can determine that the particular column does not contain the destination (i.e., addressed) tile for the current packet. The network circuit structure of each tile also includes a tile selection circuit that allows a tile to detect that a packet is addressed to it.

The configuration/debug network exits the bottom tiles and enters the transport network. In some embodiments, the transport network of FIG. 9 includes a set of transport network layers 950. The transport network layers 950 route the debug data along data buses 952, 954 and 956 to the trace buffer 960 and the deskew circuits 970. The deskew circuits 970 pass the deskewed data to the trigger circuits 980.

In some embodiments, data sent from the configurable circuits via the configuration/debug network is passed to each transport network layer. In such embodiments, each transport network layer 950 has the same incoming data. The configuration of the circuits in each transport network layer determines which bits of that data will be passed along by that layer. In some embodiments, the configuration of circuits in each transport layer may also determine when to pass along the received data. Note that in some embodiments, the number of transport network layers may be higher or lower than the number shown in FIG. 9. As mentioned above, some embodiments may use different types of transport networks. In some embodiments, the transport networks have multiple layers (such networks may be called "multi-layer transport networks"), with each layer capable of receiving and passing along data from the tile array. In some such embodiments (described elsewhere in this specification), one or more of these layers may send data to a trigger circuit that triggers a trace buffer to stop recording new data.

In FIG. 9, and in many other figures of this specification, data lines are represented with a slash through them and the letter "n" next to the slash. These symbols indicate that the line represents multiple data lines, but is represented as one line rather than render the figure difficult to understand by having a separate line for each bit of width of the line. In some figures, the number of bits wide of a particular data bus is provided in the text. However, it will be clear to those of ordinary skill in the art that: 1) other values of n can be used in other embodiments, and 2) multiple instances of "slash n" in a particular figure do not necessarily represent the same width as each other even within that particular figure. For instance, in some embodiments illustrated by FIG. 9, data buses 952, 954 and 956 do have the same widths (n bits wide) as the configuration/debug bus 905. Other embodiments may use different widths of data buses 952, 954 and 956. In some embodiments, the widths of the data buses are the same as each other but different from the widths described here, in other embodiments the widths of the data buses may be different from each other. Furthermore, when the text or context indicates that a line without a "slash n" is a multiple line bus, the absence of the "slash n" should not be taken to mean that a line is a single bit data line.

The configuration/debug network 900 has a known latency through each of the tiles. Two implications of this known latency in each tile are that: 1) two signals that pass through different numbers of tiles may take different amounts of time to arrive at the transport network; and 2) the amount of time it takes for a signal to pass through a set of tiles can be predicted from the path through the tiles. More specifically, the amount of time necessary for a read message to get from the controller 815, to the intended tile, and for the debug data from that tile to reach the transport network layers 950 depends on the location of the tile in the array.

This raises the issue of how to compare data that comes from different parts of the configurable IC. The deskew circuitry 970 compensates for the variance in delays caused by bits arriving from different physical locations. In some embodiments, the deskew network also compensates for other delays. Other delays may include those incurred in compensating for congestion of the configuration/debug and transport networks and those caused by retiming of the configured circuit. For example when implanting a user design with elements on different subcycles (see section III, above for details on subcycles). The deskewing allows the trigger 980 to operate on data that is adjusted to appear properly simultaneous. The deskew circuitry is explained in more detail below.

The configuration/debug network 900 includes resources that are not part of the routing fabric of the tiles and are not usable as part of the routing fabric of the tiles. An example of such resources is the configuration/debug bus 905. In some embodiments, the configuration/debug bus 905 has a fixed width in each column. The amount of data that the configuration/debug bus 905 can carry to the transport network is limited by this width. In some circumstances, it is desirable to collect more data bits from a given column than the width of the configuration/debug bus in that column would allow. In some embodiments, this problem is solved by using the routing fabric of the tiles to send the additional data bits to tiles in one or more other columns. In other words, if the demand from a particular column is higher than the capacity of the configuration/debug network in that column, then the routing fabric can redirect the signal to another column with excess capacity in the configuration/debug network. Examples of routing fabric, such as wiring and interconnects that connect the configurable logic circuits are disclosed in U.S. patent application Ser. No. 11/082,193. More detail on using the routing fabric to supplement the configuration/debug network will be described below in reference to FIGS. 34 and 35a-35b.

In this specification, the figures show the data flowing "down" the configuration/debug network, then along the transport network from left to right, then into a trace buffer to the right of the transport network and into a trigger above the transport network. However, it will be clear to one of ordinary skill in the art that other orientations of components other than the particular orientations illustrated are possible within the scope of the invention. For example, the configuration/debug network might send data "up" to a transport network above the tile array, or data might flow from right to left to reach triggers or trace buffers on the left instead of the right, etc.

VI. Transport Network

Figure 10:
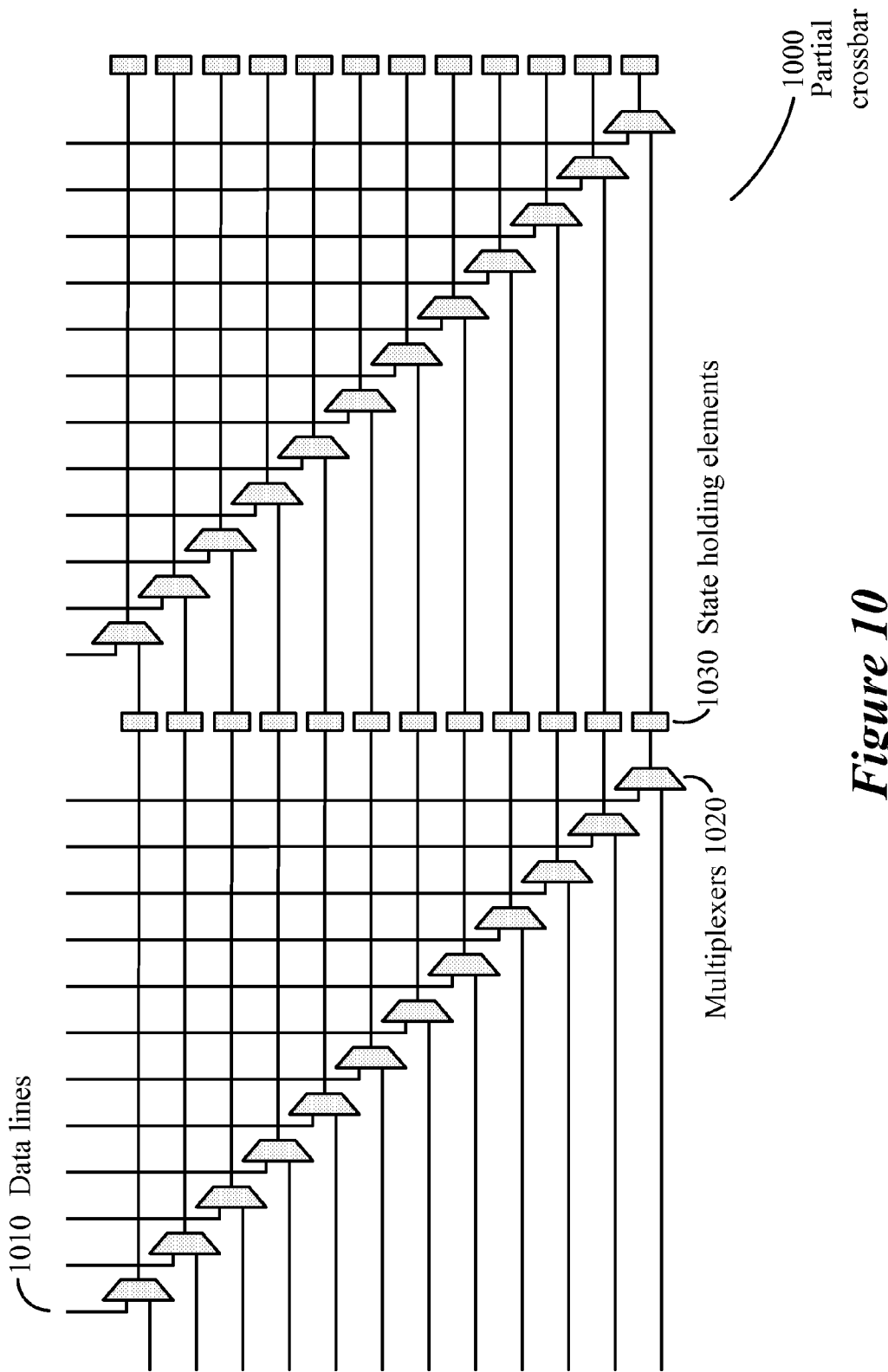
FIG. 10 illustrates part of a partial crossbar of some embodiments.

The configuration/debug network of some embodiments passes out of the main tile array and enters into the transport network layers 950 of the transport network. FIG. 10 illustrates the partial crossbars used in some embodiments to implement transport network layers 950. Data enters the partial crossbar 1000 on data lines 1010. In some embodiments, there are twelve data lines 1010 per column. FIG. 10 illustrates inputs from two columns; some embodiments accept inputs from more columns, such as the number of columns in the tile array. The data lines 1010 enter multiplexers 1020. Each multiplexer 1020 can be set, during debugging operations, to pass on data from the column above it, or from the immediately previous section of the partial crossbar. In this and in other figures, multiplexers in the transport network may be shown as having inputs coming in from the left of the multiplexers, however it will be clear to one of ordinary skill in the art that in some figures, the transport network may have data flow from right to left instead, and in such embodiments the inputs would come in from the right. In any case, it will be clear to one of ordinary skill in the art that in some embodiments the first column in the chain (whichever side it is on), having no preceding column, does not receive inputs from a preceding column.

The multiplexers 1020 can be set in tandem or individually. In either case, the data is passed on to state holding elements 1030 (e.g., buffers), between the multiplexers associated with one column and the next. In FIG. 10, each data line 1010 enters a single 2-to-1 multiplexer 1020; however other embodiments may add flexibility by splitting each data line 1010 into multiple lines and having each line provide input to multiple multiplexers. For example, FIG. 13, described in more detail below, illustrates an embodiment in which each data line connects to one 2-to-1 multiplexer in each of three partial crossbars 1350. This allows any data line to send data to the trace buffer 960 through any of the partial crossbars 1350. Other embodiments may split the data lines three ways, and have each data line connect to three separate 4-to-1 multiplexers. The 4-to-1 multiplexers, in turn, would each get input from 3 separate data lines, and one input from the immediately previous section of the partial crossbar. The multiplexers could then be set to pass on data from any of these inputs. Still other embodiments may combine these concepts and have data lines which connect to multiple multiplexers in each of multiple partial crossbars. Some embodiments allow reconfiguring of the transport network dynamically. This allows the user to determine at any time what circuit elements should be monitored by the debug system.

Data passes from different columns of the tile array to corresponding parts of the transport network. The transport network as shown in FIG. 10 passes data along the transport network from the column on which it arrives to the end of the transport network. This passing on of data can lead to congestion when data coming in from above arrives at a multiplexer in a subcycle when the multiplexer is busy with data passed to it from the previous multiplexers in the transport network.

Figure 11:
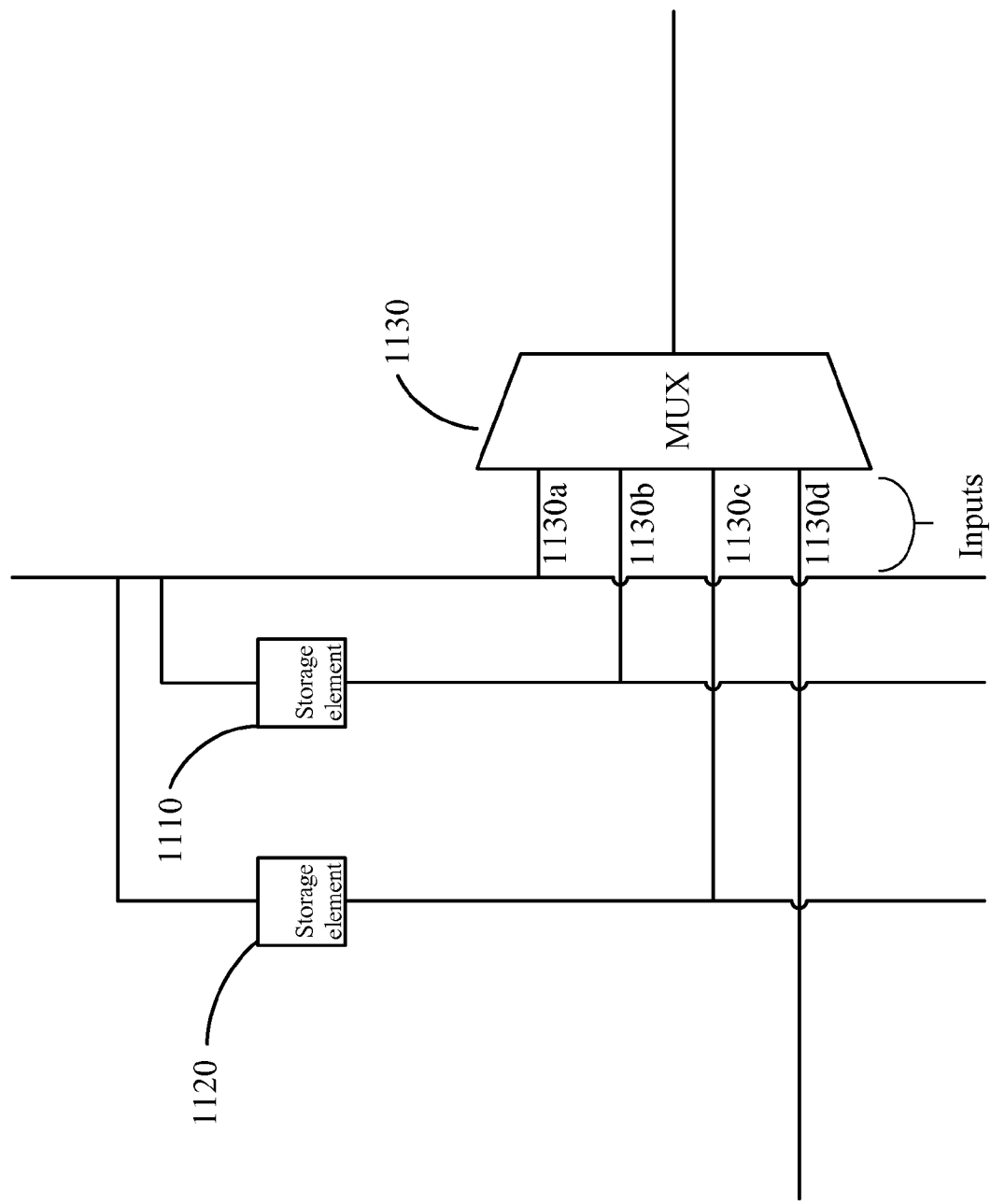
FIG. 11 illustrates elements of a transport network layer of some alternative embodiments.

In some embodiments, the transport network uses multiplexers with larger numbers of inputs and other components outside the multiplexer to handle congestion. FIG. 11 illustrates a multiplexer 1130 of some embodiments along with some surrounding components. The multiplexer 1130 has four inputs, 1130a-1130d. Input 1130a comes directly from the configuration/debug network. Input 1130d comes from the multiplexer to the left (not shown). Inputs 1130b and 1130c come from the outputs of storage elements 1110 and 1120 respectively. Storage elements 1110 and 1120 take inputs from the configuration/debug network. The storage elements of some embodiments either "hold" the value of a previously received input, or pass the value of the input as it comes in. A "held" value is available at the output of the storage element until the storage element is switched back to pass. In some embodiments, switching from pass to hold (or vice versa) is commanded by a signal on a control line (not shown). In other embodiments, the storage element can be pre-programmed to switch in a given subcycle.

For this specification, combinations of circuit elements such as the one illustrated in FIG. 11 will be called "delay select multiplexers". The "delay select multiplexers" of some embodiments have multiple inputs that receive data on multiple data lines. The multiple data lines branch from a single data line, with at least some of the data lines having a storage element or other configurable delaying circuit element after the branch but before the input. Such delay select multiplexers can be used in place of the two input multiplexers described in relation to the partial crossbars of FIGS. 10 and 13. In some embodiments, the delay select multiplexers are provided in a plurality of chains of delay select multiplexers.

The storage elements can be used to delay signals that come in from the tile array at a congested subcycle until a free subcycle is available. Data passes through the transport network at pre-established rates. Conceptually, network capacity can be divided in to discrete slots; each slot can either be empty or contain a single bit of data. The more slots that are occupied during a given subcycle at a particular part of the network, the fewer slots are available and the more congested the network is. An example of an occupied slot is one in which a signal from the left is coming in on input 1130d (the slot contains a bit). Another example is a slot in which a signal from a column to the right of the shown element will be arriving when the slot reaches that point in the network (e.g., the slot is reserved for data from further along the transport network). In either case, the slot is not available for signals coming down from the configuration/debug network.

As an example of using delays for slotting purposes, consider a case where two data bits, if neither of them were delayed, would "try" to reach the trace buffer on the same line and in the same subcycle. In this case, assume that the first data bit is coming in from column three of a tile array, on the configuration/debug network. If it is not delayed in reaching a multiplexer 1130, it will reach the trace buffer on line one and in subcycle two. Now suppose the second data bit, coming from another column is already on course to arrive at the trace buffer on line one and in subcycle two. The storage element 1110 can hold the first data bit for a later subcycle. Next, suppose the trace buffer has a free slot on line one in subcycle five. If the data bit reaches the multiplexer 1130 in a particular later subcycle, the first data bit will reach the trace buffer on line one and in subcycle five. When that particular later subcycle arrives, the multiplexer 1130 switches to input 1130b, allowing the first data bit to proceed to the trace buffer. The first data bit reaches the trace buffer on line one and in subcycle five. The second data bit reaches the trace buffer on line one in subcycle two. Thus, the delay select multiplexer averts the potential conflict between the arrival times of the first and second data bits.

In some embodiments, such as the one illustrated in FIG. 9, the lines from the direct and delayed connections from the configuration/debug network branch, and part of the branches go down to a second layer of the transport network, and can even branch again there, one set of three connections going into three out of four inputs of a multiplexer and the other set of three connections going down to a third layer of the transport network. In embodiments with greater numbers of transport network layers, such splitting can be repeated for as many layers as desired. The result of these multiple inputs, and storage elements, and transport network layers is that there is great flexibility in what subcycle and on what connection a bit of debug data reaches the trace buffer. In some embodiments, only one layer has such storage elements, in other embodiments, each layer has its own set of storage elements. In some embodiments, at least some of these storage elements are latches.

VII. Streaming

In some embodiments, all elements of the configurable IC are available on the configuration/debug network 900. Examples of such elements include UDS elements (such as RCLs and other storage elements in the routing fabric, memory cells, register cells, etc.), LUTs, and/or other circuit elements that connect to the configuration/debug network. As the elements are accessible through the configuration/debug network, this network can be used to access (read from or write to) the elements in any sequential or random access manner. Random access in this context means that the elements can be accessed through the configuration/debug network and the data packets as desired by a user or debugger, rather than in a particular set sequence.

Moreover, as the elements are accessible through the configuration/debug network, this network can read out the state (e.g., the value of UDS elements) of the configurable IC while the IC is operating. This ability is highly advantageous for performing debugging during the operation of the configurable IC.

In some embodiments, the configuration/debug network has a streaming mode that can direct various elements in one or more configurable tiles to stream out their data during the user-design operation of the configurable IC at the user design operating frequency or faster. This streaming data makes the debugging abilities of the configurable IC even more robust as it allows a large amount of computed and configuration data to be simultaneously captured while the user design circuit implemented on the configurable IC operates at high speed.

The streamed data can be passed through to the trace buffer 960 (as seen in FIG. 9). The trace buffer 960 stores data as it comes in, deleting or overwriting the oldest data as new data enters. When the trigger 980 detects that pre-determined conditions have been met, it signals the trace buffer 960 to stop taking in new data and stop deleting or overwriting the oldest data. Further detail on the trace buffer may be found in section VIII below.

Figure 12:
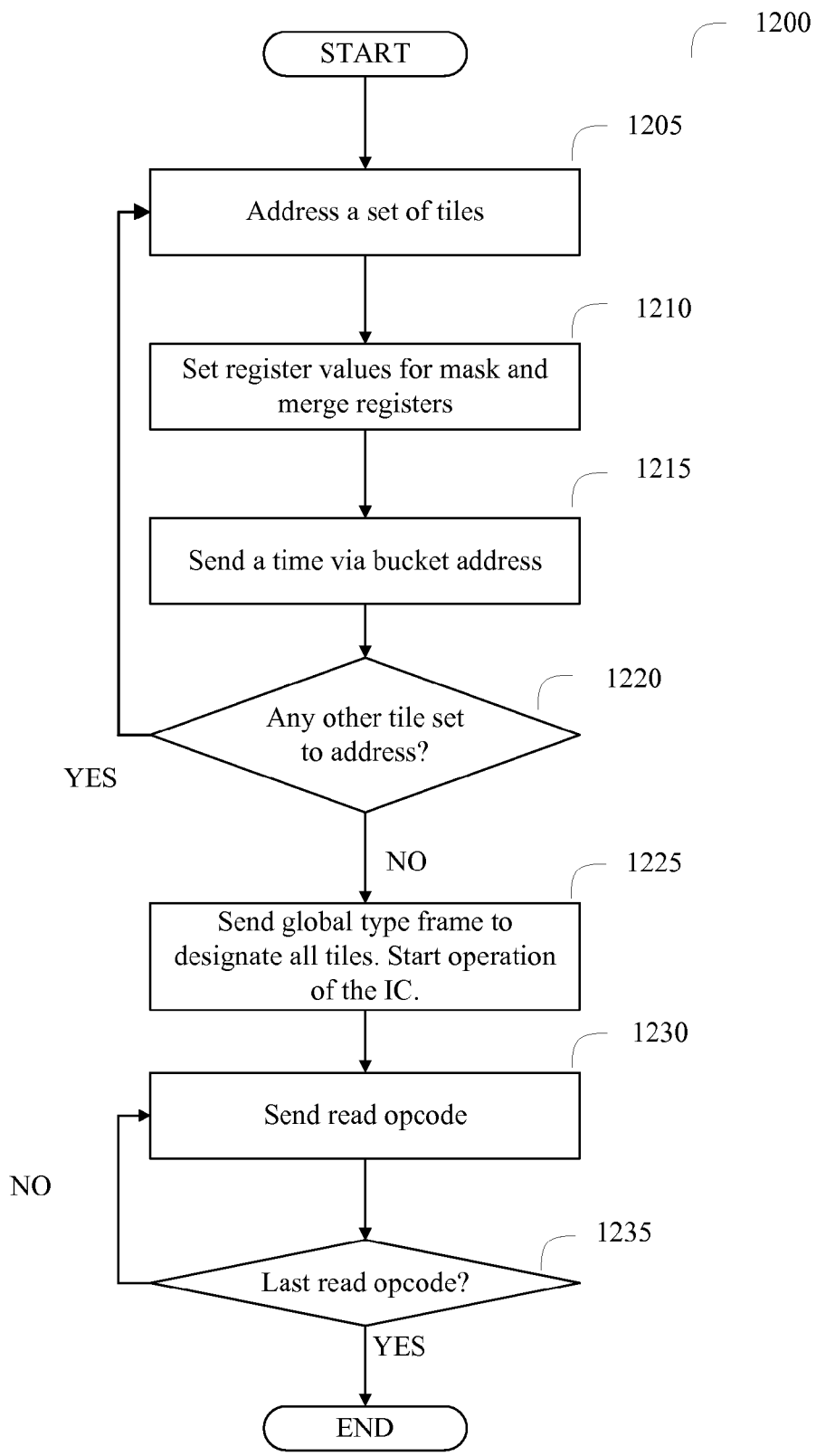
FIG. 12 illustrates a flowchart of IC configuration.

FIG. 12 illustrates a process 1200 that the configuration controller 815 can perform to operate the configuration/debug network in a streaming mode. As shown in this figure, the streaming process 1200 initially addresses (at 1205) a set of tiles. The process can address such a set by sending a tile X frame and a tile Y frame that identify one tile. Alternatively, the process can address a set of two or more tiles by sending a tile X frame that specifies a global type (in order to enable the column selection circuit of each column) followed by a tile Y frame that specifies the tile type or tile address that identify the tile or tiles being addressed.

Next, the process 1200 sets (at 1210) the mask and merge bits in the mask and merge registers of mask and merge logics of the set of tiles addressed at 1205. In some embodiments, multiple elements send data to the debug network at the same time. Such embodiments may have mask and merge registers to filter out data from elements that are not being monitored. Mask and merge registers are described in more detail in U.S. patent application Ser. No. 11/375,562, incorporated herein by reference. Accordingly, the mask and/or merge registers of some embodiments mask out the values that are read from the elements of the addressed set of tiles when this set does not include any element whose value has to be streamed out during the streaming operation. Alternatively, when the addressed set of tiles includes a particular set of user-design states that needs to be streamed out, the mask and/or merge registers do not mask out the values that are read from the UDS elements that need to be streamed out.

Various embodiments provide various types of readable elements. Readable elements are UDS elements in some embodiments. In other embodiments, readable elements include UDS elements as well as other storage and/or circuit elements. In still other embodiments, readable elements do not include UDS elements, but do include other storage and/or circuit elements. In some embodiments, the readable elements of a tile are grouped together into "readable buckets" for purposes of sending data (e.g., UDS data) to the configuration/debug network. For example, if there are thirty readable elements and the configuration/debug network can handle at most ten elements from a tile at a time, then the readable elements can be grouped into three readable buckets of ten elements each. When one of the thirty elements is to be read, its readable bucket is selected, and all elements in that readable bucket try to send their signals to the configuration/debug network. In some embodiments, the readable buckets are further divided into "nibbles". Each nibble represents some fraction of the total number of readable elements (e.g., one third). In some of such embodiments, at most one tile has access to a particular nibble during a given subcycle. In such embodiments, data from elements in a second tile, but in the same nibble, cannot be sent down the debug network during that subcycle.

In order to select a readable bucket, the process, at 1215, sends a readable bucket address to the tiles (e.g., the set of tiles addressed at 1205). The mask and merge registers described above allow the desired signals from the elements in the selected readable bucket to pass to the configuration/debug network while screening out the unwanted signals.

After 1215, the process determines (at 1220) whether it needs to set the mask and merge register values in any other set of tiles. If so, the process returns to 1205, which was described above. Otherwise, the process notifies (at 1225) all tiles that the subsequent set of read operations are directed to them. In some embodiments, the process so notifies the tiles by sending a tile X frame that specifies a global type (in order to enable the column selection circuit of each column) followed by a tile Y frame that specifies the global tile type. At 1225, the process also starts the user-design operation of the IC. In some embodiments, the user-design operation of the IC might have started before the process 1200 of FIG. 12 started. In other words, some embodiments allow tiles to be configured or reconfigured for streaming after the user-design operation of the IC has started.

At 1230, a Read frame is sent, which causes all tiles to read data (e.g., UDS data) at the readable bucket addresses that were set at 1215. This read out data is initially stored in the operand field of the Read frame. As mentioned above, while transmitting this data, the tiles mask and merge logic circuits eliminate the data bits that are supposed to be masked out from the data stream that is streamed out of the tile arrangement. As further described below, the data stream can stream into a trace buffer that is outside of the tile arrangement but on the same IC die. In some embodiments, the merge register can be set per each bit for each subcycle to allow the merging operation to be defined per bit per each subcycle, while the mask register can be set per each subcycle to allow the masking operation to be defined per each subcycle. In some embodiments, mask and merge operations both occur within the configurable tiles. In other embodiments, one or both of the operations may be done at the transport network. For example, in some embodiments, the mask operation essentially occurs in the tile (e.g., the logic tile, the memory tile, etc.), while the merge operation is done in the transport network.

After 1230, the process determines (at 1235) whether it needs to continue the streaming mode by sending another Read frame in the next cycle. If so, another Read frame is sent at 1230. In some embodiments, the process 1200 sends Read frames through the configuration network at such a rate to ensure that UDS (or other) data streams out of the IC at the user-design operational rate or faster, e.g., at the subcycle rate in case of a subcycle using IC. For instance, in some embodiments, the configurable IC physically operates at 800 MHz to implement a 200 MHz user design with circuits that each loop through four configuration data sets in each user design cycle, changing to perform up to four different operations in the four subcycles associated with each user design cycle. In such an embodiment, the process 1200 could send Read frames through the configuration/debug network at a rate of 800 MHz to stream out data (e.g., UDS data) values at a rate of 800 MHz. In this manner, the monitored element's values could be streamed out for the four subcycles in each user design cycle, which thereby provide the monitored values for each user design cycle. The Read frames are repeatedly sent out until a determination is made (at 1235) that the streaming mode should terminate. At this stage, the streaming process ends.

VIII. Debug Circuitry

A. Trace Buffer

The streaming operation of the configuration/debug network 900 can be used to create a logic analyzer functionality on the configurable IC. In some embodiments, a logic analyzer has three components: (1) a sampling component, (2) a capture component, and (3) a trigger component, including deskew circuits. The streaming operation can serve as the sampling component of a logic analyzer. It can continuously provide samples of certain states of the configurable IC during the IC's operation.

Figure 13:
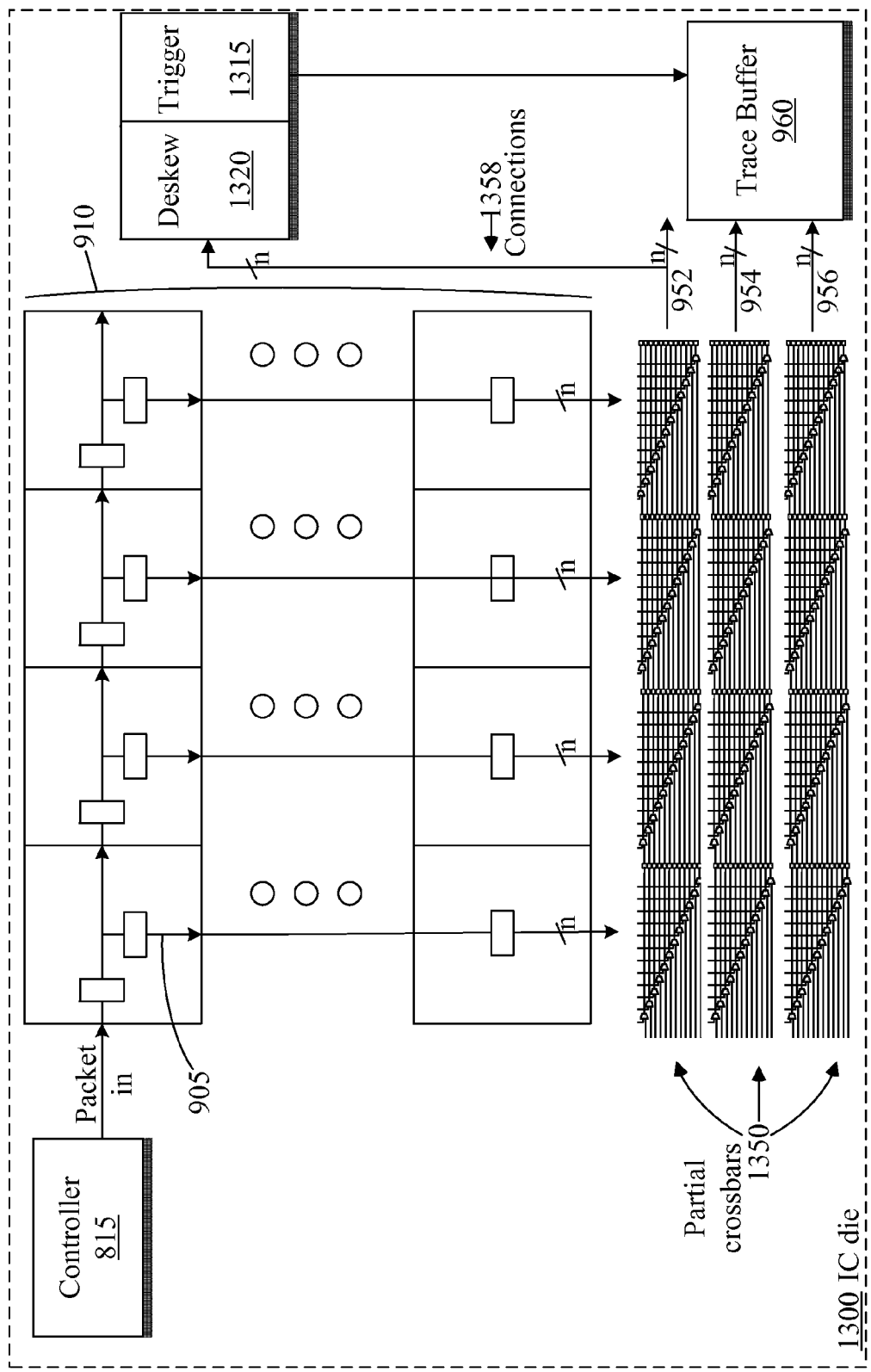
FIG. 13 illustrates a more detailed view of a configurable IC of some embodiments.

An on-chip trace buffer can perform the capture component of the logic analyzer. FIG. 13 illustrates an example of an IC with such a trace buffer 960. The trace buffer 960 is on the same configurable IC die 1300 as the tile array 910 and configuration controller 815. This buffer receives the sets of connections 952, 954, and 956 of the transport network layers 950 of the transport network. As mentioned above, the connections 952, 954, and 956 in some embodiments are (together) thirty-six bits wide, which allows the trace buffer to receive thirty-six bits of streamed-out data (e.g., UDS data) from the tile arrangement 910 on each clock cycle. In embodiments where the tile arrangement is part of a subcycle reconfigurable IC, the trace buffer can receive thirty-six bits on each subcycle of the user design cycle.

In this example, the trace buffer has 36 one-bit inputs. Thus, to store the bits coming in on each line, the trace buffer must be at least 36-bits wide. The trace buffer is some number of bits long. Generally, the longer the trace buffer is (in bits) the more IC area the trace buffer occupies. For this example, the trace buffer is 128 bits long. Thus, the trace buffer of this example can be represented by a grid of slots 36 bits wide by 128 bits long. Data can be written on one "row" of this grid in each subcycle. In some embodiments, there are eight subcycles per user cycle. In such embodiments, a 128 bit long buffer would store data for 16 user cycles (128/8).

Getting data (e.g., UDS data) from a particular element (e.g. UDS storage element) usually means getting data from the same element for several user cycles running. This means that in embodiments with eight subcycles per user cycle, data from that element may be written to the same "column" of the trace buffer, in one row of every eight. Thus, for a given input connection, data written on a given subcycle of each user cycle may repeat every eight slots. In this specification, the set of slots written by a given input and in a given subcycle can be called a "slot set". An "open slot set" is one in which no data is assigned to the slot set for the given subcycle and input connection.

In some embodiments, the trace buffer 960 is a circular buffer that continuously stores the data that it receives until instructed otherwise. When a circular trace buffer runs out of rows, it starts rewriting the rows, overwriting the oldest rows first. This goes on until the trigger signals a stop, at which point the trace buffer stops overwriting. The trace buffer then waits to offload the data from the configurable IC to the debug software. In some embodiments, the trace buffer has extra width to accommodate bits to keep track of the subcycle in which the data arrived and/or to keep track of which row is being written. In other embodiments, tracking data is maintained separately from the circular memory of the trace buffer, either within other circuitry that is part of the trace buffer or elsewhere.

B. Trigger

The trigger component of the logic analyzer is performed by a trigger circuit 1315 that communicates with the trace buffer 960. This trigger circuit 1315 analyzes the data (e.g., UDS data) as it is being stored in the trace buffer. When the trigger circuit 1315 identifies a particular set of values or sequence of values coming in on connections 1358, the trigger circuit directs the trace buffer to stop accepting new data that is being streamed out of the tile arrangement 910. In some embodiments, the trigger can be set to allow some delay (sometimes called a "programmable delay") between the trigger event and the stopping of the buffer. Such a trigger delay allows data to be collected from beyond the time of the trigger event itself. In this manner, the trace buffer may store a relevant subset of data that it received for a certain time interval before and/or after it stored the trigger-event data that the trigger circuit detected. In some embodiments, the programmable delay can optionally be set to delay for: 1) half the depth of the trace buffer, so that approximately the same amount of data will be buffered before the trigger event as after, 2) the depth of the trace buffer, so that most or all of the collected data will be from after the trigger, or 3) short or no delay, so that most or all of the data in the trace buffer is from before the trigger event. After stopping the trace buffer's recording, the trigger circuit in some embodiments directs the configuration controller to stop the streaming mode operation of the tile arrangement (e.g., to stop sending Read frames).

In some debugging operations, the trigger-event is a comparison between two user signal variables. In some cases, the tiles corresponding to the individual bits of data (e.g., UDS data) of each user signal variable are in different physical locations on the IC. The different physical locations of the tiles lead in turn to the data taking different amounts of time to reach the trigger circuitry. If a trigger compares data simultaneously with its arrival, but the data is coming in with different timing, the trigger will not be comparing the correct instance of the variables with each other. In order to align the variables in time, some embodiments interpose deskew circuitry 1320 between the transport network and the trigger circuitry.

C. Deskew Circuits

Figure 14:
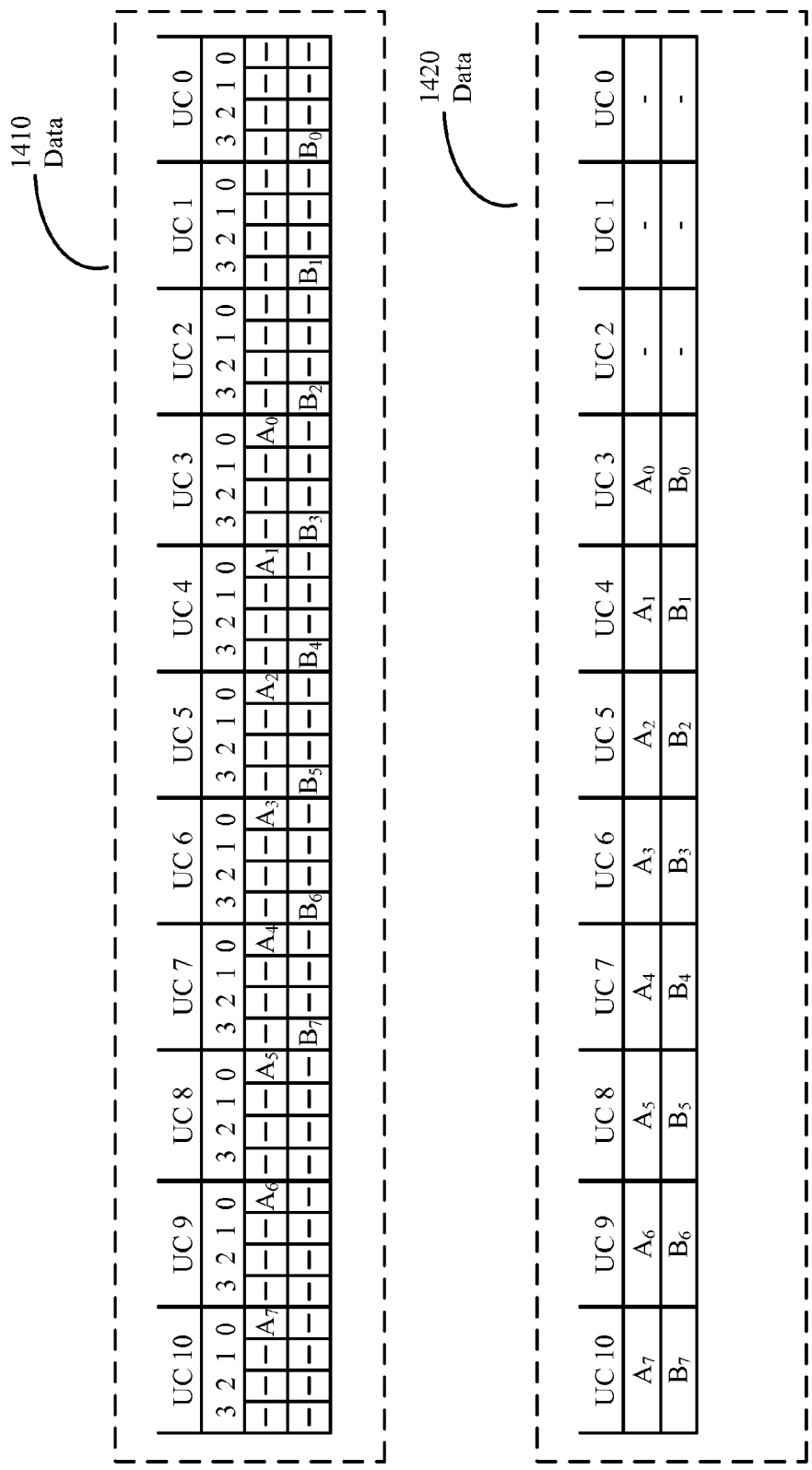
FIG. 14 illustrates a set of data values coming into deskew circuits at set intervals.

FIG. 14 illustrates two sets of bits (8-bits in each set) coming in with different timings. The bits of the first set, "A", come in, one per user cycle, with a delay of twelve subcycles relative to when each bit was generated in the tile array. The bits of the second set, "B", come in, one per user cycle, with a delay of three subcycles relative to when each bit was generated in the tile array. The deskew circuits of some embodiments temporally align the data, providing it to the trigger in the order it was generated so that simultaneously generated signals reach the trigger circuits at the same time.

Box 1410 represents the data as it comes in to the deskew circuitry. The top line of the box represents the number of the user cycle that the bits come in on. The second line represents the number of the subcycle that the bits come in on. Box 1420 represents the intended temporal alignment of the data at the trigger circuitry. The outputs of the deskew circuitry go to the trigger circuitry 970 (not shown). If the output is to have the same temporal alignment as the original signals generated in the tile array, the operation of the deskew circuitry should produce output matching the output seen in box 1420. In some embodiments illustrated by FIG. 14, the trigger circuitry evaluates the bit sets as of the end of each user cycle, but for ease of reading, the bits in box 1420 are centered. In other embodiments, the trigger may evaluate the bit sets as soon as the subcycle of the later bit set. The process of some embodiments of deskewing two sets of bits in accord with FIG. 14 is illustrated in FIGS. 16-19.

Figure 15:
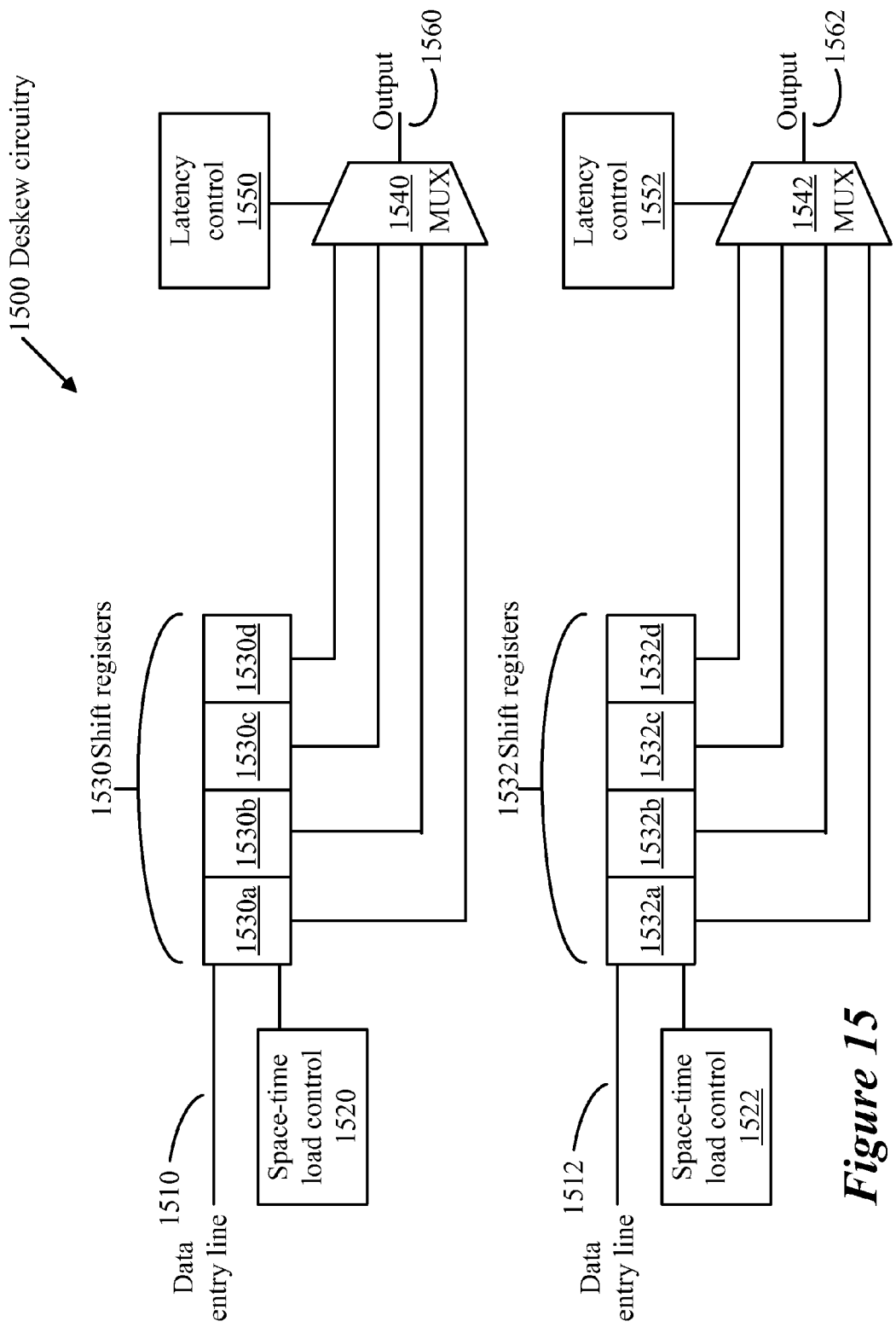
FIG. 15 illustrates a pair of 1-bit deskew circuits of some embodiments.

The deskew circuitry of some embodiments is shown in FIG. 15. The deskew circuitry 1500, includes data entry lines 1510 and 1512, space-time load controls 1520 and 1522, one-bit wide shift registers 1530 and 1532, four-to-one MUXs 1540 and 1542 with inputs from the individual bit-registers 1530*a*-1530*d* and 1532*a*-1532*d*, latency controls 1550 and 1552, and outputs 1560 and 1562 from the deskew circuitry to the trigger circuitry. For clarity, and to show individual elements of the deskew circuitry of some embodiments, circuits for deskewing two bits are shown in FIGS. 15-19. Some embodiments may deskew larger numbers of bits, for example 12, 48, 50, 72, or 96, or any other number. FIGS. 15-19 show enough circuitry to deskew two bits, the process of which will be shown in FIGS. 16-19. Deskewing temporally aligns bits with each other, which can only be done if there are at least two bits to align. It should be noted however, that in some embodiments, there may be deskew circuitry which places no delay on the last bit to come in. Such embodiments could pass the last bit directly to the trigger circuitry 970, having previously delayed most or all other bits using deskew circuitry. In other embodiments, all bits coming in to the deskew circuitry pass through deskew circuitry. In some such embodiments every bit is delayed by at least one subcycle before reaching the trigger.

The following descriptions of the operation of shift register 1530 also apply to shift register 1532. In FIG. 15, shift register 1530 operates by successively loading one bit at a time into bit-register 1530a. As each new bit is loaded, the previously loaded bits are shifted to the right. Over successive user cycles, the data bits are shifted from 1530a through 1530d. Shifting previous bits over as each bit comes in is the way a typical shift register works, but the time or circumstance in which new bits come in is configurable in some embodiments. In some embodiments, a bit is loaded into bit-register 1530a when space-time load control 1520 prompts the register to receive it. Space-time load control 1520 prompts the shift register 1530 to receive a bit on one particular subcycle per user cycle. Therefore, in such embodiments, the shift registers 1530 and 1532 shift once per user cycle. The received bit goes into bit-register 1530a, the bit that had been in bit-register 1530a shifts to bit-register 1530b and so on until the bit in the last bit-register is simply overwritten, not shifting anywhere. In other embodiments, the space-time load control 1520 may skip loading on some user cycles. For example, if for some reason a particular set of data values only needed to be monitored every other user cycle, a space-time load control could activate in some subcycle every other user cycle.

The latency control 1550 determines which input of MUX 1540 is active. Thus, the latency control 1550 determines how many user cycles to delay. As described above, the space-time load control 1520 of some embodiments activates the shift register 1530 once per user cycle. Because the shift register 1530 shifts once per user cycle, a data bit reaches each input of the multiplexer 1540 one full user cycle after the previous input. For example, it takes three user cycles after a bit is loaded into bit-register 1530a for the bit to reach bit-register 1530d. Therefore, if the MUX 1540 is told by latency control 1550 to choose the input that comes from bit register 1530d, the bit will be seen by the active input of MUX 1540 only after a delay of three user cycles from when it was loaded into bit-register 1530a.

The shift register 1530 and the multiplexer 1540 determine how many full user cycles to delay a data bit, and the space-time load control 1520 determines which of the multiple possible subcycles within each user cycle will provide the data bits that go into the shift register 1530. Therefore, by selecting appropriate values for the space-time load controls 1520 and 1522 and the latency controls 1550 and 1552, the deskew circuits can cause delays of an arbitrary number of subcycles within a certain range.

The range is from one to the product of the length of the bit shifter times the number of subcycles per user cycle. In FIG. 15, the shift registers 1530 and 1532 are four bits long, and as shown in FIG. 14 there are four subcycles per user cycle. Thus, the range for these examples is from one to sixteen subcycles. Other embodiments may use longer or shorter shift registers (e.g., more or fewer bit-registers wide), to delay by more or fewer full user cycles (respectively). Other embodiments may also use more or fewer subcycles per user cycle, making each user cycle worth of delay mean a larger number of subcycles delay. It should also be noted that while the above descriptions say "shift registers" any other type of stepwise delay circuit could be used in alternate embodiments.

In the following example, in accord with the delays indicated in FIG. 14, the space-time load control 1520 prompts shift register 1530 to load bits into bit-register 1530a in subcycle zero and space-time load control 1522 prompts shift register 1532 to load bits into bit-register 1532a in subcycle three. FIGS. 16-19 show the result of data loading over several user cycles, given the data pattern shown in FIG. 14. A convention in computers and electronics is to start numbering from zero and going up to N−1, where N is the total number of items to be counted. For purposes of keeping the verbal descriptions of the subcycles in line with these conventions, the subcycles described below will be characterized as the zeroth, first, second, and third, rather than the first through fourth. For clarity, the individual bit-registers in FIGS. 16-19 are not numbered, but are shown as containing particular bits.

Figure 16:
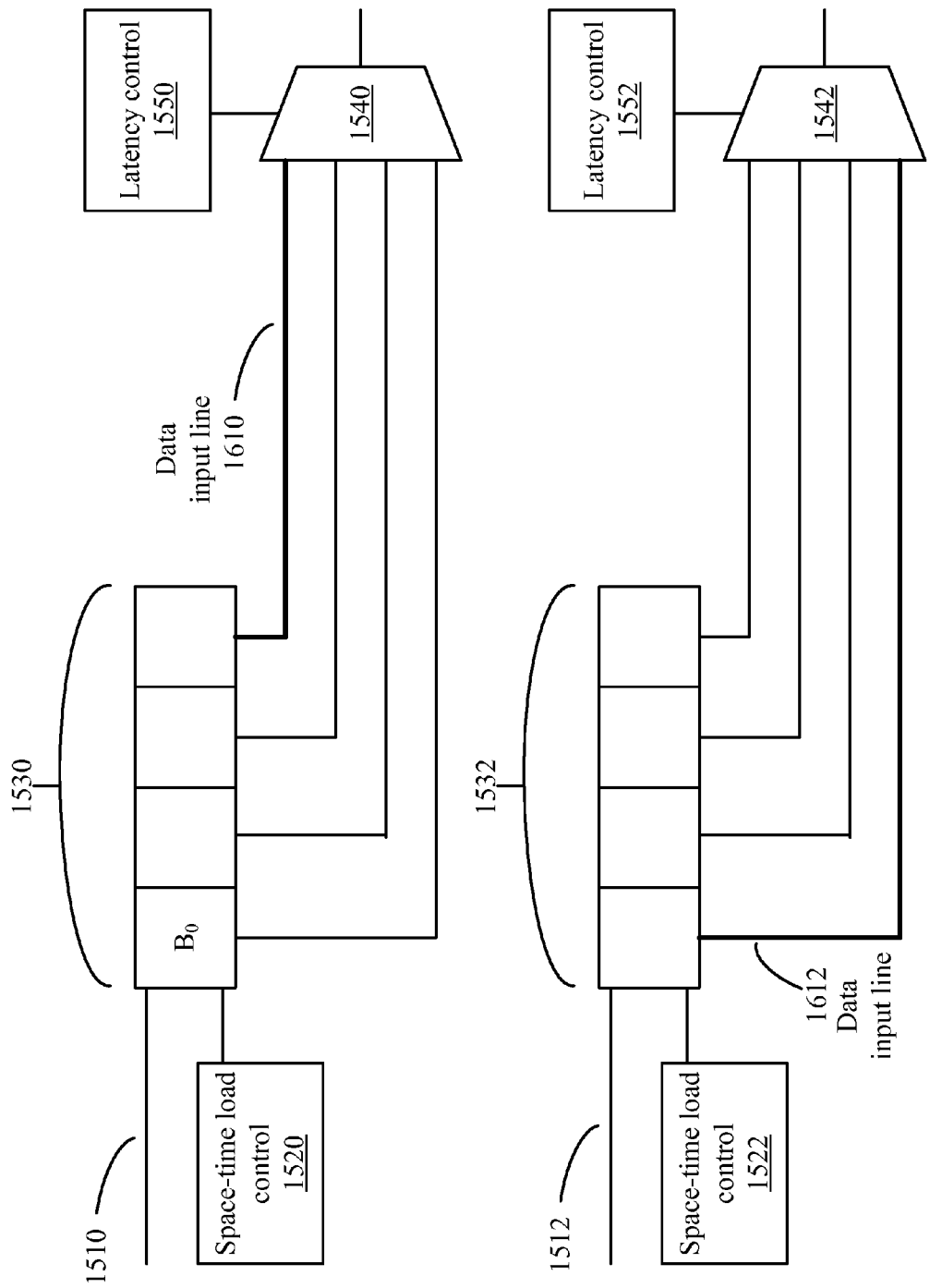
FIGS. 16-19 illustrate the process of deskewing 1-bit data.
Figure 17:
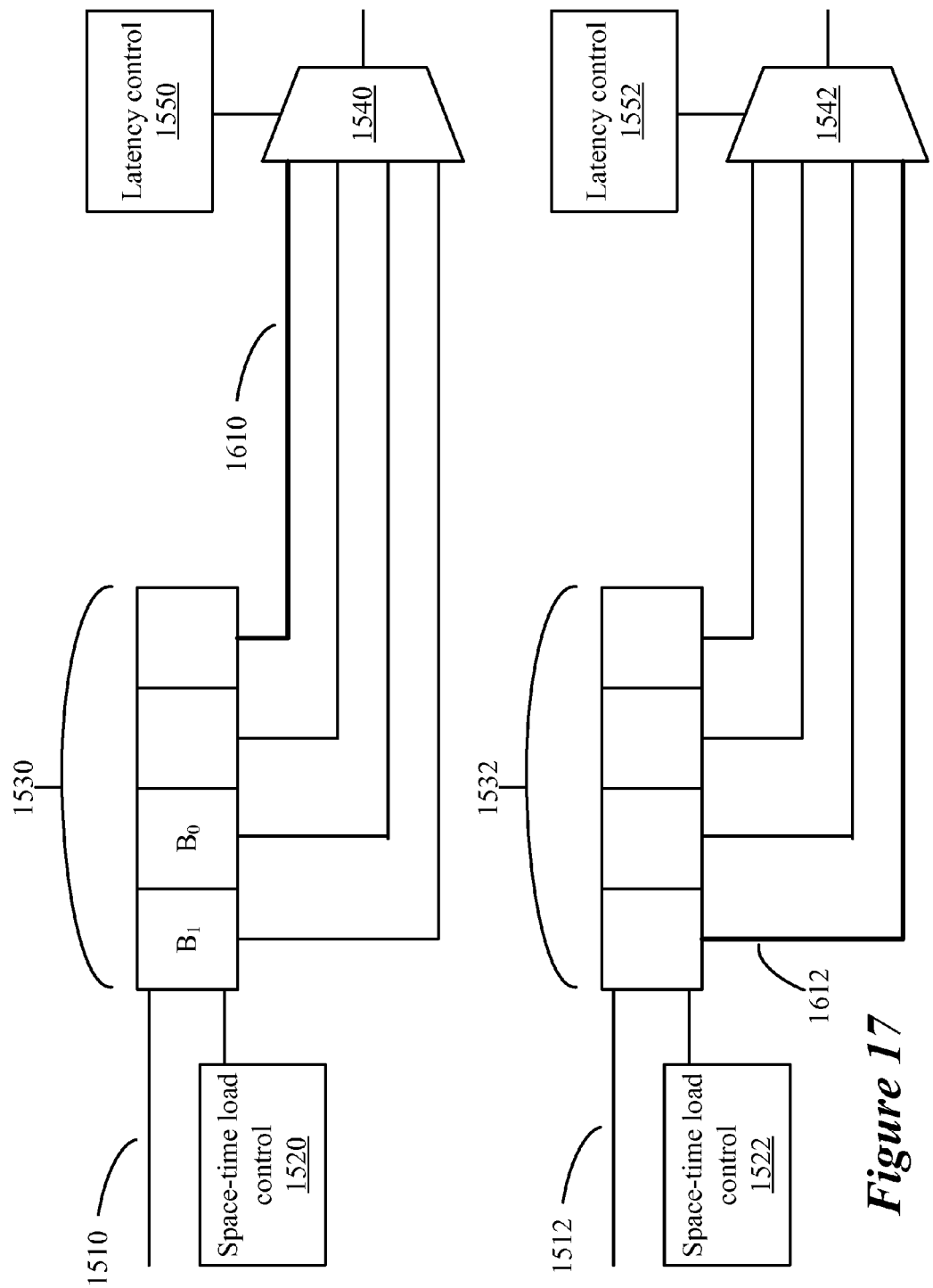
Figure 18:
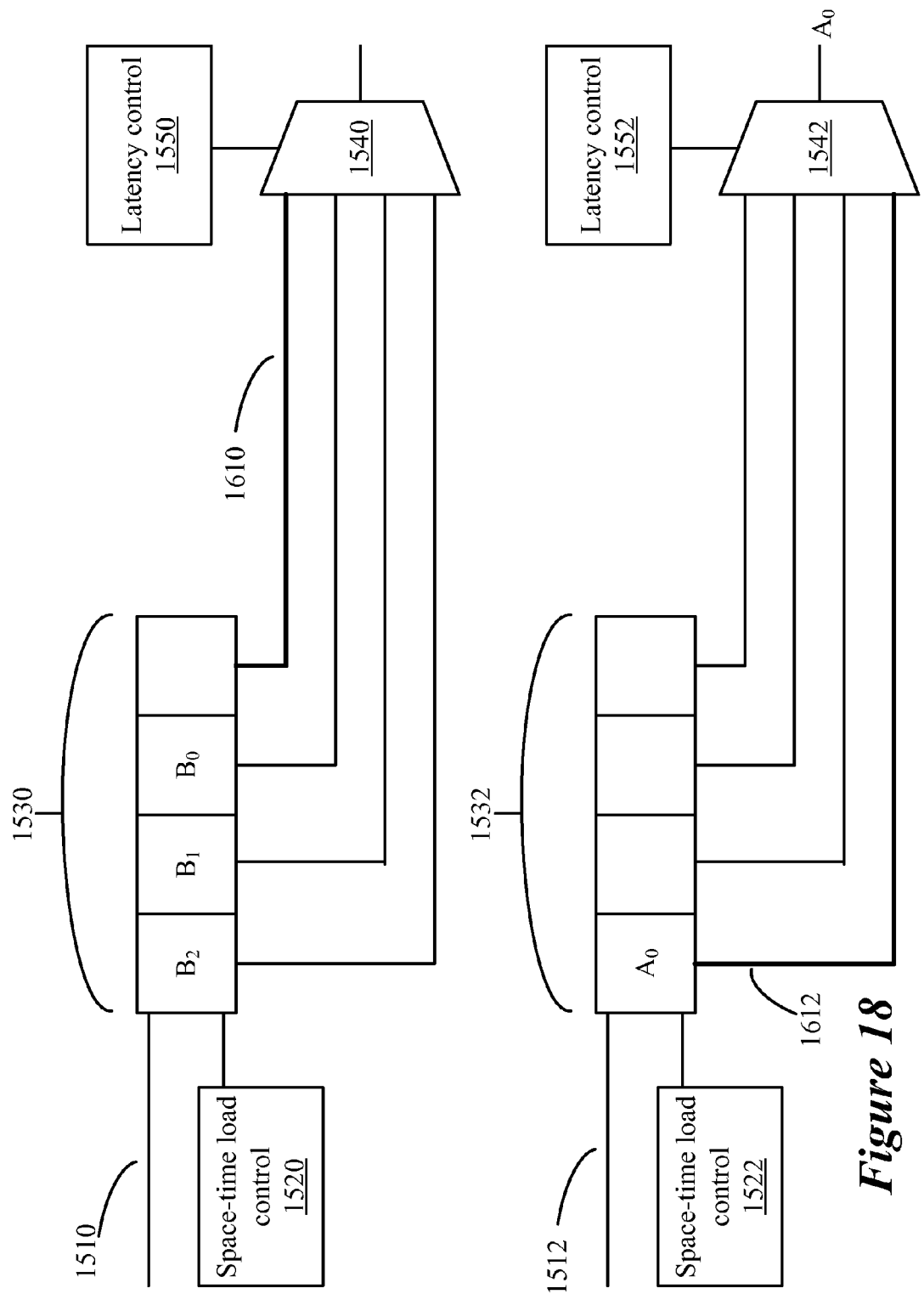
Figure 19:
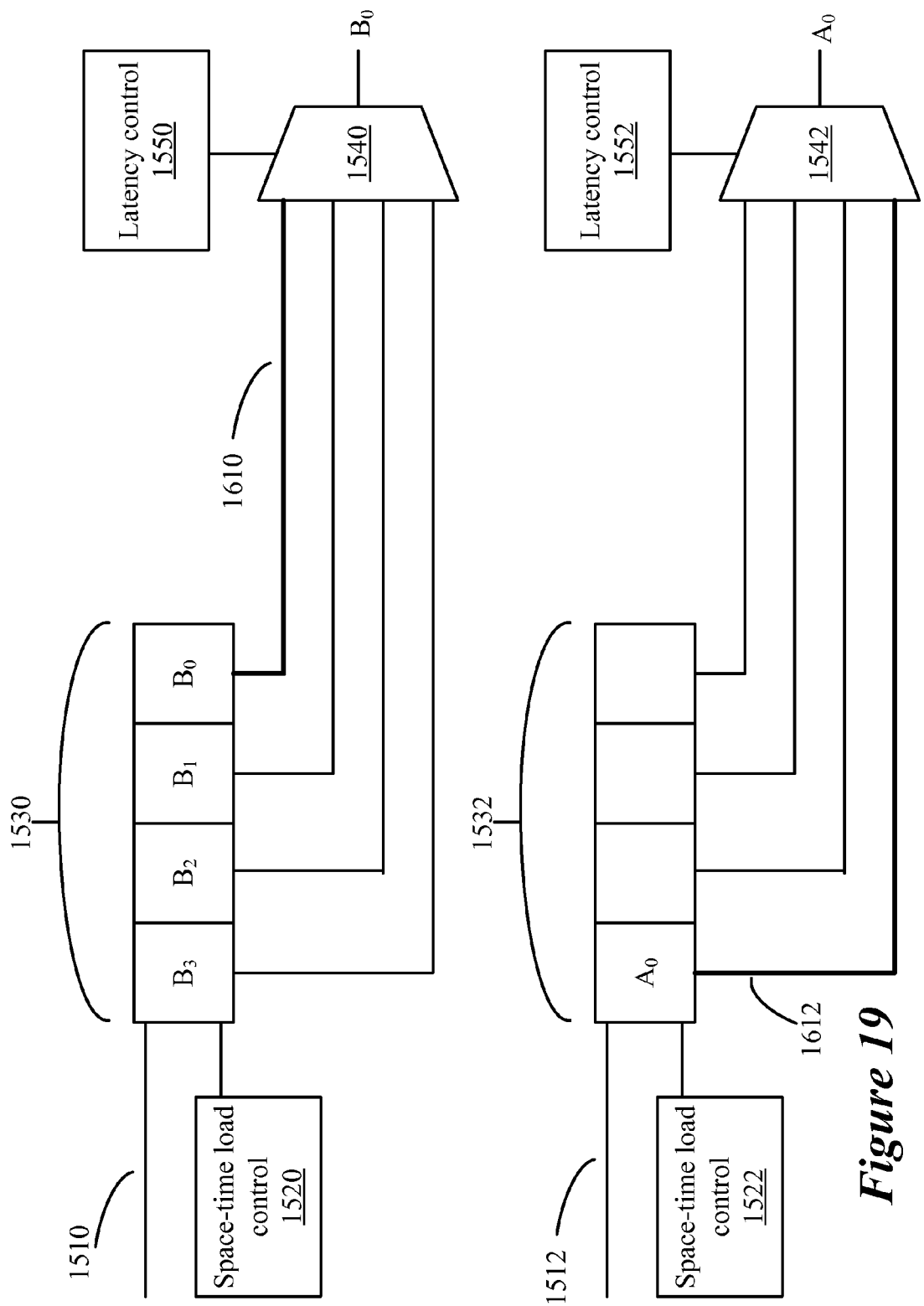

FIG. 16 shows the state of the deskew circuitry as of the third subcycle of the zeroth user cycle. The first bit, $B_0$, of bit set B has been loaded into the shift register 1530 at bit register 1530a. The data input line 1610, represented in FIGS. 16-19 as thicker than the other data lines, represents the data line to the active input of MUX 1540. The data input line 1612, represented in FIGS. 16-19 as thicker than the other data lines, represents the data line to the active input of MUX 1542. As shown in the figure, the first bit, $B_0$, has not yet reached the bit register connected to data input line 1610. The first bit of bit set A has not reached the deskew circuitry and thus has not been loaded into shift register 1532. Therefore, the first bits of bit sets B and A have not yet been passed on to the trigger circuitry. FIG. 17 shows the state of the deskew circuitry as of the third subcycle of the first user cycle. The first two bits, $B_0$ and $B_1$, have been loaded into shift register 1530, but neither of them is on the bit register connected to the active input of MUX 1540. FIG. 18 jumps ahead to the zeroth subcycle of the third user cycle. At this point, the first three bits of bit set B have been loaded into shift register 1530 and the first bit, $A_0$, of bit set A, has been loaded into bit-register 1532a. The active input of MUX 1542 is the input connected to bit register 1532a. Thus, the first bit of bit set A is passed through MUX 1542, and is available to the trigger circuitry. FIG. 19 illustrates the state of the system as of the third subcycle of the third user cycle. At this time, the first bit of bit set B has reached the bit register corresponding to the active input of MUX 1540. Thus, as of this time, the end of the third user cycle, the first bits of each bit set are simultaneously available to the trigger circuitry. During each subsequent user cycle, the subsequent bits of the bit sets are presented to the trigger circuitry: $A_1$ and $B_1$, as of the end of the fourth user cycle; $A_2$ and $B_2$, as of the end of the fifth user cycle, and so on. Thus, the deskew circuitry undoes the effects of the different time delays of the variables caused by the physical positions of their respective tiles. FIG. 20 illustrates the incoming data as seen by the trigger circuitry. Note that this is the same box 1420 as the desired presentation of the data as seen in FIG. 14.

D. Multi-Bit Deskew Circuits

Figure 21:
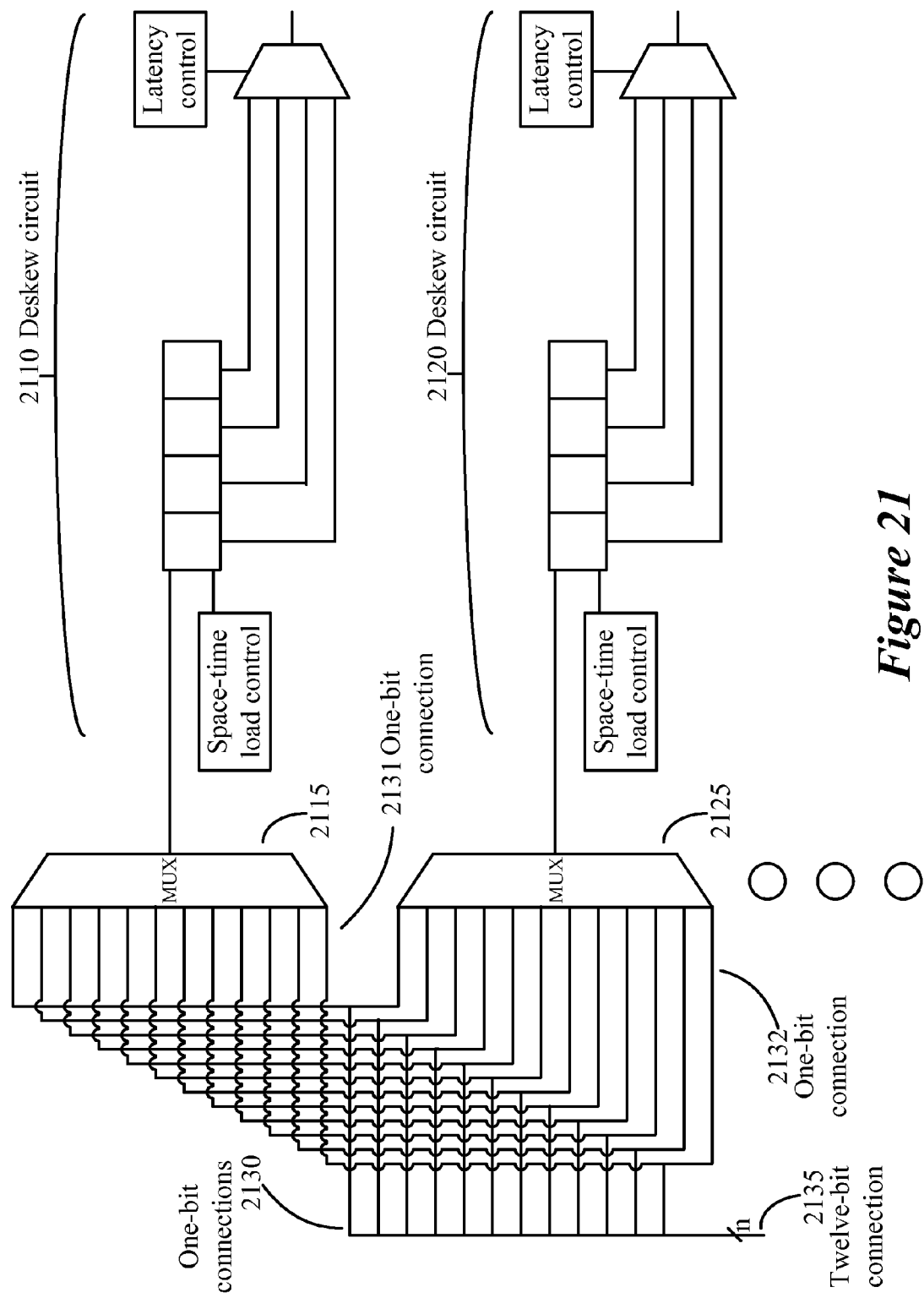
FIG. 21 illustrates a detailed view of multi-input deskew circuits of some embodiments.

In some embodiments, the deskew circuits have more flexibility in which output wires from the transport network layers go into which deskew circuits. In such embodiments, rather than there being a single one-bit connection feeding each 1-bit deskew, each 1-bit deskew is preceded by a multiplexer fed by all the wires from the first transport network layer. FIG. 21 illustrates two such deskew circuits of some embodiments. In the figure, 1-bit deskew circuit 2110 receives its input from multiplexer 2115, 1-bit deskew circuit 2120 receives its inputs from multiplexer 2125. Multiplexer 2115 receives its inputs from twelve 1-bit connections 2131. Multiplexer 2125 receives its inputs from twelve 1-bit connections 2132. 1-bit connections 2131 and 2132 split off from twelve 1-bit connections 2130. The 1-bit connections 2130 split off from the 12-bit connection 2135. This split is representational, as the 12-bit connection 2135, shown with the diagonal bar, is a conventional and compact way of representing multiple 1-bit connections. In this figure, the barred lines represent twelve connections. The circuits illustrated in FIG. 21 permit each of the 1-bit deskew circuits 2110 and 2120 to receive their individual bits from any of the twelve connections coming from the top transport network layer (not shown). In simpler terms, the multiplexer picks which input to pay attention to, the rest are ignored.

In some embodiments, each 1-bit connection coming into the deskew circuits carries one data bit at a time. Here, "at a time" means "within a given clock cycle". In embodiments that operate on a subcycle basis "a given clock cycle" means "a given subcycle". With one bit coming in per subcycle on each 1-bit connection, each 1-bit connection can bring in as many data bits during a given user cycle as there are subcycles in that user cycle. The potential number of data bits coming into the deskew circuits on one user cycle for an embodiment with X subcycles per user cycle and Y connections is X*Y, the mathematical multiplication of X and Y. The deskew circuits can receive and deskew one of these data bits per 1-bit deskew circuit. The multiplexer at the input selects a connection, and the space-time load control selects a subcycle in which to load data. For example, an embodiment with six connections and eight subcycles per user cycle could have eight data bits (one per subcycle) coming in on each of the six connections, for a total of forty-eight data bits coming in per user cycle.

Any given multi-input deskew circuit can ignore most of the data signals reaching it. Of the signals reaching it, the input multiplexer of a given multi-input deskew circuit may "focus" on one selected connection, and the 1-bit deskew circuit may narrow the "focus" to signals coming in during one selected subcycle (in each user cycle). In embodiments with fewer that X*Y multi-bit deskew circuits, the deskew circuits may not be able to simultaneously deskew all the signals coming in on all the lines. The following are some examples of configurations that select subsets of the entire set of signals. One example of a configuration for using a system with twelve multi-bit deskew circuits would be to have each multi-bit deskew circuit select a different input connection (of the twelve coming in). In that configuration, each multi-bit deskew circuit could take in data from its own programmed subcycle. Twelve such deskew circuits would allow data from one subcycle each of twelve connections to be deskewed. Another example of a configuration for using such a system would have each multi-bit deskew circuit accept data from a single connection (single before it branched to reach each separate multi-bit deskew circuit that is). Such a configuration of deskew circuits would allow data from up to twelve different subcycles on that single connection to be deskewed (in embodiments with twelve or more subcycles per user cycle). A set of twelve multi-bit deskew circuits could also handle any other combination of twelve connection/subcycle pairs.

Figure 22:
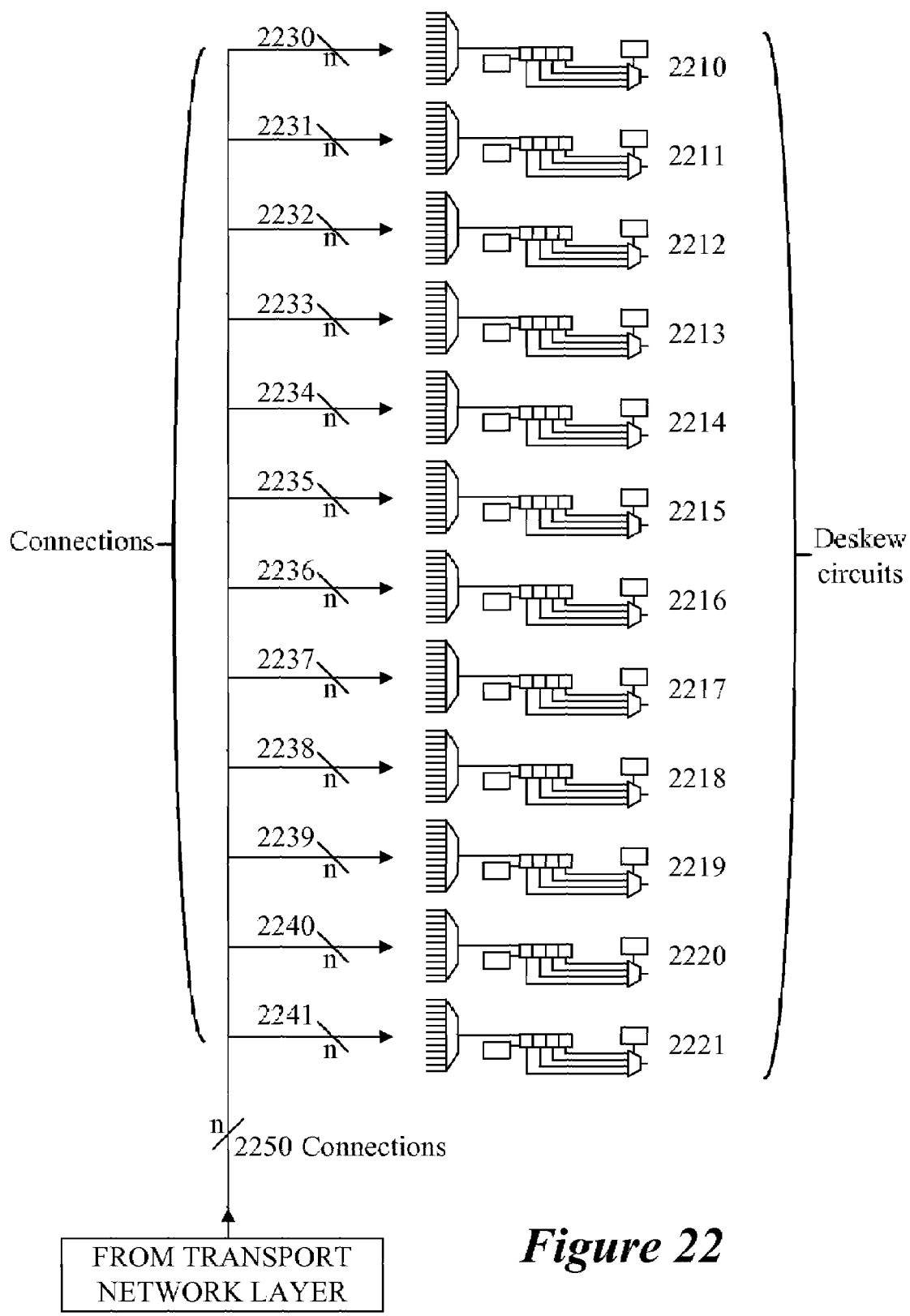
FIG. 22 illustrates an overview of several multi-input deskew circuits of some embodiments.

A twelve deskew circuit embodiment is illustrated in FIG. 22. The figure shows twelve deskew circuits 2210-2221. Each deskew circuit has twelve connections 2230-2241 to the multiplexer selecting its input. These connections 2230-2241 split off from connections 2250, which come from the top transport network layer (not shown). It should be noted that in order to cope with data from multiple subcycles some embodiments include considerably more deskew circuits than the number of connections 2250. Some embodiments may include X*Y 1-bit deskew circuits (enough to deskew all potential incoming bits), or even more (for example for redundancy). However, some embodiments with twelve 1-bit connections and eight subcycles per user cycle include sixty or seventy-two 1-bit deskew circuits. These embodiments allow most of the 96 (12*8) possible incoming bits to be deskewed, without using up IC area on deskew capacity that might never be needed.

Figure 23:
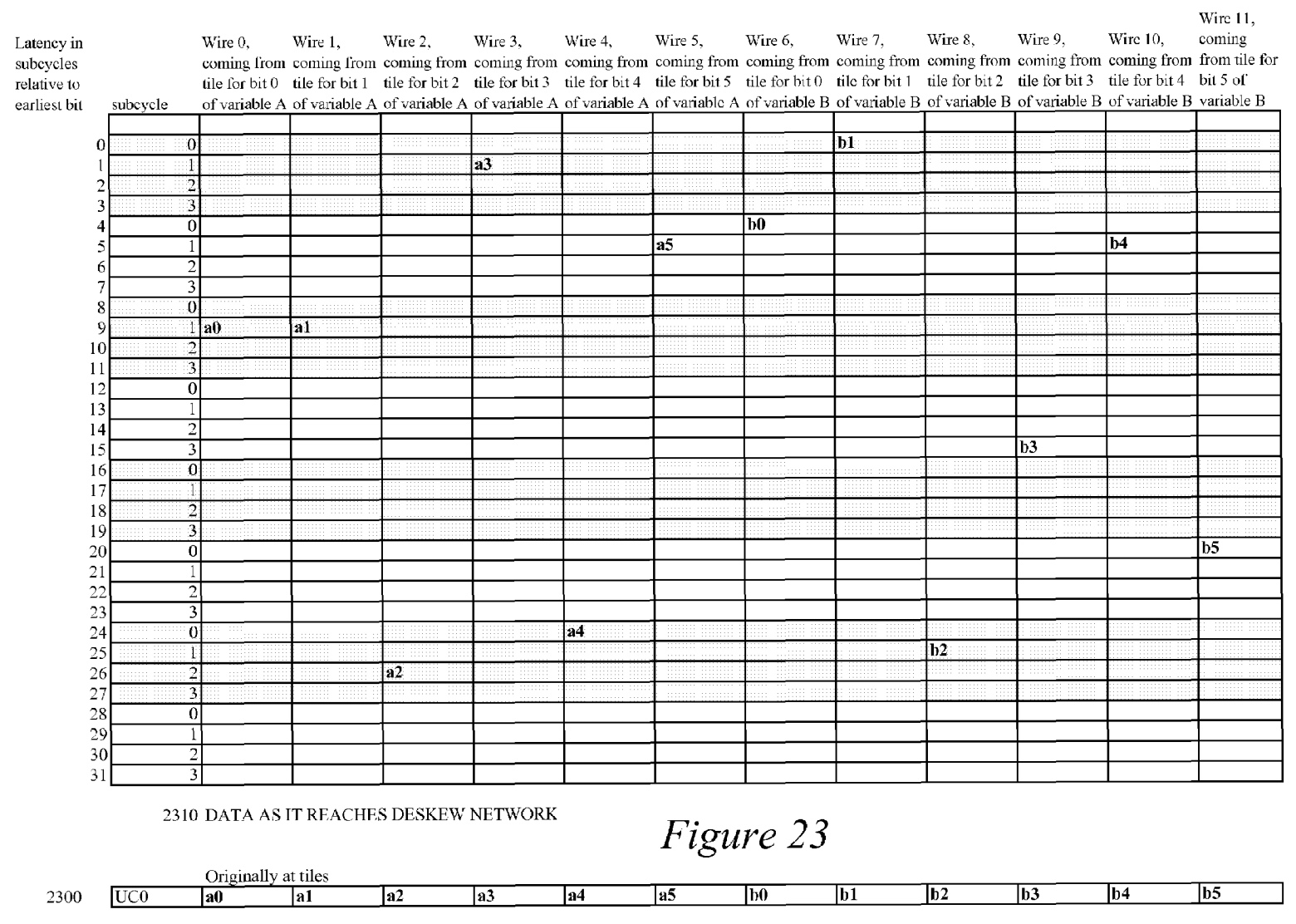

FIGS. 23-24 illustrate multiple bit sets of data bits coming in on different subcycles and connections (alternatively called "wires"). The embodiment illustrated in FIGS. 23-24 has twelve connections (represented by twelve columns), and has four subcycles per user cycle (represented as repeating subcycles 0-3). In FIG. 23, grid 2300 shows two multi-bit words comprising bits a0-a5 and b0-b5. All of the bits were produced in the configurable circuits of a configurable IC in user cycle zero (UC0). Each column of grid 2310 represents the signals coming out of a transport network (on its way to the deskew circuits) on a given connection, over many subcycles.

For example, bit a0 (the zeroth bit of word "a") comes out of the transport network on wire 0, nine subcycles later than b1 (the first bit of word "b") comes out of the transport network on wire 7. The relative delays among the bits may have many causes, but the multi-bit deskew circuits of some embodiments can compensate for the relative delay. Individual multi-bit deskew circuits delay each bit before passing it to the trigger circuits. The delay of each bit is by just enough to align them when they reach the trigger, recreating the simultaneity that they had when they were generated in the configurable circuits of the configurable IC. The recreated simultaneity allows the trigger to act on the multi-bit words as two multi-bit words, rather than separate bits coming in at different times.

FIG. 23 illustrates a case where only the one instance of each of the two multi-bit word sets need be deskewed. In the more general case, multiple instances of the multi-bit words will come into the deskew circuits. In some cases, an instance of each word will be generated in each user cycle. FIG. 24 depicts this type of case, in which multiple instances of the multi-bit words come in, shown in grids 2400 and 2410. Note that each bit still comes in during a particular subcycle and on a particular wire. Grid 2400 represents multiple instances of the data words (e.g., UDS data words) as generated in the configurable circuits, one instance in each row UC0-UC7. Grid 2400 shows data bits in the user cycle in which they are generated. In some embodiments, the illustrated data bits in grid 2400 may be generated in different subcycles of the same user cycle. The deskew circuits restore chronological order to the data so that data that was generated in the same cycle (user cycle in some embodiments, subcycle in others) reaches the trigger at the same time. Grid 2410 represents the data as it arrives at the deskew circuits.

In this figure all bits represented in the diagram by a0-# are successive instances of the bit a0, with the place of each bit in the order of succession being shown by the "#" value, and all bits represented in the diagram by a1-# are successive instances of the bit a1 and so forth. In some embodiments, all bits a1-# are generated at the same tile and subcycle as each other (in successive user cycles), all bits a2-# are generated in the same tile and subcycle as each other, etc. In this illustration, they reach the deskew circuits in successive user cycles on their respective connections. Each bit a1-# comes in on wire 1 and subcycle 1, and all bits b3-# come in on wire 9 and subcycle 3. The multi-bit deskew circuits, once configured for a particular set of delays, send data to the trigger in the same temporal order as it was generated in the tiles of the configurable IC. In this example, the deskew circuits would delay all bits b1-# by some number of subcycles and delay all bits a3-# by one more subcycle than that, and so on. Thus, the trigger can compare successive instances of the two multi-bit words until it finds the combination of bits on which it is set to trigger. For instance the trigger could compare the word made up of bits a0-0 to a5-0 and the word made up of bits b0-0 to b5-0, and then compare the word made up of bits a0-1 to a5-1 and the word made up of bits b0-1 to b5-1 and so on. Thus restoring the simultaneity (within the same user cycle if not the same subcycle) that the data words (e.g., UDS data words) had when they were generated. In short, deskewing the data.

E. Multiple Transport Network Layer Activated Triggers

In some embodiments, the deskew circuits have multiplexers with more inputs than the number of connections from one of the transport network layers. This allows additional flexibility in getting data to the deskew circuits and the trigger circuits. Any number of transport layers could go into a multi-input deskew circuit, but some embodiments save resources by having all outputs of one layer going to each multi-input deskew circuit and only some outputs of a second layer going to the multi-input deskew circuits. In some embodiments, the outputs of a transport layer may be divided up among the multi-input deskew circuits. Such embodiments may have multi-input multiplexers that each receive as inputs all or substantially all the connections from one transport network layer plus some fraction of the inputs from one or more other transport network layers.

Figure 25:
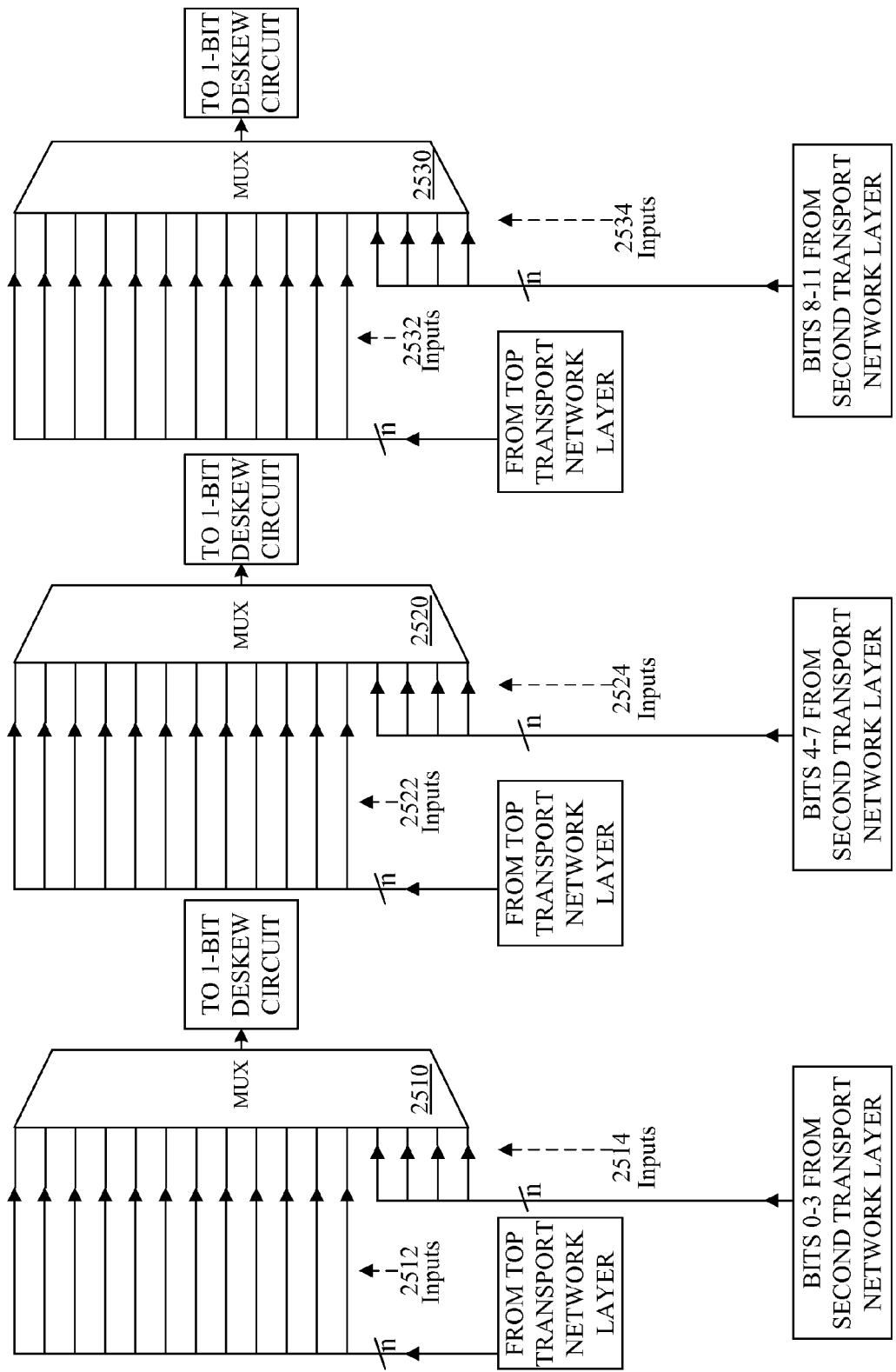
FIG. 25 illustrates inputs of three different multi-bit deskew circuits of some alternate embodiments.
Figure 26:
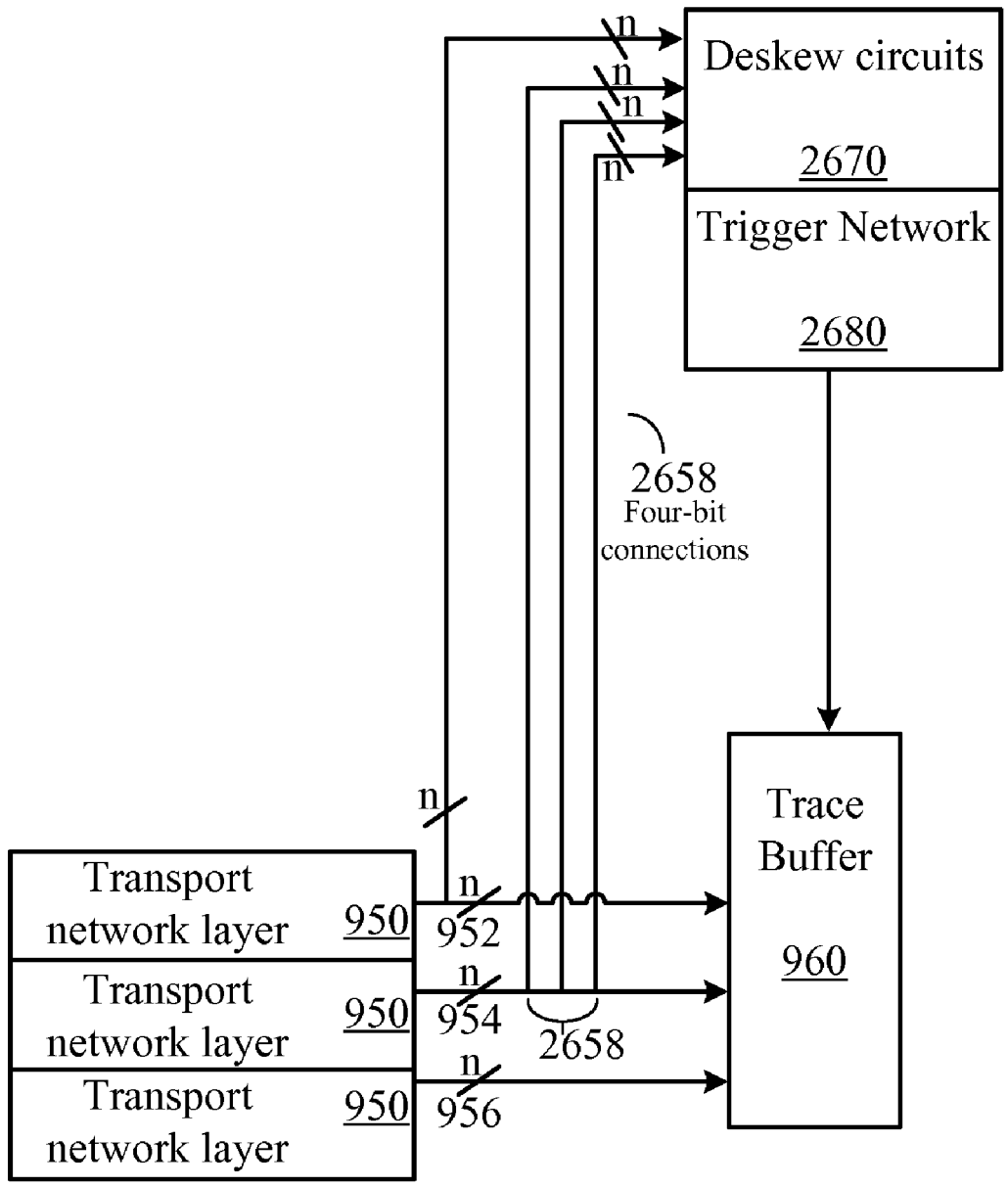
FIG. 26 illustrates an overview of debug circuitry of the alternate embodiments of FIG. 25.

For instance, FIGS. 25 and 26 illustrate embodiments where the deskew circuits have multiplexers with 16 inputs, some of which receive data from a second transport network layer. FIG. 25 illustrates the inputs of various deskew circuits. The inputs include multiplexers 2510, 2520 and 2530. The multiplexers 2510, 2520 and 2530 each receive twelve inputs 2512, 2522 and 2532 from the top transport network layer (not shown). The multiplexer 2510 receives a set of four inputs 2514 from a second transport network layer (not shown). The multiplexer 2520 receives a second set of four inputs 2524 from the second transport network layer. The multiplexer 2530 receives a third set of four inputs 2534 from the second transport network layer. The multiplexers in FIG. 25 show examples of the connections to individual multiplexers of some embodiments. In actual deskew circuits of some embodiments, there may be 60 or 72 1-bit deskew circuits and their attendant multiplexers. Some fraction of the multiplexers (for example ⅓ each) of some embodiments may have input sources like those of multiplexers 2510, 2520, and 2530. In some embodiments, the fractions are approximate, so for example embodiments with either ⅓ or approximately ⅓ of the multiplexers having input sources in common may be referred to as having "about ⅓" of the multiplexers having input sources in common. The term "about" in this context means "equal to or nearly equal to".

FIG. 26 illustrates the connections from the transport network layers in context of the trace buffer 960, deskew circuits 2670 and trigger network 2680, and the connections 952, 954, and 956. The figure shows three sets of 4-bit connections 2658, each of these three sets of 4-bits connections 2658 connects to the inputs 2514, 2524, and 2534 as seen in FIG. 25 (not shown in FIG. 26). The sets of 4-bit connections lead from 12-bit connection 954 to deskew circuits 2670. As has been mentioned previously, multiple individual connections are illustrated as one connection for purposes of clarity. The separation of the connections into separate lines is conceptual, rather than physical. In some embodiments, the sets of 4-bit connections 2658 may be physically separated, and in other embodiments they may be grouped together.

As described above in relation to FIG. 25, in some embodiments, about ⅓ of the deskew circuits each receive connections from about a third of the connections from one transport network layer. For example, FIGS. 25 and 26, illustrate embodiments in which each transport network layer has twelve outputs, all twelve outputs from one transport layer are connected to the inputs of each multi-bit deskew circuit, one third of the outputs from a second transport layer are connected to the inputs of one third of the multi-bit deskew circuits, another third of the outputs from the second transport layer are connected to the inputs of another third of the multi-bit deskew circuits, and so on. Alternate embodiments of triggers which may receive data from multiple transport network layers may use other fractions of the outputs of a transport layer connected to other fractions of the multi-bit deskew circuits. For example, some embodiments may have half the outputs connected to half the deskew circuits, and the other half of the outputs connected to the other half of the deskew circuits. Other embodiments may use some but not all of the connections from a second transport network layer, connecting them to some or all of the deskew circuits. Still other embodiments may use connections from more than two transport network layers. Still other embodiments may have fractions of outputs that don't match the fractions of deskew circuits to which they connect, for example, half the outputs connect to each of a quarter of the deskew circuits. In still other embodiments, different multi-bit deskew circuits may have different numbers of inputs.

IX. Software Reconstruction of Signals in the Trace Buffer

Data (e.g., UDS data) from the configurable circuits can take also take varying amounts of time to reach a trace buffer. In some embodiments, this means that data produced with some particular chronological relationship in the configurable circuits will reach the trace buffer in a jumbled chronological relationship. For example, a bit generated earlier than a second bit may arrive at the trace buffer before the second bit. Or in another example, two bits generated simultaneously may arrive at the trace buffer, but do not reach the trace buffer simultaneously. In some embodiments, simultaneously means to within one user cycle. In other embodiments, simultaneously means to within one subcycle. In some embodiments, software is used to restore the original chronological relationship to data from the trace buffer.

This is similar to the situation described earlier in which data arrives at the deskew circuits out of order. However, the trigger hardware works best when it is receiving data as close to real time as possible. If conditions indicating an error, or other reason for stopping, are to be found within the data, it must be found soon enough to stop the trace buffer before the relevant data in the trace buffer has been over-written by irrelevant data. Unlike data going to the trigger, the data in the trace buffer itself is not so time sensitive. Once the trigger has stopped the writing of data to the trace buffer, there is ample time to offload the trace buffer data from the IC for analysis at a more convenient time.

The extra time to offload the trace buffer data from the IC without deskewing it first eliminates the need for deskew circuitry on the IC itself to process data entering the trace buffer. Instead of such hardware on the IC, a software program can be used to determine which signals should be considered to be simultaneous. In some embodiments, the same deskewing could be implemented in hardware, inside or outside of the configurable IC. Therefore, it will be clear to one of ordinary skill in the art that processes referenced here as "software" or "implemented by software" could be implemented by hardware or firmware in some embodiments. The software temporally aligns the data. In some embodiments, temporally aligning may mean generating an ordered set of data. In other embodiments, it may mean outputting the data in the actual order it was received. In still other embodiments, it may mean providing multiple or all data bits with a relative or absolute time code to indicate when they were generated relative to other bits.

Figure 27:
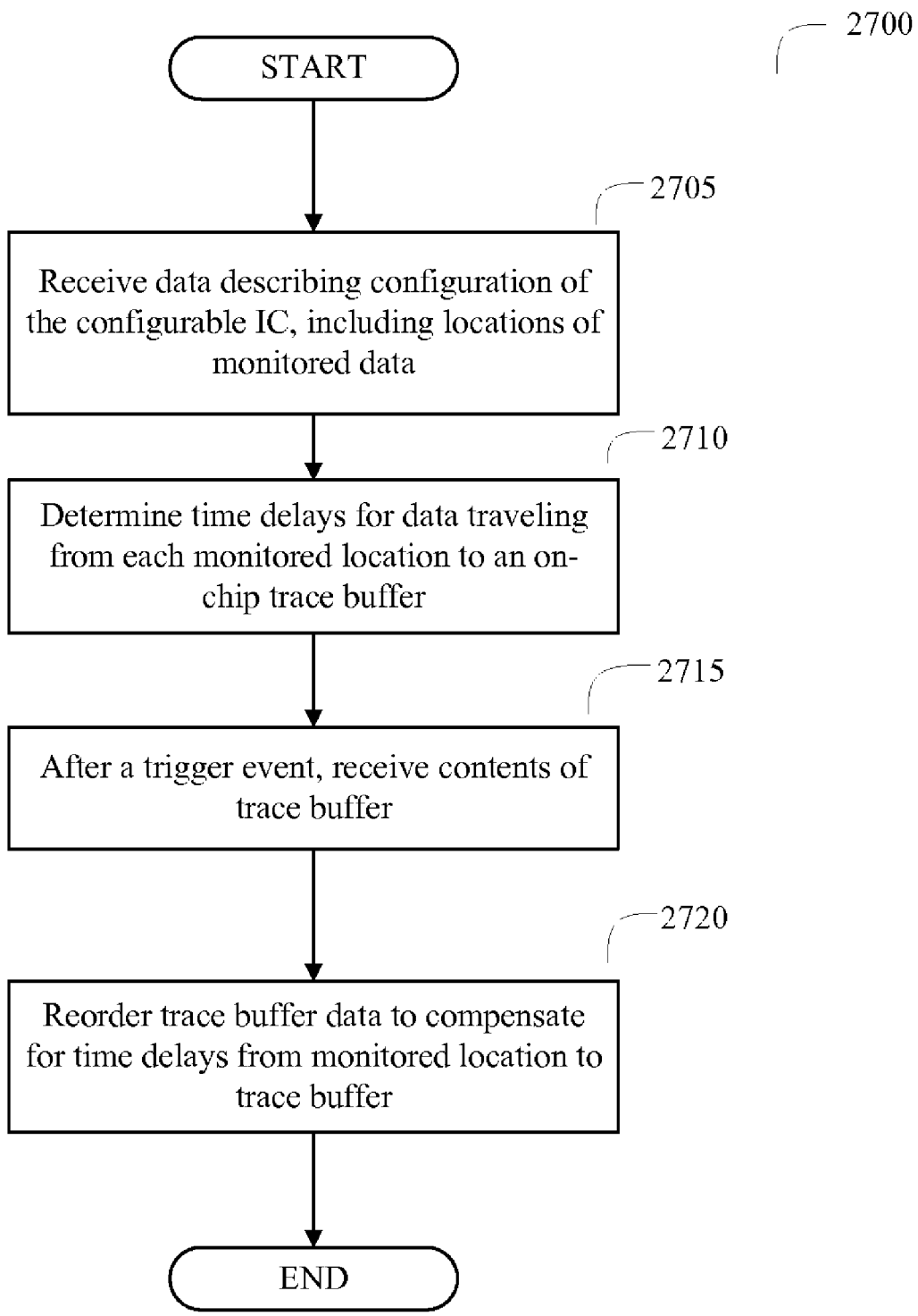
FIG. 27 illustrates a flowchart of software deskewing of trace buffer data.

FIG. 27 illustrates a flow-chart 2700 for such a process of some embodiments. In some embodiments, the process is implemented by software. The software receives data describing the configuration of the configurable IC (at 2705). This data includes information about which physical locations and subcycles of the configurable IC are being monitored. In this context, "monitored" means that the values in those locations and at those subcycles are being streamed to the trace buffer. The data provided to the software also includes descriptions of the circuit paths that each bit of the streaming data (e.g., UDS data) takes to reach the trace buffer. In this context a description may be very broad or very narrow. In some embodiments, the description may be as simple as a list of delays from relevant circuit elements to a trace buffer. In some embodiments, the description may include specific connections on which the data from given circuit elements will reach the trace buffer.

In some embodiments, the configuration/debug network may not have enough capacity in a particular column of tiles to send all the monitored signals generated in that column to the transport network. In such embodiments, the paths may include some of the routing fabric of the configurable IC (as further described below by reference to FIGS. 35a and 35b), as well as the configuration/debug network. The paths may also include storage elements in a transport network such as those described in relation to FIG. 11 above, or any combination of the above described elements.

The software (at 2710 in FIG. 27) of these embodiments determines the delays for data (e.g., UDS data) traveling from each monitored location/subcycle to the trace buffer. When a trigger event occurs (at 2715) the trace buffer stops receiving data and sends it out to the debug software. The software receives the raw data from the trace buffer (also at 2715). The raw data, having been recorded by the trace buffer without compensation for signal time, is out of order relative to the actual times that each piece of data was generated within the configurable tiles of the configurable IC. The software (at 2720) re-orders the data to reflect the actual times that the bits of data were generated, using the known delays from different monitored points as a map to the re-ordering. In some embodiments, the data comes in as a big set of values in the order they were received at the trace buffer. The process reorders them by taking the original position of each data bit in the trace buffer, and subtracting from that position the number of clock cycles it took that bit of data to get from the configurable circuits of the IC to the trace buffer. This is similar to the deskewing of data done by the deskewing circuits described in relation to FIG. 14-26. However, deskewing data from the trace buffer data can be done at any time after the data has been recorded, and does not have to be done right away.

Figure 34:
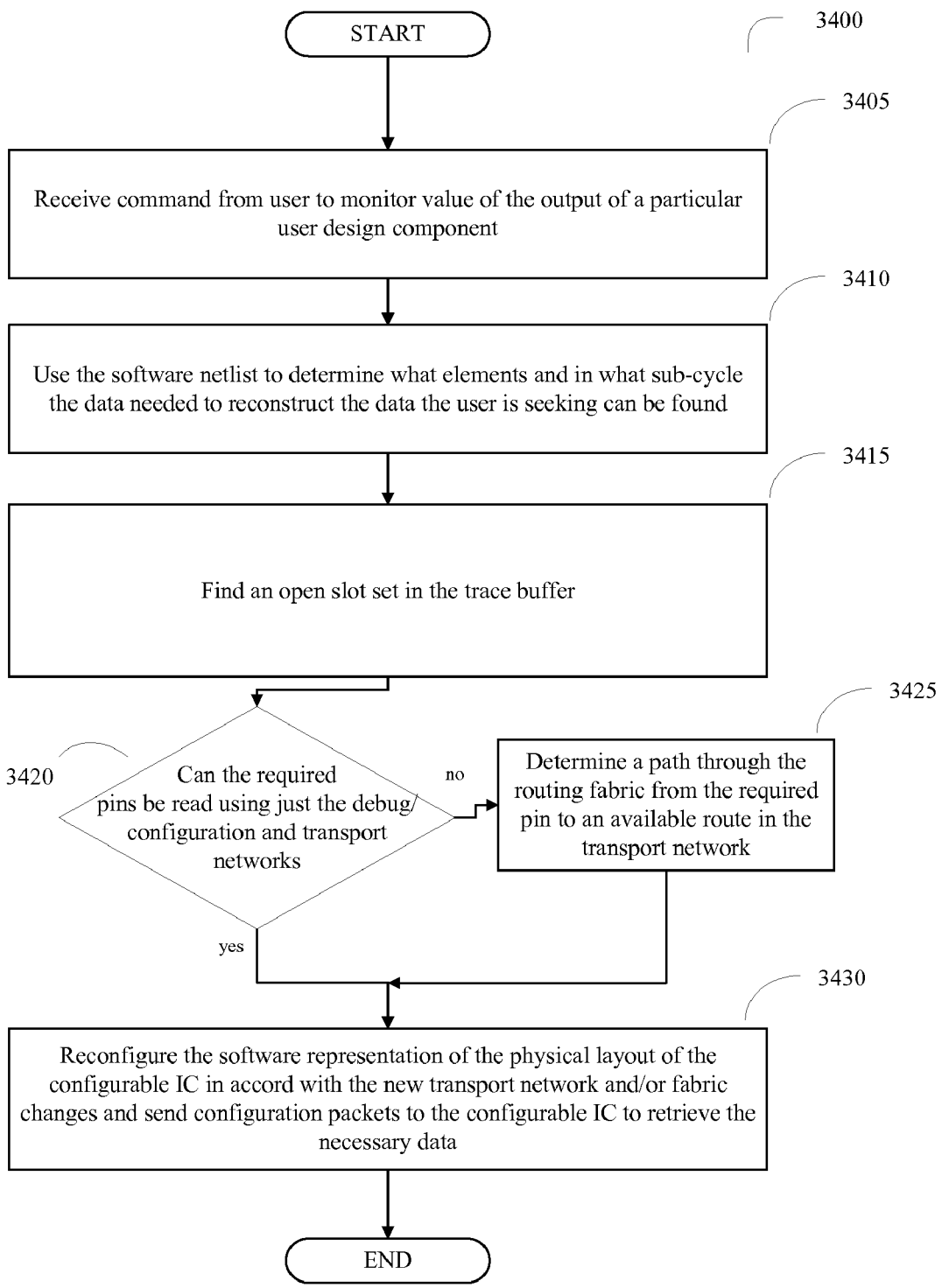
FIG. 34 illustrates a flowchart of software reconfiguring the IC to find debug values dynamically.

Note that in some embodiments, the deskew software does not receive data on the configuration and paths (as in 2705) then calculate the delays (at 2710), but rather receives data on the monitored values and is provided with pre-calculated delays from other software such as the dynamic data tracker, as further described below in reference to FIG. 34. As further described below in section X, some embodiments of the dynamic data tracker produce data on delays as part of their function.

Other embodiments of the process illustrated in FIG. 27 may have other features, or implement the described actions in different orders. For example, in some embodiments, the determination of the delays for data (e.g., UDS data) reaching the trace buffer may be done after the trigger has stopped new data from being recorded in the trace buffer.

The net effect of the deskew software is to provide a set of "snapshots" of the values of elements in the configurable circuit at each subcycle. In some embodiments, this snapshot is not of the values of every element, but only of the elements that are of interest.

This method of using trace buffers and software deskewing overcomes a limitation of some prior art configurable ICs which froze the IC on a trigger event and then read each element of the frozen IC. Those prior art ICs could only provide a "snapshot" of one particular moment, not "snapshots" of several subcycle's worth of data (e.g., UDS data).

The external deskewing process should not be confused with the process that reconstructs user design anchor points (described below). The external deskewing process takes raw data from the trace buffer and turns it into a set of "snapshots" of the values of the physical elements of the IC at multiple subcycles. The anchor point reconstruction software described below takes as its input snapshots of the value of the physical elements of the IC at multiple subcycles. In other words, the external deskewing process of some embodiments provides the data values (e.g., UDS data values) from the IC, but does not provide data about user design elements that were eliminated in the restructuring process. The external deskewing process is one way of generating IC data for the anchor point reconstruction, but the anchor point reconstruction process does not require that the particular embodiments described above provide that data. Additionally, feeding the anchor point reconstruction software is not the only reason to have deskewing software. In some embodiments, the "snapshots" of the monitored elements may themselves be important debugging data.

X. Software Generation of Physical IC Configuration

Ideally, the software controlling the configurable IC during debugging processes should be transparent to the user. The user should only have to concern himself with the user design and should be able to interact with the system without knowing about subcycles, or restructuring of the logic of the user design to work more efficiently with the physical configurable IC. This transparency should not force the use of larger, more expensive configurable ICs necessary to do a point by point mapping of the user design onto the configurable IC.

One method of improving IC performance is "optimization", this is the process of re-arranging and replacing circuits within the integrated circuit design so as to accomplish the same end results while improving performance. Improving performance could mean using a smaller area, or fewer circuit elements. Prior art configurable integrated circuit designs could not track user design signals (the values of outputs of circuits in the user design) in the face of optimization of the circuit for efficient implementation on a configurable IC. It should be noted that in this specification, optimization is a separate and distinct process from changing the logic gates to better match the implementing circuits of the configurable IC.

In order to achieve these goals, some embodiments of the present invention use various software innovations to maintain this transparency, even in the face of optimization. Such embodiments track the user design circuits through optimization, restructuring, and/or retiming of the initial user design circuit. In some embodiments, particular outputs in the user design circuit can be reconstructed even after several types of operations such as: 1) optimization of the circuit design, 2) the initial translation of the optimized user design to a physical layout of the configurable chip; 3) allowing the user to request debug data dynamically; 4) reconfiguring the routing fabric to retrieve necessary data (e.g., UDS data); 5) using software to deskew the raw received data; 6) regenerating the user's requested data from the deskewed data, if necessary.

A. Initial Translation of User Design to Physical Layout

Figure 28:
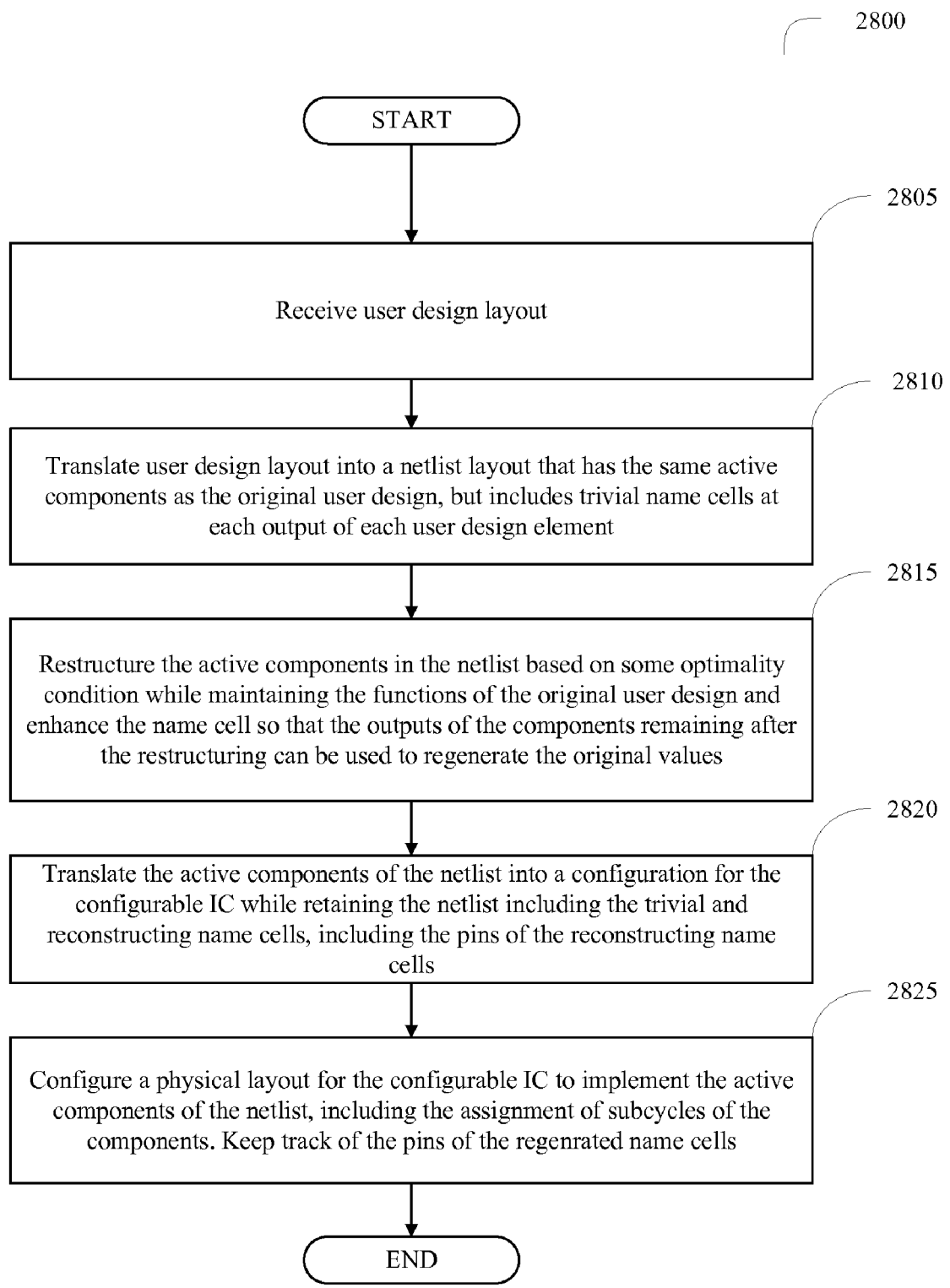
FIG. 28 illustrates a flowchart of software translating a user design into a configuration of a configurable IC.

In some embodiments, the process that configures the configurable IC to implement the user's design goes through several stages. A flowchart of these stages, as implemented by software, is illustrated in FIG. 28. Illustration of this type of translation for examples of very simple user design circuits can be found in FIGS. 29, 31, and 32. The configuration software receives a user design layout (at 2805). The user design layout, also referred to as a user design circuit, is a software description of logic elements and the relationships (e.g., connections) between them. Together, these elements and relationships describe the circuit that the user wants to implement with the configurable IC. In some embodiments, a user design circuit can be provided from the output of some external circuit design program. In other embodiments, the user can construct the circuit using software that is part of the embodiment itself, or by an automatic design program. In still others the user can construct the circuits using an evolutionary algorithm for circuit design, or by a reverse translation from an existing configuration of the configurable IC (with or without subsequent modifications). In still others the user could use any other way of providing the information to the software of the embodiment, or by some combination of the above.

At 2810, the software translates the user design layout into a software representation (also known as a "netlist") of the same circuit, but with trivial name cells at each output of each user design element. Name cells are described in detail below, in relation to FIGS. 29, 31 and 32, but for now suffice it to say that they are passive elements that will not be translated to elements on the actual physical configuration. At 2815, the software restructures the software representation to replace at least some of the user design elements with elements that implement the functions of the original design, but are more efficiently implemented on the configurable IC. For example, in some embodiments, the configurable tiles include three-input look-up tables. When properly configured, a three-input lookup table can often replace two two-input logic gates. For example, in a circuit design in which the output of one AND gate feeds into the input of another AND gate, a three input look-up table ("LUT") can replace the two AND gates (see FIG. 29 below). It should be noted that configurable ICs three input LUTs are merely some of the possible embodiments of the present invention. Other embodiments might have four, or even more, input LUTs, or even some other circuit designed to replace multiple gates. Still other embodiments may replace gates with some number of inputs greater than the gates or LUTs of the configurable IC with multiple gates or LUTs on the configurable IC. At 2820, the software representation is translated into a software representation very close to the eventual physical configuration of the configurable IC. In some embodiments, the software representation at this point includes both the physical locations and subcycle assignments of all the active components. At this point, the only difference between the software representation and the eventual actual configuration of the configurable IC is that the software representation still includes the name cells. At 2825, the software determines what configuration packets need to be sent to the configurable IC to implement the actual configuration and sends the packets. The software retains a copy of the software representation of 2820 for reasons that will be explained later.

Other embodiments are also possible, for instance, the software could combine one or more steps, or skip some steps. Some embodiments may generate name cells as needed to keep track of changes rather than generating trivial name cells for each user design element and then translating to more complex name cells. Some embodiments may combine the actions described in 2815 and 2820, or even 2810 to 2820 into one more complicated set of actions. In the embodiments described above, each action is applied to the entire circuit design before the next action is applied to the entire circuit. Other embodiments may perform an equivalent process piecemeal, with each type of action from 2805 to 2825 applied to some small part of the circuit before applying each type of action from 2805 to 2825 to some other small part of the circuit. Other embodiments may implement some sets of actions piecemeal and other sets of actions across the entire circuit.

B. Keeping Track of User Design Signals

1. Tracking Through Space

The debugging operations of some embodiments may require data (e.g., UDS data) from specific points within the user design circuit. In some cases, the optimization, restructuring, and/or translation of a user design circuit to a physical configuration might eliminate some of these specific points from the physical design (e.g., eliminate an output of a logic circuit when it eliminates the logic circuit from the design during some optimization operation). Therefore, some embodiments provide software tracking of such points, referred to below as "anchor points", also referred to as "examination points". The software keeps track of the input and output locations in the user design circuit that are needed for debugging operations. As these anchor points cannot be tracked directly, as demonstrated in FIG. 29 below, the software instead (1) determines the inputs that affect the values at the specified anchor points, (2) commands the debugging hardware to track the values of those inputs, and (3) translates the values of those inputs into the value that each of the anchor points would have had, if the restructuring of the user design circuit that not eliminated them from the physical circuit.

2. Anchor Points and Lost Anchor Points

Figure 29:
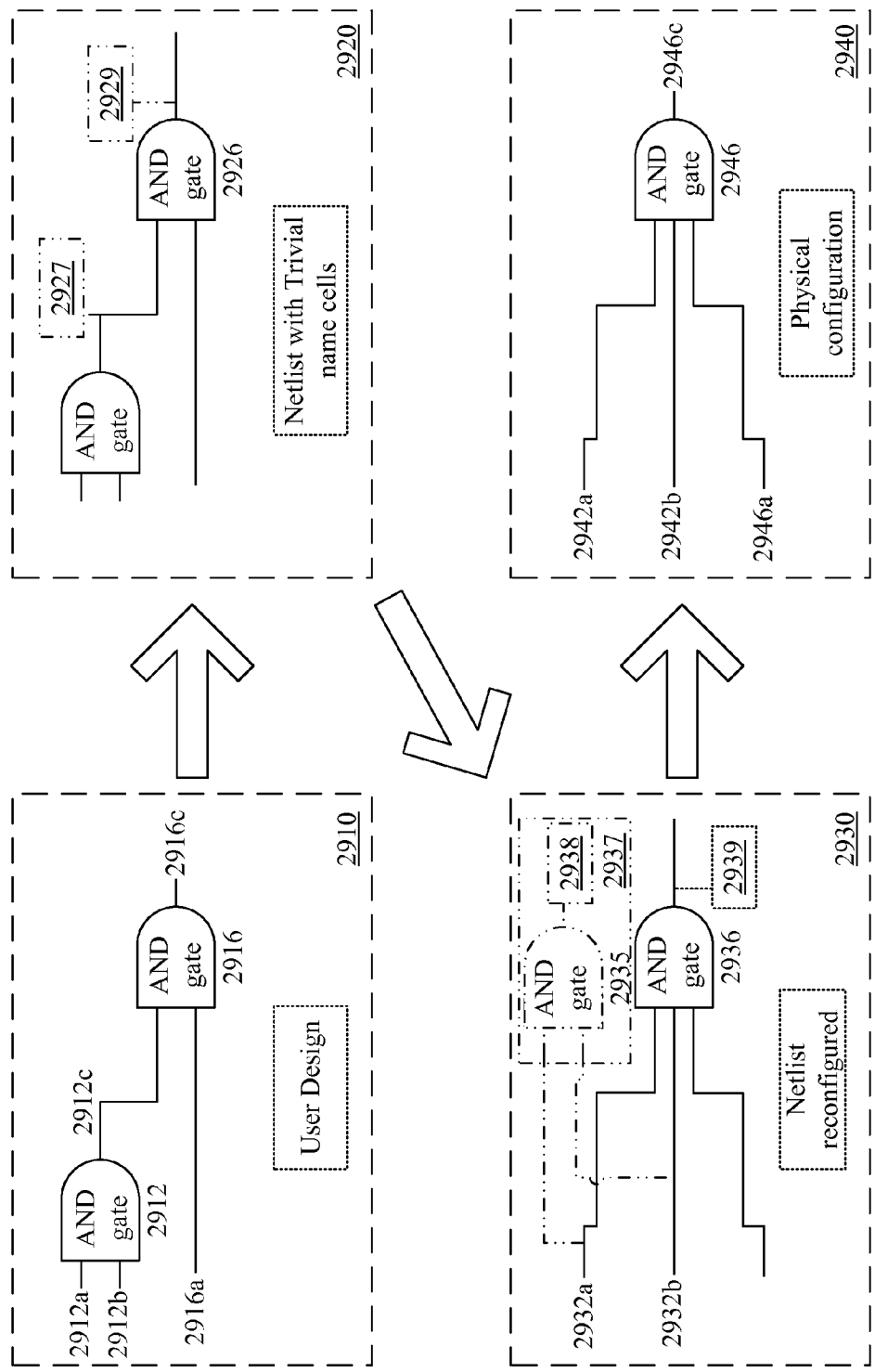
FIG. 29 illustrates conversion of a user design into a configuration of a configurable IC.

For example, FIG. 29 illustrates a user design circuit 2910, with two two-input AND gates 2912 and 2916, inputs 2912a, 2912b, and 2916a, and outputs 2912c and 2916c. For this example, the software will generate data necessary to reconstruct the value of the output 2912c of AND gate 2912. Therefore, output 2912c is an anchor point. In this specification, an "anchor point" refers to an output or input of a circuit element in the user design circuit whose value is to be tracked. Any output of any element in the user design is potentially an anchor point. Which outputs or inputs are anchor points at any given time varies as the debugging software changes focus. An anchor point that does not have a corresponding point in the physical configuration of the configurable is referred to here as a "lost anchor point". As lost anchor points have no direct equivalents in the physical circuit, the value of a lost anchor point cannot be directly read from the physical circuit.

If the physical circuit were identical to the user design circuit, then there would be no lost anchor points, and the value of the output 2912c could be read directly. However, translation of the user design circuit 2910 to a physical circuit could produce (for example) physical circuit 2940, which includes a single three-input AND gate 2946 with inputs 2942a, 2942b and 2946a, and output 2946c. The physical circuit 2940 has the same logic table as the user design circuit 2910, and so would have the same functions in normal operations. However, no point corresponding to output 2912c exists within physical circuit design 2940. In this example, output 2912*c* is a lost anchor point, and thus its value cannot be read directly.

3. Name Cells, Trivial and Reconstructing

To prepare the system to be able to recover the values of lost anchor points, the translation software of some embodiments generates "name cells" to keep track of the relationships between potential anchor points of the user design circuit and the readable points of the physical cells. A "name cell" as used in this specification is a software representation that is used to keep track of the value of a particular anchor point. Name cells are inactive, serving as virtual maps of circuit elements rather than being circuit elements themselves. There are multiple types of name cells, described below and in the next section.

A "trivial name cell" is a name cell that simply keeps track of a particular location where the value of the anchor point can be directly read. In embodiments with subcycles, the name cells may keep track of subcycles as well as location. A "reconstructing name cell" is a name cell that tracks lost anchor points that have been lost when translating from a user design to a physical configuration of a configurable IC. A reconstructing name cell keeps track of at least one location and (in some embodiments) subcycles in a circuit. It also keeps track of the input(s) of the physical circuit that correspond to the input(s) of the logic circuit(s) leading to the anchor point in the user design circuit. A reconstructing name cell also keeps track of the logic necessary to reconstruct the value of the anchor point given the values of the inputs.

4. Translation from User Design Circuit to Physical Configuration

In some embodiments, the anchor points are not determined in advance. In order to ensure that all possible anchor points can be reconstructed, these embodiments generate name cells for all outputs in the user design circuit (along with any inputs from outside the user design circuit). In FIG. 29 the process of translating from user design circuit to physical circuit starts with the user design circuit 2910. This circuit is translated to software representation 2920 of the user design circuit 2910. This translation maintains the logic of the user design circuit, but adds trivial name cells 2927 and 2929.

The software representation 2920 is translated to a software representation 2930 that represents a circuit with functions equivalent to the user design circuit 2910, but that can be implemented using a 3-input AND gate 2936 on the configurable IC. In the process, the trivial name cells 2927 and 2929 are translated to reconstructing name cell 2937 and trivial name cell 2939. Reconstructing name cell 2937 keeps track of the locations/subcycles of inputs 2932*a* and 2932*b*, and keeps track of the logic necessary to reconstruct anchor point 2912*c*. Here, the logic is AND gate 2935. The output 2938 represents the value that the reconstructing name cell reconstructs. In some embodiments, the software representation 2930 includes arrangements of circuit elements, placements within subcycles, and positions of elements within the tile array of the configurable IC. In terms of the flowchart in FIG. 28 above, translating from software representation 2920 to software representation 2930 combines the actions in 2815 and 2820, though subcycle assignments are not illustrated here for the sake of clarity. The software maintains a copy of the software representation 2930 and generates a physical circuit design 2940 that is then implemented on the configurable IC.

In this example, the anchor point is the output 2912*c*. The inputs that affect the value at the anchor point 2912*c* are the inputs 2912*a* and 2912*b*. The software tracks the locations of the equivalent inputs 2932*a* and 2932*b* in software representation 2930. If it is later necessary to supply the value of the anchor point, user design output 2912*c*, the software would order the hardware to read these values from the corresponding inputs 2942*a* and 2942*b*. The software would use the logic table of reconstructing name cell 2937 to reconstruct the value that output 2912*c* would have had.

Figure 30:
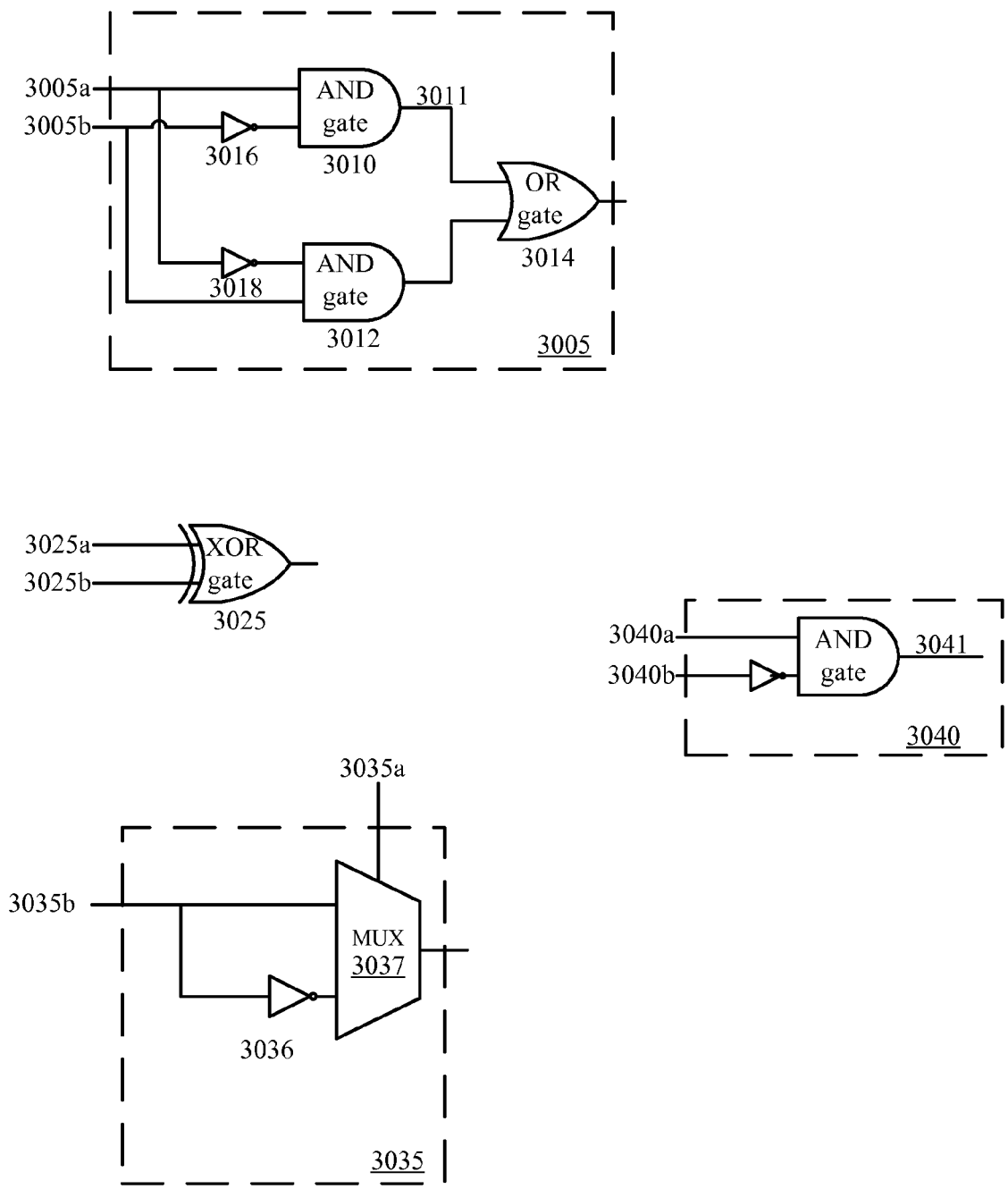
FIG. 30 illustrates an example of a more complex optimization operation.

FIG. 29 illustrates an example of a fairly simple restructuring operation, some of which may be done in order to better match the implementing circuits of the configurable IC. Some embodiments track user design circuits through optimization operations that are done for reasons other than matching the implementing circuits of the configurable IC. FIG. 30 illustrates some examples of more complex replacement of circuit elements in an optimization process. FIG. 30 shows a circuit 3005 made from five logic gates: AND gates 3010 and 3012, OR gate 3014, NOT gates 3016 and 3018. Circuit 3005 has inputs 3005*a* and 3005*b*.

Two possible replacement circuits 3025 and 3035 are also illustrated. Possible replacement circuit 3025 is an XOR gate, possible replacement circuit 3035 has a NOT gate 3036 and a two-input multiplexer 3037. Note that possible replacement circuit 3035 includes a circuit element which is not a logic gate. Circuit 3005 and possible replacement circuits 3025 and 3035 each provide the same outputs in response to a given set of input values. In the case of circuit 3005, the input values come in on inputs 3005*a* and 3005*b*. In the case of possible replacement circuit 3025, the input values come in on inputs 3025*a* and 3025*b*. In the case of possible replacement circuit 3035, the input values come in on inputs 3035*a* and 3035*b*. The inputs 3025*a-b* and 3035*a-b* are corresponding inputs to inputs 3005*a-b*. AND gate 3010 has an output 3011, for which there is no corresponding output in either potential replacement circuits 3025 or 3035. Some embodiments use a reconstructing name cell such as 3040, with its output 3041, to track the user design values of output 3011.

In some embodiments, the inputs that directly affect the value of an anchor point may themselves be translated out of the physical circuit. In such cases, the software goes back to the nearest inputs that have not been translated out of the physical circuit, and commands the debugging hardware to track those inputs. In such embodiments, the software reconstructs the network of relationships that lead to the anchor point. Such networks may involve dozens, or even hundreds of inputs that affect the value of an anchor point. Some embodiments treat each node in the network as its own subsidiary name cell. Such embodiments calculate from one subsidiary anchor point to the next, starting from physical inputs and working through to the anchor points needed for debugging. Other embodiments may construct a single large logic table in a large reconstructing name cell to translate the physical inputs directly into the anchor point needed for debugging.

5. Tracking Through Time

In some embodiments, the user design circuit may contain elements that are designed to delay a signal for some number of user cycles before passing it on to the next element in the circuit. Translation of a user design circuit into a physical circuit configuration of the configurable IC may move some of these elements from one side of an anchor point to another in such a way that the anchor point is lost. Unlike the earlier example, the physical location (and subcycle, if any) of these lost anchor points can still be read directly. However, directly reading the values at these locations/subcycles results in getting a value from an earlier or later clock cycle (e.g., user design clock cycle) than the user design circuit anchor point would.

Figure 31:
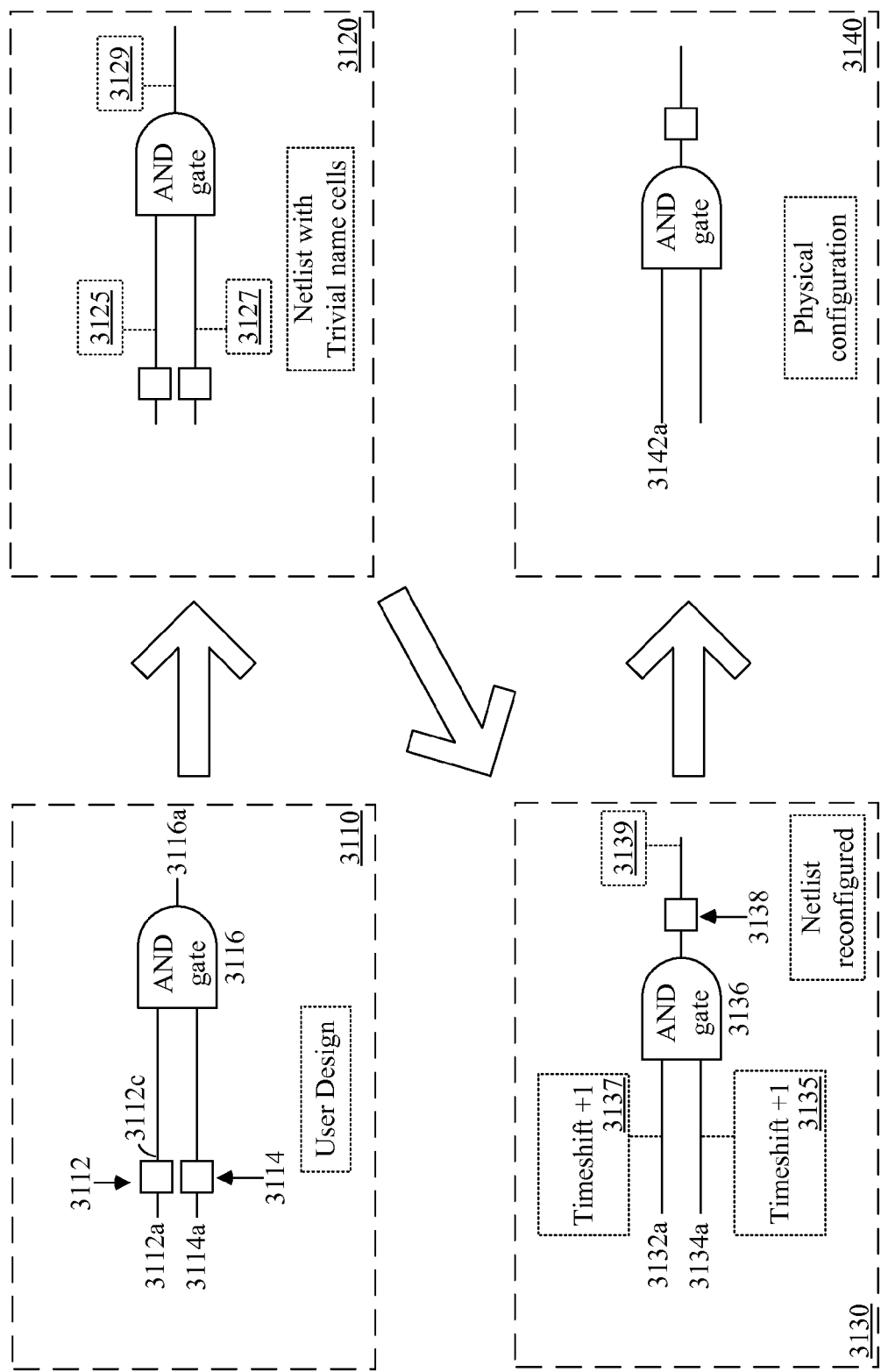
FIG. 31 illustrates conversion of a second user design into a configuration of a configurable IC.
Figure 32:
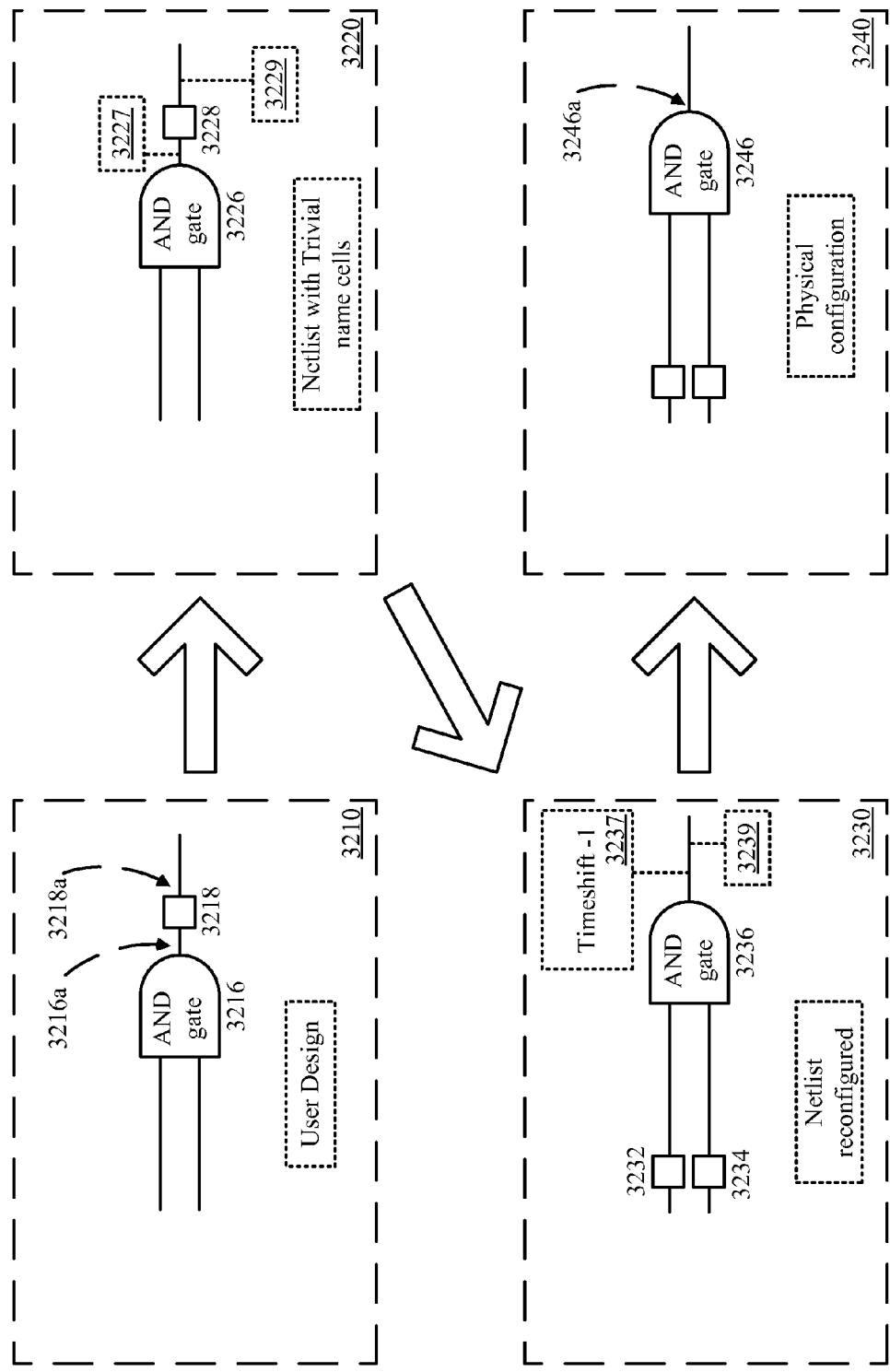
FIG. 32 illustrates conversion of a third user design into a configuration of a configurable IC.

In order to compensate for these changes in time, the software introduces "timeshift name cells" into the software representations. Timeshift name cells track a single input location, like trivial name cells, but they also keep track of the number of user cycles that the physical circuit location is behind or ahead of the corresponding location in the user design circuit. FIGS. 31-32 illustrate two examples of tracking anchor points through time shifts of some embodiments. In FIG. 31, user design 3110 includes buffers 3112 and 3114 that delay any signals coming in on inputs 3112a and 3114a (respectively) by one user cycle. Thus, in the user design, output 3112c "sees" a value one user cycle later than the input 3112a. In this example, output 3112c will be an anchor point. The user design circuit also includes AND gate 3116 with output 3116a. The overall effect of this user design circuit is to delay the values coming in on inputs 3112a and 3114a, then AND the values together after the delay, and send the resulting value to output 3116a.

The software translates the user design circuit into a software representation 3120 that includes trivial name cells 3125, 3127, and 3129. The software then translates the software representation 3120 into software representation 3130. This translation does not have buffers corresponding to 3112 and 3114. This representation has a buffer 3138 after an AND gate 3136. The overall effect of the circuit represented by software representation 3130 is to take two inputs 3132a and 3134a, then AND them together, then delay the resulting value before sending it to the output connected to trivial name cell 3139. The circuit represented in software representation 3130 (given the same inputs) produces the same values at its final output, and with the same time delay, as user design circuit 3110. In terms of the flowchart in FIG. 28 above, translating from software representation 3120 to software representation 3130 combines the actions in 2815 and 2820, though subcycle assignments are not illustrated here for the sake of clarity.

Internally, the absence of these buffers from the software representation means that the name cells reading the inputs 3132a and 3134a read them without delays corresponding to the delay produced in the user design circuit 3110 by buffers 3112 and 3114. To allow the software to compensate for the lack of a delay, the trivial name cells 3125 and 3127 are translated to timeshift name cells 3135 and 3137, respectively. The time shift of those cells would be plus one each. Trivial name cell 3129 is after the delay, but so is name cell 3139, so name cell 3139 is a trivial name cell.

To reconstruct the value that would be found at the anchor point, output 3112c, in a given user cycle, the reconstructing software would find the value at physical input 3142a of the physical configuration 3140. However, rather than using the value at the same time as a trivial name cell would, the reconstructing software would use the value produced one user cycle later. One user cycle later corresponds to the time shift of plus one tracked in timeshift name cell 3137.

FIG. 32 illustrates a translation that produces two name cells at the same location, but with one name cell being a trivial name cell and the other being a timeshift name cell. In FIG. 32 user design circuit 3210 has a buffer 3218 after the output 3216a of AND gate 3216. Buffer 3218 has an output 3218a. The user design circuit is translated into software representation 3220. Software representation 3220 has a trivial name cell 3227 at the output of AND gate 3226, and another trivial name cell 3229 at the output of buffer 3228. The translation to software representation 3230 (again omitting subcycle assignments for clarity) shifts the delay to before AND gate 3236 by providing buffers 3232 and 3234 and providing no buffer corresponding to buffer 3218. Trivial name cell 3239 remains on the same side of the delay as trivial name cell 3229. However, trivial name cell 3227 was before the delay in software representation 3220 and the corresponding name cell 3237 in software representation 3230 is after the delay. Thus, the corresponding name cell 3237 in software representation 3230 must be a timeshift name cell. Both trivial name cell 3239 and timeshift name cell 3237 track the same location/subcycle of the physical configuration 3240, namely the output 3246a of the AND gate 3246. However, timeshift name cell 3237 indicates that to reconstruct the value of output 3216a the reconstruction software would have to use the value at output 3246a one user cycle before the requested time. Trivial name cell 3239 indicates that to reconstruct the value of output 3218a the reconstruction software would have to use the value at output 3246a in the same user cycle as requested.

The above embodiments are examples; other embodiments are possible within the scope of the invention. It should also be noted that other embodiments may use other terminology, or represent timeshift name cells as just another reconstructing name cell, with one input, that has a buffer as its internal logic. It should also be noted that the timeshift name cells of the described embodiments are separate from the deskew software functions described elsewhere in this specification. As noted in the description of the deskew software functions, the effect of the deskew software functions of some embodiments is to reconstruct a "snapshot" of the monitored elements of the physical configuration. The effect of the name cell generating software functions of the embodiments described above is to generate a guide for translating values from that snapshot into values the debug software or user is seeking. However, other embodiments may combine the functions of the deskew network and timeshift name cells into one part of the software.

The above descriptions of some embodiments assume that the output of any physical element on any tile can be read by the configuration/debug network, either directly or through the routing fabric. In some embodiments, points other than the outputs of user design elements can be read directly from the tiles by the configuration/debug network. In such embodiments, some inputs of name cells can be read from those other points, rather than having to look back to the outputs of the preceding user design elements. However, in some embodiments, the outputs of some elements on the tile cannot be read directly by the configuration/debug network or the routing network. For example, in some embodiments, the configuration/debug network can only read from RMUXs or latches connected to RMUXs, or in some embodiments, only from a subset of the RMUXs. In such embodiments, the output of a circuit element could only be read if it happened to connect to the input of a readable RMUX. In fact, such an RMUX would not only have to be readable, but also not occupied with passing data from its other inputs. In such embodiments, the name cells also reconstruct the user signals from the available outputs, as seen in FIG. 33.

Figure 33:
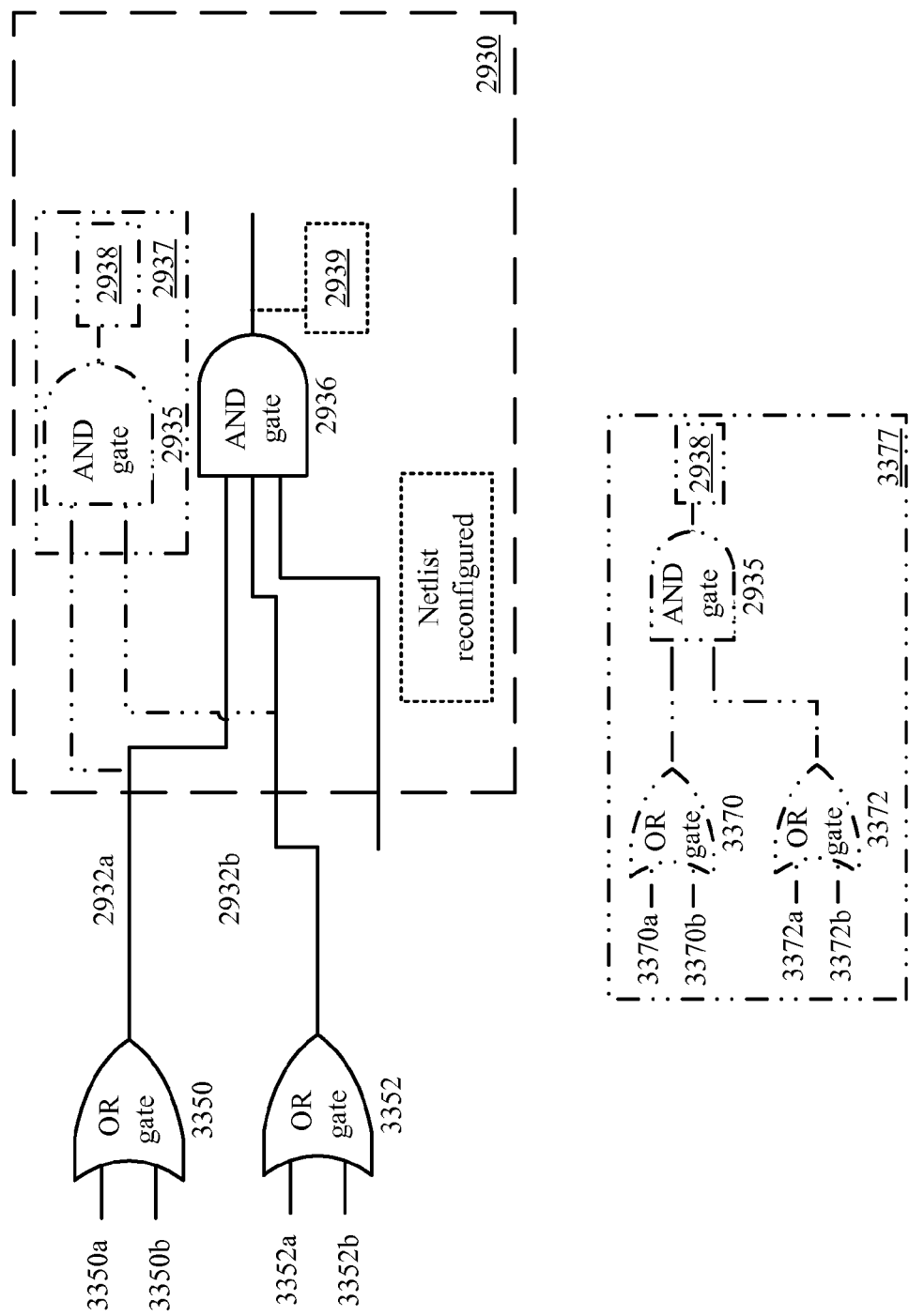
FIG. 33 illustrates a further adaptation of name cells in embodiments where not all outputs of elements on the tiles are directly accessible.

FIG. 33 illustrates a further adaptation of the name cells in embodiments where not all outputs of elements on the tiles are directly accessible. FIG. 33 includes software representation 2930, as seen in FIG. 29, including the components and name cells from that software representation. In this figure, the inputs 2932a and 2932b are connected to the outputs of OR gates 3350 and 3352 respectively. As reconstructing name cell 2937 indicates, the signal at output 2938 can be reconstructed from the inputs 2932a and 2932b. However, in the example illustrated here, there is no direct connection between the outputs of the OR gates and the configuration/debug network (not shown), and also no direct connection between the inputs 2932a and 2932b and the configuration/debug network. Thus, in order to reconstruct the signal at output 2938, the software must generate and then use a map going back to the inputs of the OR gates. In some embodiments, the software must go still further back along the chain of inputs, but here it is assumed that each of the inputs 3350a, 3350b, 3352a, and 3352b can be read by the configuration/debug network.

In order to be able to determine the value at output 2938, the software enhances the reconstructing name cell to include the entire network of dependencies back to the nearest readable inputs, in this case inputs 3350a, 3350b, 3352a, and 3352b. The software includes representations of these OR gates 3350 and 3352, and their inputs in the reconstructing name cell 3377 as OR gates 3370 and 3372 and their inputs 3370a, 3370b, 3372a, and 3372b. As in previously described name cells, these components are not implemented on the IC, but are maintained as a software representation that can be used to reconstruct signals read from the configurable IC.

XI. Tracking Data Dynamically

The software of some embodiments allows a user to determine which user design elements should be monitored during the running of the configurable IC. FIG. 34 illustrates a flowchart of some embodiments for dynamic tracking of data. In this context, "dynamic" tracking allows the user to select, while the IC is already running, which user data values should be monitored. Some embodiments are set up so that dynamic tracking is able to configure the IC and/or the debug network to track the new data in less than an hour. Other embodiments are set up so that this configuration to track the new data takes under a minute. Still other embodiments are set up so that it takes less than ten seconds to configure to track new data. Still others are set up so that it takes, less than a second to reconfigure to track the new data. Still others are set up so that it takes less than one hundred milliseconds to reconfigure to track the new data.

When implementing a particular user design, a configurable IC performs user-design operations that allow the IC to implement the particular user design in a circuit or device. During such user-design operations, the configurable IC (1) can receive user-design input data, which are neither configuration signals nor clocking signals, and (2) can process these signals to implement the particular user design in a circuit or device. The processing of these signals may go on for an arbitrary amount of time after user-design input data has been received. The processed results of such user-design input data can be characterized as user-design data.

Accordingly, in some cases, a configurable IC performs user-design operations when it receives and processes user-design input data and provides user-design output data. For instance, when the configurable IC performs user-design operations, its configurable logic circuits in some cases can receive user-design input data, compute functions based on the user-design input data, and output their results to other circuits inside or outside of the IC. In other contexts, a configurable IC might implement a user design that simply directs the IC to generate output without receiving any user-design input. The IC is "running" while it is receiving user design input data, processing user-design input data, processing user-design data, providing user-design output data or any combination of the previous (this is sometimes called "run time"). In some embodiments, the configuration of the debug network, transport network, trace buffer, or routing fabric is done during run time.

The software receives (at 3405) a command from a user to monitor the value of the output of a particular user design component. The software (at 3410) accesses a software representation of the configuration of the IC that includes data about which physical elements of the configurable IC must be read to provide or reconstruct the output of the user design component. The software determines (at 3415) where there are open slot sets in the trace buffer, as described in section VIII. The software determines (at 3420) whether any open slot sets in the trace buffer can be reached by use of the configuration/debug and transport networks. The data bit from that element must be timed to reach the trace buffer at the same time as an open slot is ready to receive it, taking into account the delays in reaching the trace buffer from the element of interest. The determination requires consideration of congestion of the configuration/debug and transport networks and the number of subcycles it would take for data from the element of interest to reach the open slot set.

If the data can reach an open slot set using just the configuration/debug and transport networks, then the software doesn't have to find a path using the routing fabric. In such cases, it transitions to 3430, and at 3430, the software reconfigures the configuration/debug and/or transport networks as needed to get the data (e.g., UDS data) to an open slot set.

If the data cannot reach an open slot set using just the configuration/debug and transport networks, then the software (at 3425) finds a path through the routing fabric (as further described by reference to FIGS. 35a-35b) that does get the data to an open slot set. This may require routing to avoid congestion, or routing to add an additional delay, or both. In cases where the routing fabric is used, the software (at 3430) reconfigures the software representation of the physical layout of the configurable IC to match the changes in the routing fabric. The software may also (still at 3430) reconfigure the software representation of configuration/debug and transport networks. The software sends configuration packets to reconfigure the actual configurable IC accordingly. The effect of this reconfiguration is to prepare the routing fabric to send data from the element of interest to another tile. When data reaches that other tile, it is picked up by the configuration/debug network, passed on to the transport network and then sent to the trace buffer, arriving just as the assigned slot is ready to receive it.

In some embodiments, such a path will use routing elements not engaged in implementing whatever user design the IC is implementing (or at least routing circuits not used in a particular clock cycle or sub-cycle in case of a reconfigurable IC), while leaving those that are engaged in implementing the user design alone. One advantage of using the otherwise idle routing elements is that the implementation of the user design does not have to be reconfigured to get the data out.

In either case, the software representation keeps track of the path the data takes. In some embodiments, it keeps track of the slot set to which the data is assigned. This information can be used by the software deskewer described in section IX to deskew the data, providing a "set of snapshots" of the elements of interest at particular times. In some embodiments, the "snapshots" are used by the user design signal trackers described in section X to reconstruct the values of the user design elements that the user has requested.

Figure 35A:
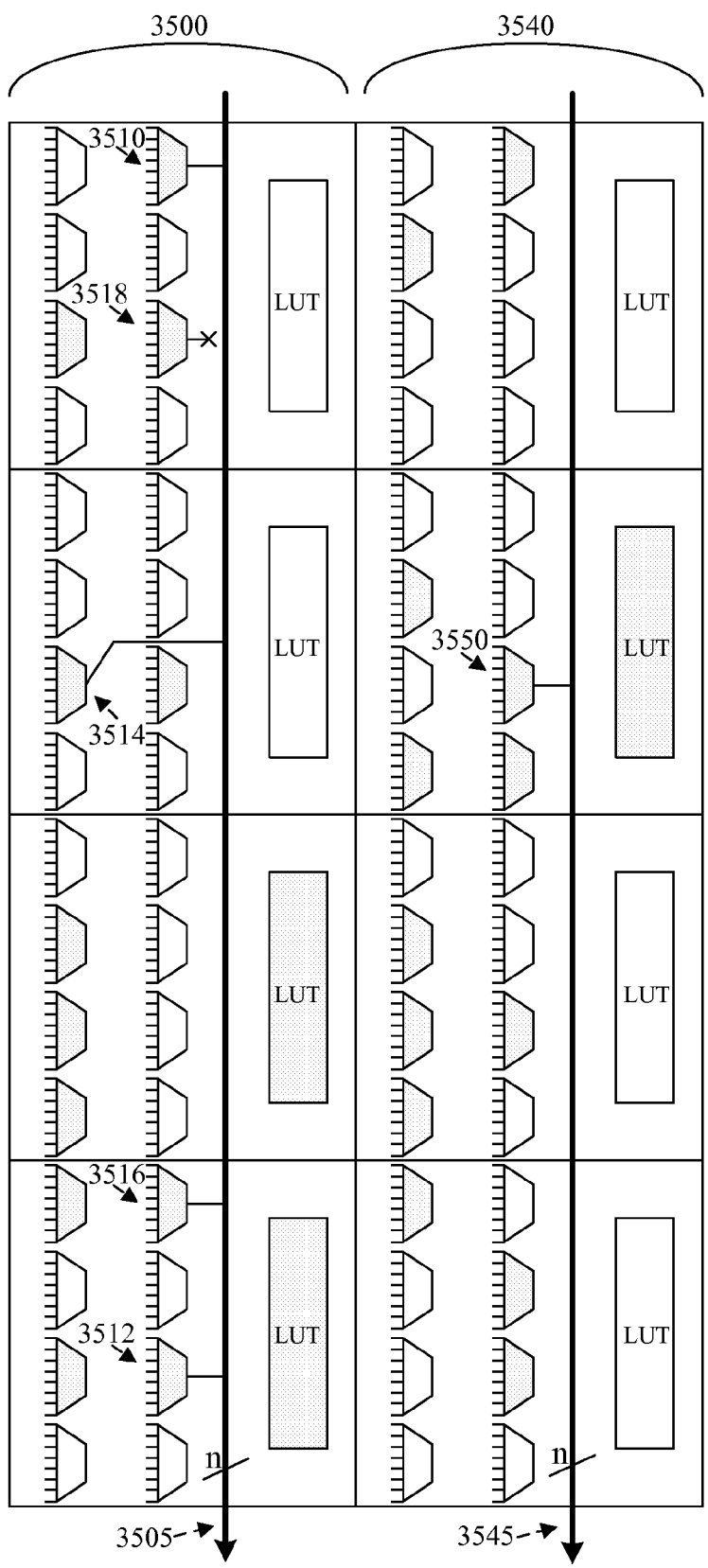
FIGS. 35a-35b illustrate a congested condition on a column of tiles.

FIG. 35a illustrates a congested condition on a column of tiles. For the sake of clarity, this figure illustrates an embodiment with a configuration/debug network that is 4-bits wide, though other embodiments may use other widths (e.g., 12-bits). Also for the sake of clarity, the RMUXs are represented in the figure as connecting directly to the configuration/debug network lines. It will be clear to one of ordinary skill in the art that in some embodiments there will be circuitry between the RMUXs and the configuration/debug network lines (e.g., mask and merge circuits, etc.)

In FIG. 35a, the circuit elements used to implement the user design are shown as being shaded, including the RMUXs that help to connect the various tiles used to implement the user design. Elements not being used to implement the user design are shown as being unshaded. RMUXs are used to select connections from other RMUXs and from logic circuits (only selected connections are shown here). FIG. 35a includes two columns of tiles, 3500 and 3540. Column 3500 includes tiles with RMUXs 3510, 3512, 3514, 3516, and 3518. Column 3540 includes a tile with RMUX 3550. For the sake of clarity, the outputs of each of those six RMUXs are said to be of interest within the same subcycle. However, it will be clear to one of ordinary skill in the art that as there are time delays inherent in bits coming from different tiles in the same column, it would be more accurate to say "in subcycles such that all four lines of the configuration/debug network would be occupied at the time when the fifth RMUX would need to send its signal".

The configuration/debug network lines 3505 and 3545 of this figure can only handle 4-bits (each) in a given subcycle. Therefore, in order to send five signals from the same column, the debugging software of some embodiments can command the RMUXs that are not engaged in implementing the user design to accept output from the RMUXs of interest and pass them along to a column with less congestion. FIG. 35a represents a set of conditions in which RMUXs 3510, 3512, 3514, and 3516 are sending their outputs to the configuration/debug network line 3505 and the RMUX 3550 is sending its output to the configuration/debug network line 3545. With all the available capacity of the configuration/debug network line 3505 taken up already, the RMUX 3518 can't connect to it (as represented by the line from RMUX 3518 that dead ends in an X). While the configuration/debug network line 3505 is at full capacity, the configuration/debug network line 3545 only has one RMUX outputting to it and thus has excess capacity.

Figure 35B:
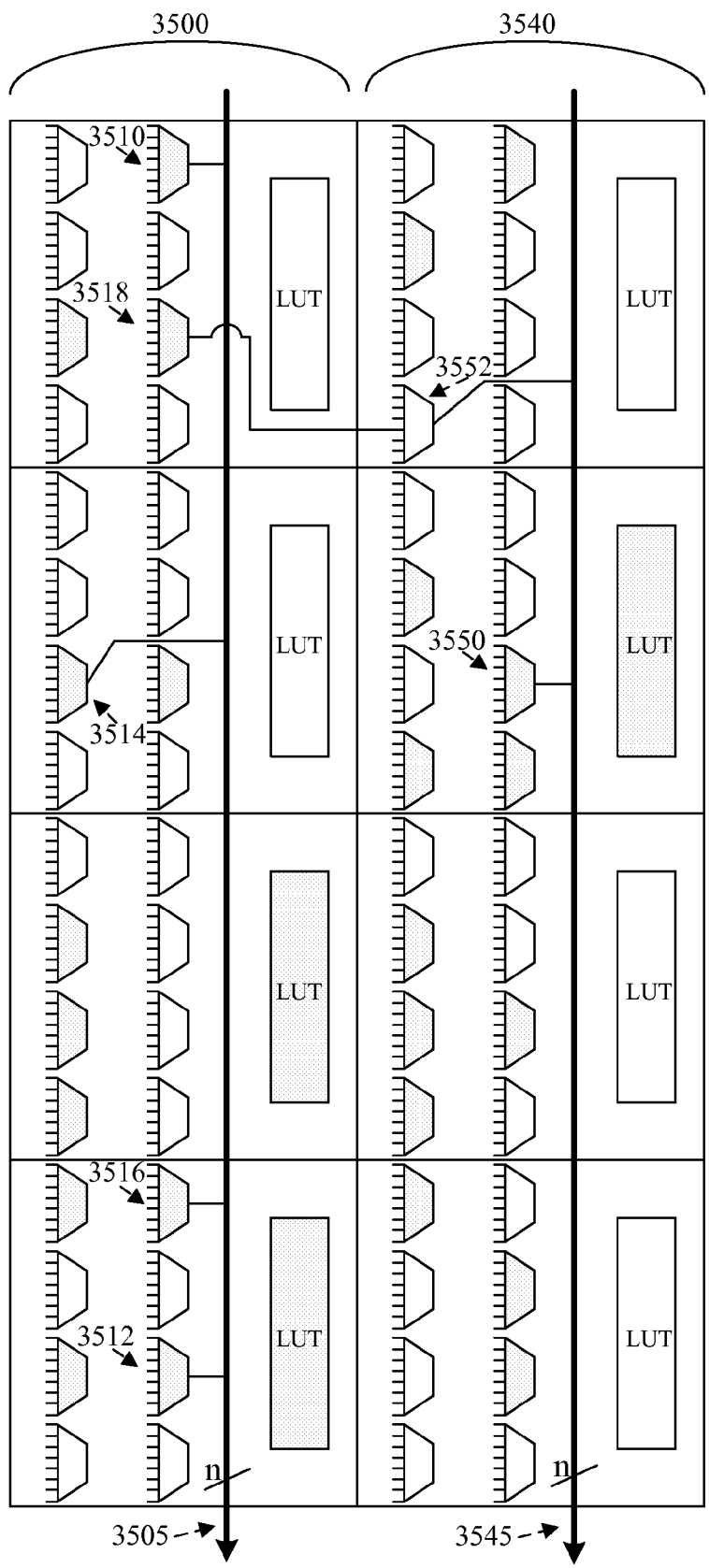

FIG. 35b illustrates the same pair of columns as FIG. 35a, but with the RMUX 3552 configured to accept the output of RMUX 3518, and pass it on to the configuration/debug network line 3545. Accordingly, in this case RMUX 3552 (part of the ICs routing fabric) is used to transport signals to parts of the configuration/debug network with the capacity to handle them.

In some embodiments, data from any of the RMUXs of interest could be sent to another column in order to receive the congestion. However, in some embodiments, not every RMUX is set up with a connection to another column. It should also be noted that routing to another column can introduce its own delays and that not all embodiments will always route to the nearest other column, for example if that column is itself congested. It will be clear to one of ordinary skill in the art that in some embodiments, the configuring of otherwise idle routing elements to avoid congestion may be implemented in the initial configuration, either in addition to, or instead of reconfiguring the routing elements dynamically.

Many of the above-described processes (such as the processes illustrated in FIGS. 27, 28, and 34) are implemented as software processes that are specified as a set of instructions recorded on a machine readable medium (also referred to as computer readable medium). When these instructions are executed by one or more computational element(s) (such as processors or other computational elements like FPGAs), they cause the computational element(s) to perform the actions indicated in the instructions. Computer is meant in its broadest sense, and can include any electronic device with a processor. Examples of computer readable media include, but are not limited to, CD-ROMs, flash drives, RAM chips, hard drives, EPROMs, etc.

In this specification, the term "software" is meant in its broadest sense. It can include firmware residing in read-only memory. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. Any of the software functions described above, which involve user input or providing data to a user, can be implemented using a graphical user interface (GUI). For example, commanding that a particular element in the user design circuit be monitored can be implemented using a graphical user interface.

As used in this document, a configurable IC is an IC that includes configurable circuits such as configurable logic circuits and/or configurable interconnect circuits. Typically, such configurable circuits are organized in a particular arrangement (e.g., an array). A configurable IC can also include circuits other than a configurable circuit arrangement and I/O circuitry.

Figure 36:
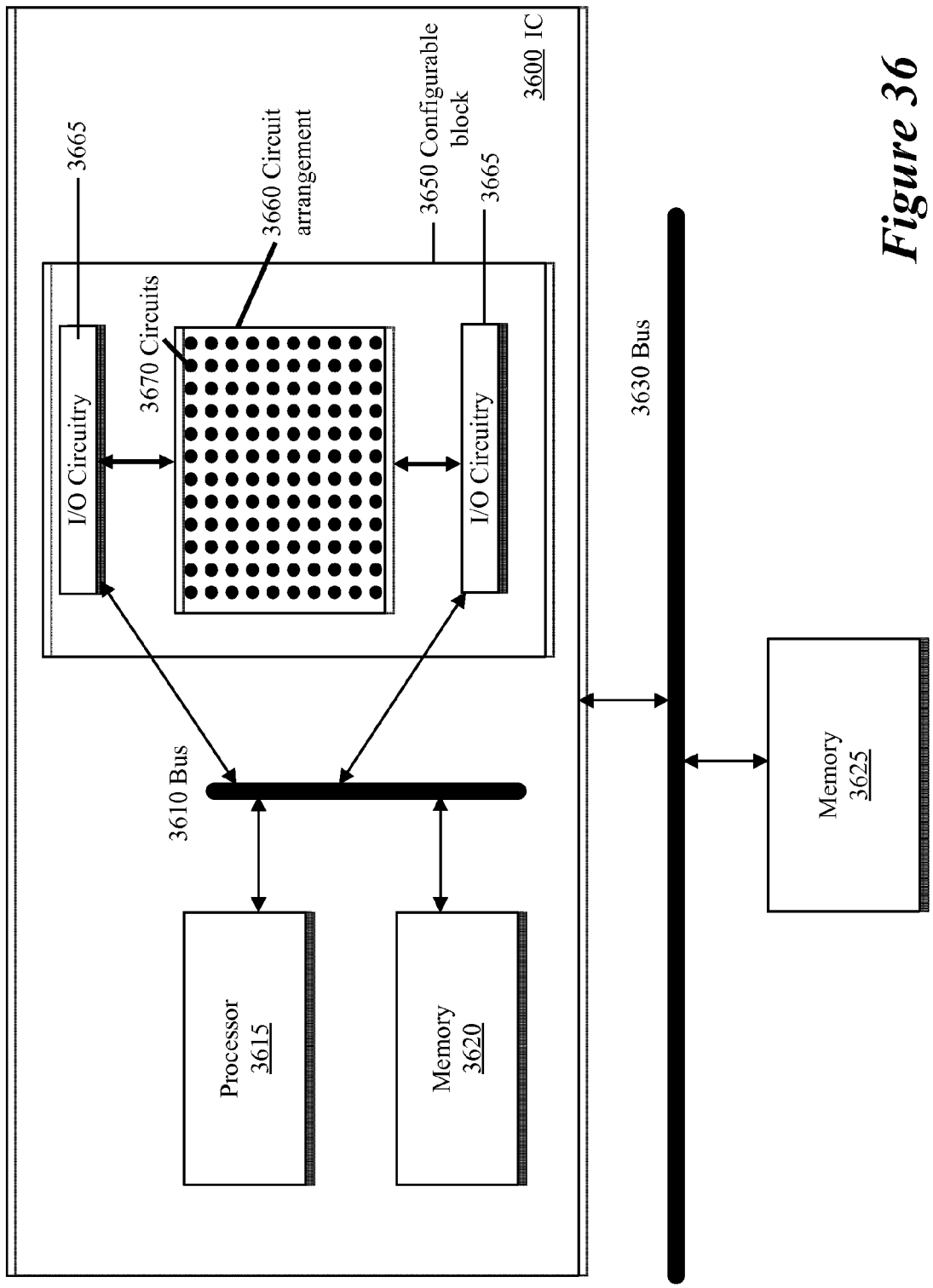
FIG. 36 illustrates a system on chip ("SoC") implementation of a configurable IC of some embodiments.

FIG. 36 illustrates one such system. Specifically, it illustrates a system on chip ("SoC") implementation of a configurable IC 3600. This IC has a configurable block 3650, which includes a configurable circuit arrangement 3660, with configurable circuits/tiles 3670, and I/O circuitry 3665 for this arrangement. It also includes a processor 3615 outside of the configurable circuit arrangement, a memory 3620, and a bus 3610, which conceptually represents all conductive paths between the processor 3615, memory 3620, and the configurable block 3650. As shown in FIG. 36, the IC 3600 couples to a bus 3630, which communicatively couples the IC to other circuits, such as an off-chip memory 3625. Bus 3630 conceptually represents all conductive paths between the components of the IC 3600. The IC 3600, the bus 3630 and the memory 3625 are parts of an electronic device that might include other circuitry (such as display, input/output interface, processors, etc.).

This processor 3615 can read and write instructions and/or data from an on-chip memory 3620 or an offchip memory 3625. The processor 3615 can also communicate with the configurable block 3650 through memory 3620 and/or 3625 through buses 3610 and/or 3630. Similarly, the configurable block can retrieve data from and supply data to memories 3620 and 3625 through buses 3610 and 3630.

Instead of, or in conjunction with, the system on chip ("SoC") implementation for a configurable IC, some embodiments might employ a system in package ("SiP") implementation for a configurable IC. One such approach is described further in U.S. Pat. No. 7,224,181.

Figure 37:
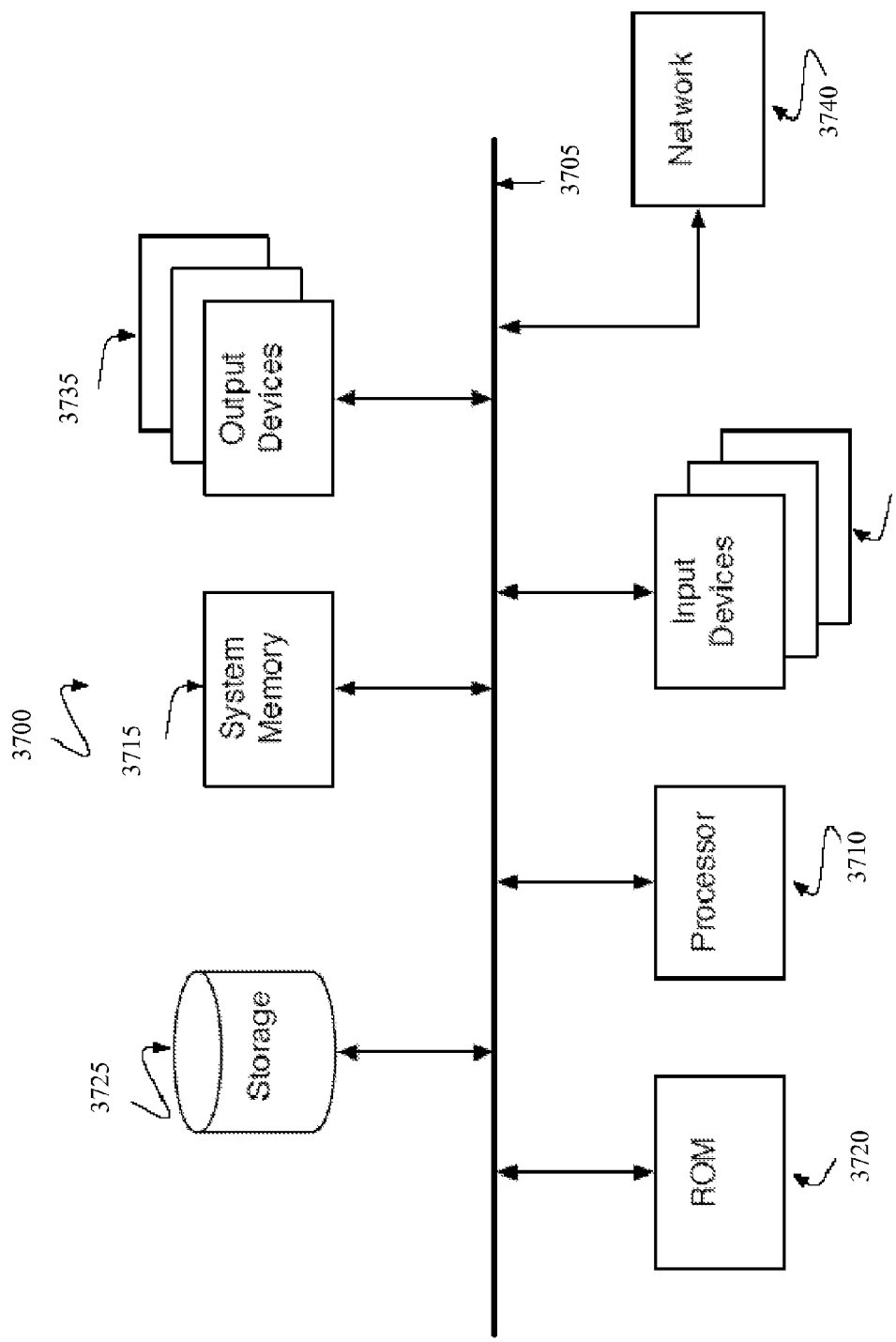
FIG. 37 illustrates a computer system used to implement some embodiments of the invention.

FIG. 37 conceptually illustrates a computer system that can be used to implement the processes (such as the processes illustrated in FIGS. 27, 28, and 34) of some embodiments of the invention. System 3700 of this figure includes a bus 3705, a processor 3710, several computer readable media (including a system memory 3715, a read-only memory 3720, and a permanent storage device 3725), input devices 3730, and output devices 3735.

The bus 3705 collectively represents all system, peripheral, and chipset buses that support communication among internal devices of the system 3700. For instance, the bus 3705 communicatively connects the processor 3710 with the read-only memory 3720, the system memory 3715, and the permanent storage device 3725.

One or more of the various memory units (3715, 3725, etc.) store the above-descried data structures with the content pieces, verification parameters, and content keys. From these various memory units, the processor 3710 (or another computational element 3710) retrieves instructions to execute and data to process in order to execute the processes of the invention. The read-only-memory (ROM) 3720 stores static data and instructions that are needed by the processor 3710 and other modules of the system.

The permanent storage device 3725, on the other hand, is a read-and-write memory device. This device is a non-volatile memory unit that stores instruction and data even when the system 3700 is off. Some embodiments of the invention use a mass-storage device (such as a magnetic or optical disk and its corresponding disk drive) as the permanent storage device 3725. Other embodiments use a removable storage device (such as a memory card or memory stick) as the permanent storage device.

Like the permanent storage device 3725, the system memory 3715 is a read-and-write memory device. However, unlike storage device 3725, the system memory is a volatile read-and-write memory, such as a random access memory. The system memory stores some of the instructions and data that the processor needs at runtime. In some embodiments, the invention's processes are stored in the system memory 3715, the permanent storage device 3725, and/or the read-only memory 3720.

The bus 3705 also connects to the input and output devices 3730 and 3735. The input devices enable the user to communicate information and select commands to the system. The input devices 3730 include alphanumeric keyboards and cursor-controllers. The output devices 3735 display images generated by the system. The output devices include printers and display devices, such as cathode ray tubes (CRT) or liquid crystal displays (LCD).

Finally, as shown in FIG. 37, certain configurations of the system 3700 also include a network adapter 3740 that connects to the bus 3705. Through the network adapter 3740, the system can be a part of a network of computers (such as a local area network ("LAN"), a wide area network ("WAN"), an Intranet or a network of networks, e.g., the Internet). Any or all of the components of system 3700 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. For instance, several embodiments were described above by reference to particular number of inputs, outputs, bits, and bit lines. One of ordinary skill will realize that these values are different in different embodiments. Thus, one of ordinary skill in the art would understand that the invention is not to be limited by the foregoing illustrative details, but rather is to be defined by the appended claims.

We claim:

1. An integrated circuit (IC) comprising a delay select input selection circuit, said delay select input selection circuit comprising:
   a) a first input selection circuit;
   b) a first storage element;
   c) a second storage element;
   d) a first input line branching into a plurality of input lines comprising at least a second, third, and fourth input line, wherein:
      i) said second input line is communicably connected to a first input of said first input selection circuit;
      ii) said third input line enters said first storage element;
      iii) said fourth input line enters said second storage element;
      iv) an output from said first storage element is communicably connected to a second input of said first input selection circuit; and
      v) an output from said second storage element is communicably connected to a third input of said first input selection circuit; and
   e) a fifth input line for communicably connecting a fourth input of said first input selection circuit to an output of a second input selection circuit of another delay select input selection circuit, wherein said fifth input line is not connected to a branch of said first input line.

2. The IC of claim 1, wherein an output of said first input selection circuit is communicably connected to an input of a third input selection circuit of a third delay select input selection circuit.

3. The IC of claim 1, wherein the IC is a configurable IC.

4. The IC of claim 1, wherein the IC is a reconfigurable IC.

5. The IC of claim 1, wherein the IC is a subcycle reconfigurable IC.

6. The IC of claim 1, wherein said first storage element comprises a latch.

7. The IC of claim 2, wherein said fifth input line is not communicably connected to said first input line.

8. An integrated circuit (IC) comprising a chain of delay select input selection circuits, each delay select input selection circuit of said chain of delay select input selection circuits comprising:
   a) a first input selection circuit;
   b) a first storage element; and
   c) a first input line for receiving data from outside the chain of delay select input selection circuits, wherein the first input line branches into a plurality of input lines comprising at least a second input line and a third input line, wherein:
      i) said second input line is communicably connected to a first input of said first input selection circuit;
      ii) said third input line enters said first storage element; and
      iii) an output from said first storage element is communicably connected to a second input of said first input selection circuit,
   wherein at least two delay select input selection circuits are communicably connected to form said chain of delay select input selection circuits.

9. The IC of claim 8, wherein an output from each of a plurality of first input selection circuits of a plurality of said delay select input selection circuits of said chain of delay select input selection circuits communicably connects to a third input of a next input selection circuit in a next delay select input selection circuit in said chain of delay select input selection circuits.

10. The IC of claim 9, wherein each of the plurality of the said delay select input selection circuits comprises a second storage element, wherein:
   a) a fourth input line enters said second storage element; and
   b) an output from said second storage element is communicably connected to a fourth input of said input selection circuit.

11. The IC of claim 9 further comprising a plurality of chains of delay select input selection circuits.

12. The IC of claim 9 further comprising a plurality of additional data lines branching from said outputs.

13. The IC of claim 12, wherein subsets of said plurality of additional data lines connect to input selection circuits.

14. The IC of claim 8, wherein the IC is a configurable IC.

15. The IC of claim 8, wherein the IC is a reconfigurable IC.

16. The IC of claim 8, wherein the IC is a subcycle reconfigurable IC.

17. A delay select input selection circuit comprising:
  a) an input selection circuit; and
  b) a first input line wherein the first input line branches into a plurality of input lines comprising at least a second input line and a third input line, wherein:
    i) said second input line is communicably connected to a first input of said input selection circuit;
    ii) said third input line enters a delaying circuit; and
    iii) an output from said delaying circuit is communicably connected to a second input of said input selection circuit,
  wherein the input selection circuit comprises at least one input that is communicably connected to an output of another delay select input selection circuit, wherein said output of another delay select input selection circuit is not connected to a branch of said first input line.

18. The delay select input selection circuit of claim 17, wherein the delaying circuit is a latch.

* * * * *